(12) United States Patent
Tamaoki et al.

(10) Patent No.: US 7,283,313 B2
(45) Date of Patent: Oct. 16, 2007

(54) BULK-SHAPED LENS, LIGHT-EMITTING UNIT, AND LIGHTING EQUIPMENT

(75) Inventors: Satoshi Tamaoki, Miyagi (JP); Hirao Ohta, Miyagi (JP); Akihisa Minato, Miyagi (JP)

(73) Assignee: Labosphere Institute (JP)

( * ) Notice: Subject to any disclaimer, the term of this patent is extended or adjusted under 35 U.S.C. 154(b) by 73 days.

(21) Appl. No.: 11/090,810

(22) Filed: Mar. 25, 2005

(65) Prior Publication Data

US 2005/0168987 A1   Aug. 4, 2005

Related U.S. Application Data

(63) Continuation of application No. 10/048,373, filed on Jan. 29, 2002, now Pat. No. 6,961,190.

(30) Foreign Application Priority Data

| Jul. 26, 1999 | (JP) | P11-210762 |
| Aug. 2, 1999 | (JP) | P11-218870 |
| Aug. 31, 1999 | (JP) | P11-244920 |
| Sep. 10, 1999 | (JP) | P11-257520 |
| Oct. 5, 1999 | (JP) | P11-284446 |
| Mar. 16, 2000 | (JP) | P2000-074206 |
| Apr. 13, 2000 | (JP) | P2000-111794 |
| Apr. 14, 2000 | (JP) | P2000-113454 |
| May 17, 2000 | (JP) | P2000-145343 |

(51) Int. Cl.
   *G02B 17/00* (2006.01)
(52) U.S. Cl. ............ 359/726; 359/661
(58) Field of Classification Search ........ 359/726, 359/661, 664, 642, 656, 657, 658
   See application file for complete search history.

(56) References Cited

U.S. PATENT DOCUMENTS

| 4,282,887 A | 8/1981 | Sterzer |
| 4,447,726 A | 5/1984 | Mudge et al. |
| 4,959,761 A * | 9/1990 | Critelli et al. ............ 362/646 |
| 5,349,509 A | 9/1994 | Klug |
| 5,382,810 A | 1/1995 | Isaksson |
| 5,485,317 A | 1/1996 | Perissinotto et al. |
| 5,757,557 A | 5/1998 | Medvedev et al. |
| 5,841,596 A * | 11/1998 | Perlo et al. ............ 359/859 |
| 6,033,087 A | 3/2000 | Shozo et al. |
| 2003/0132495 A1 | 7/2003 | Mills et al. |

FOREIGN PATENT DOCUMENTS

| EP | 0 635 744 A2 | 1/1995 |
| EP | 0 921 568 A2 | 6/1999 |
| JP | 54-10754 | 1/1979 |
| JP | 63-4009 | 1/1988 |
| JP | 05-019705 | 1/1993 |
| JP | 06-013657 | 1/1994 |
| JP | 06104491 A | 4/1994 |
| JP | 06-222722 | 8/1994 |
| JP | 07-27011 | 5/1995 |
| JP | 11-026816 | 1/1999 |
| JP | 11-030720 | 2/1999 |

* cited by examiner

*Primary Examiner*—Timothy Thompson
(74) *Attorney, Agent, or Firm*—Kilpatrick Stockton LLP

(57) ABSTRACT

The lens embraces a bulk-shaped lens body identified by a top surface, a bottom surface and a contour surface, and a well-shaped concavity is implemented in the inside of the lens body, aligned from the bottom surface toward the top surface. The lens body has geometry such as bullet-shape or egg-shape. A ceiling surface of concavity implemented in the lens body serves as a first lens surface, the top surface of the lens body serves as the second lens surface, and inside of the concavity serves as a storing cavity of a light source or a photodetector.

26 Claims, 54 Drawing Sheets

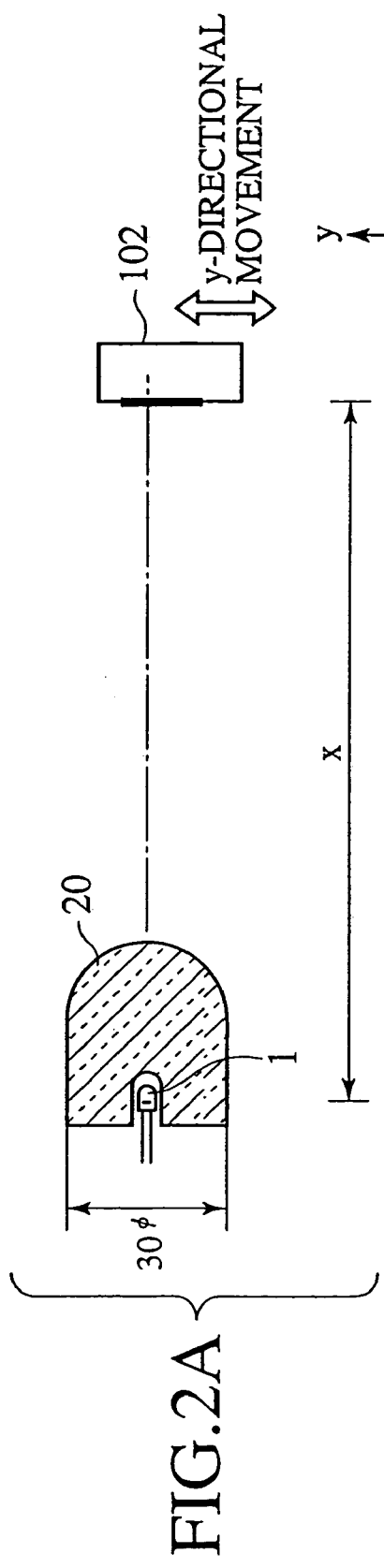
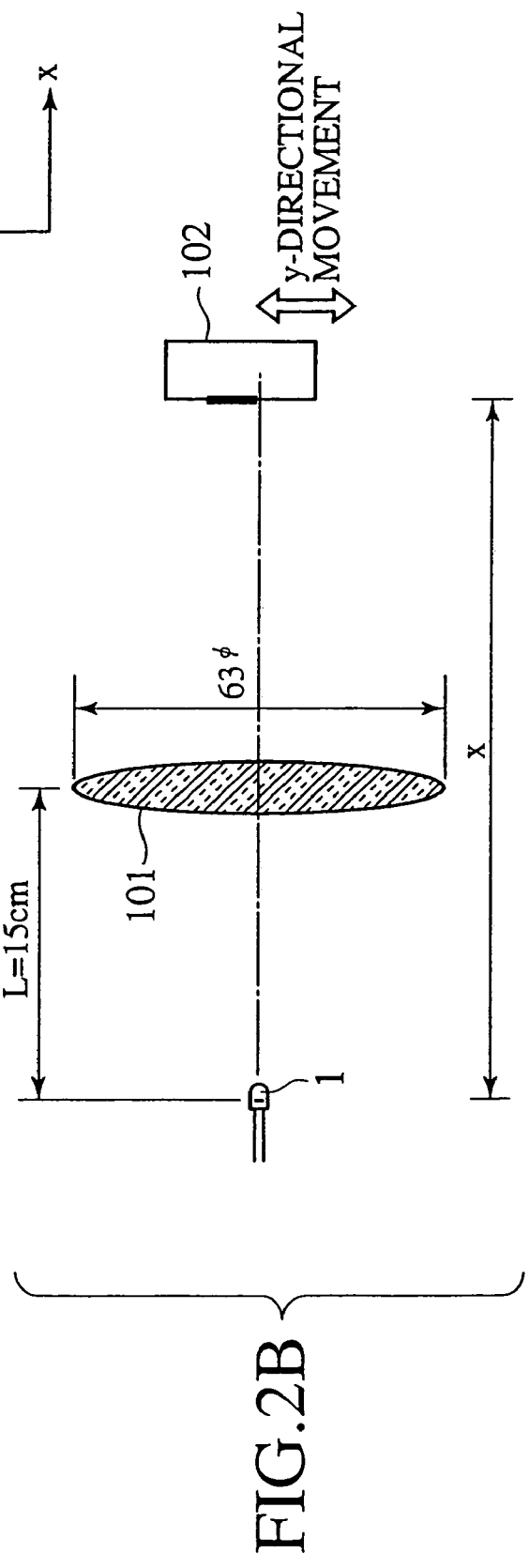

FIG.6

| SAMPLE NO. | RADIUS OF CURVATURE R | TOTAL LENGTH L (mm) | MEDIUM LENGTH D (mm) | INSIDE RADIUS OF CAVITY r (mm) | $-\Delta$ (mm) |
|---|---|---|---|---|---|
| 1 | 9.8 | 18.4~34.4 | 12.24~28.24 | 3 | 0 |
| 2 | 9.8 | 18.4~34.4 | 12.24~28.24 | 3 | 0.2 |
| 3 | 12~18 | 40 | 34 | 3 | 0 |
| 4 | 18~24 | 40 | 34 | 3 | 0 |
| 5 | 12~18 | 40 | 34 | 3 | 0.2 |
| 6 | 16~20 | 40 | 34 | 3 | 0.2 |
| 7 | 18~24 | 40 | 34 | 3 | 0.2 |
| 8 | 15 | 35~45 | 27~37 | 2.6 | 1 |
| 9 | 9.8 | 16.4~24.4 | 14.4~18.4 | 3 | 0 |
| 10 | 9.8 | 16.4~24.4 | 14.4~18.4 | 3 | 0 |

△=+0.75mm

△=+0.70mm

△=+0.60mm

△=-0.28mm

△=-0.48mm

△=-0.75mm

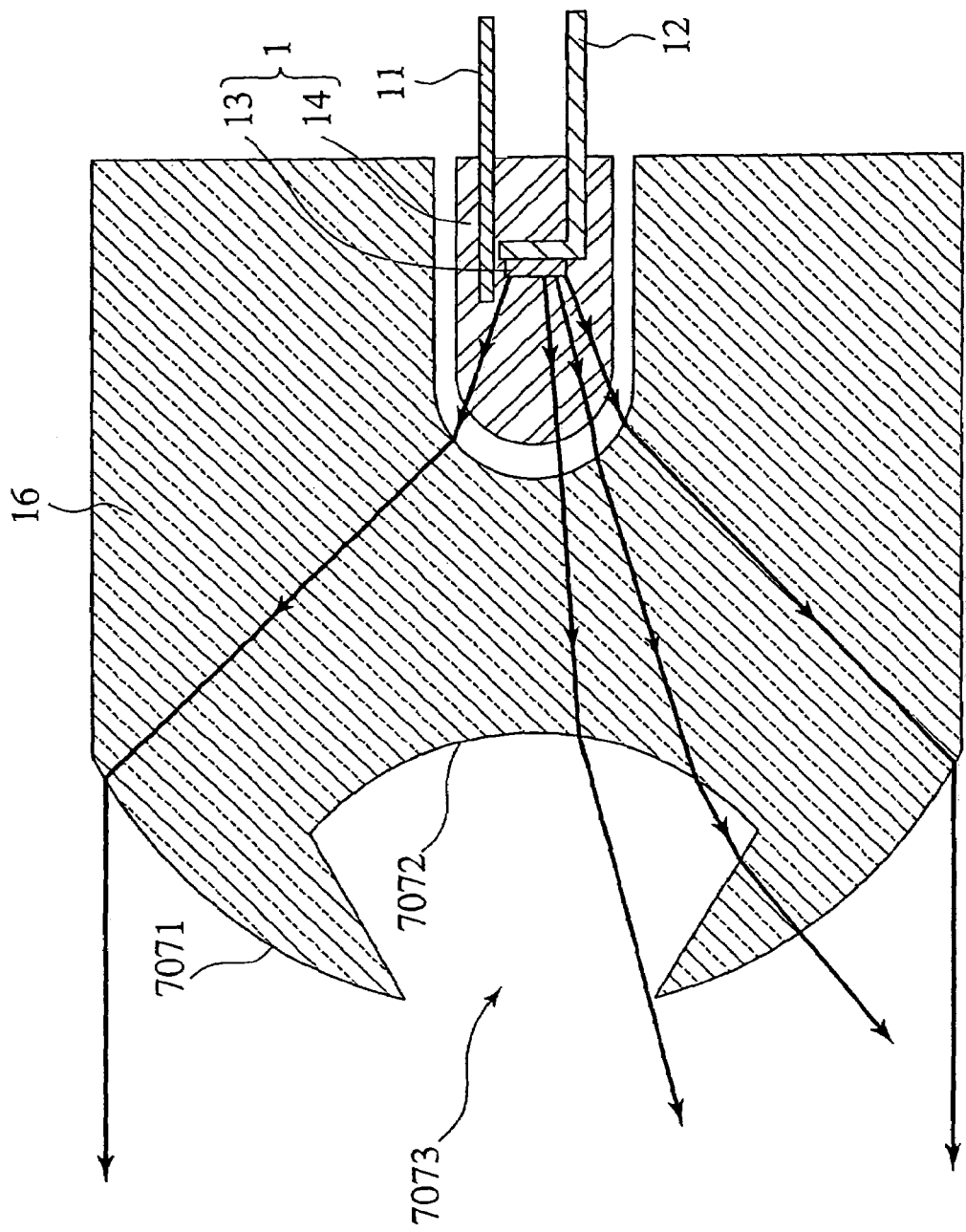

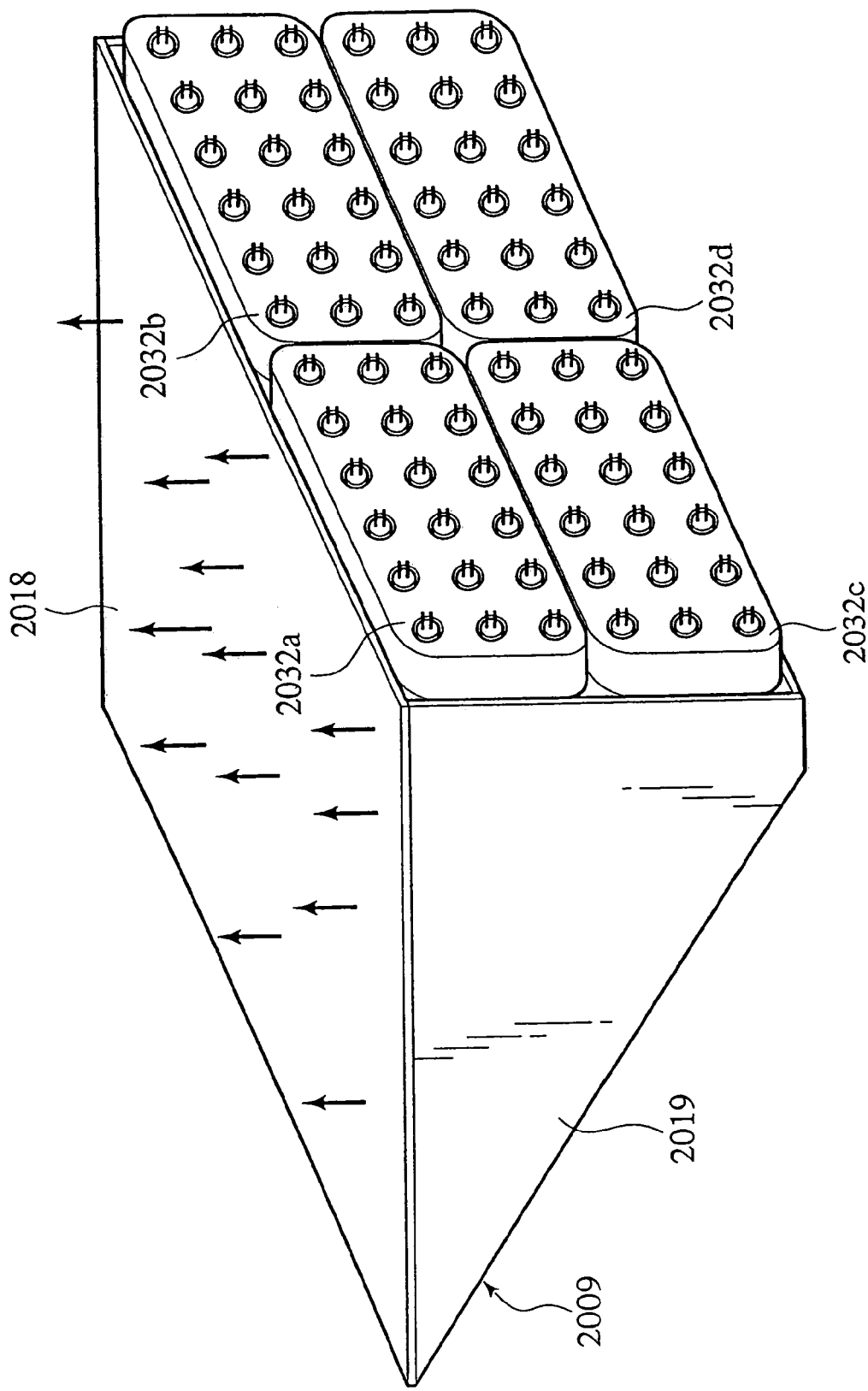

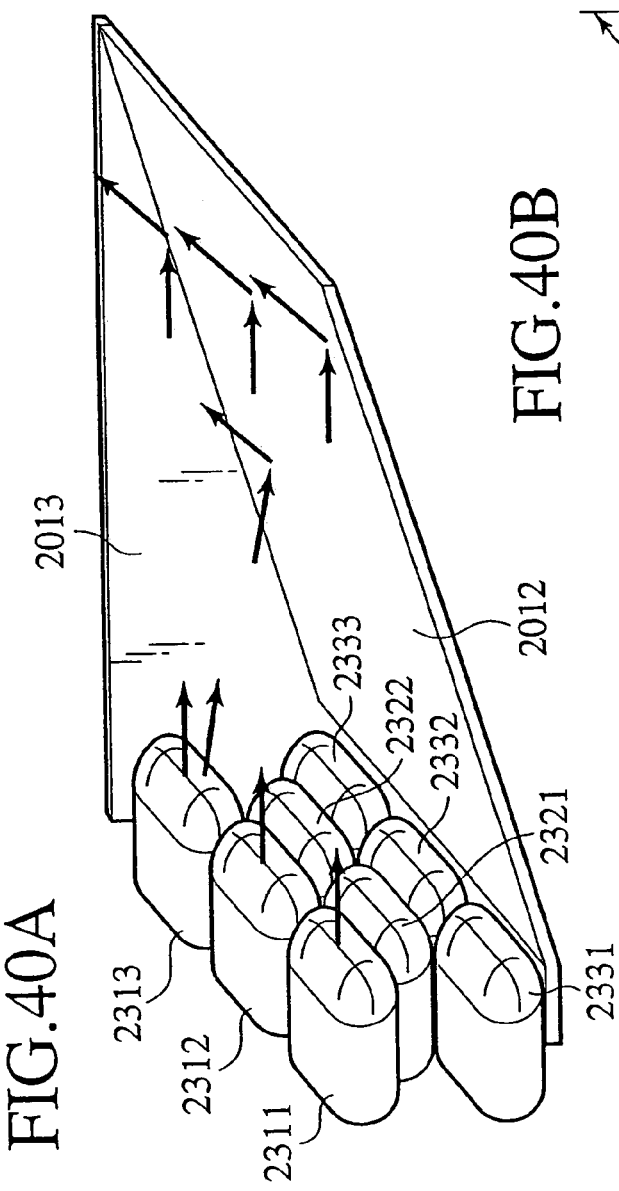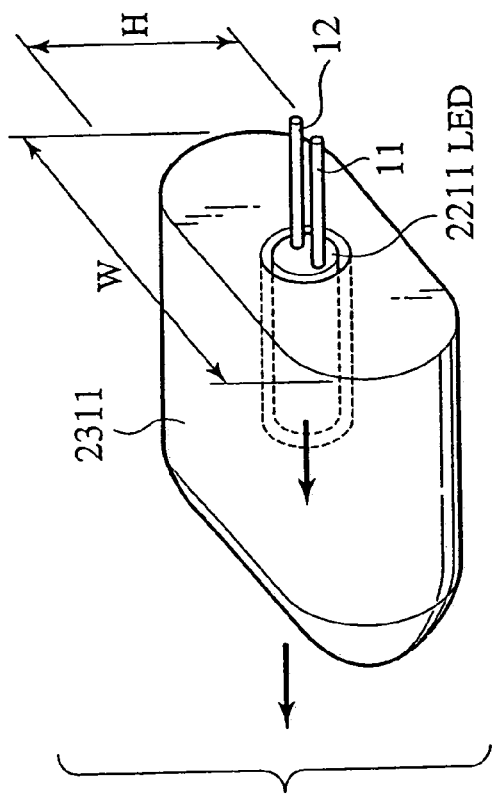

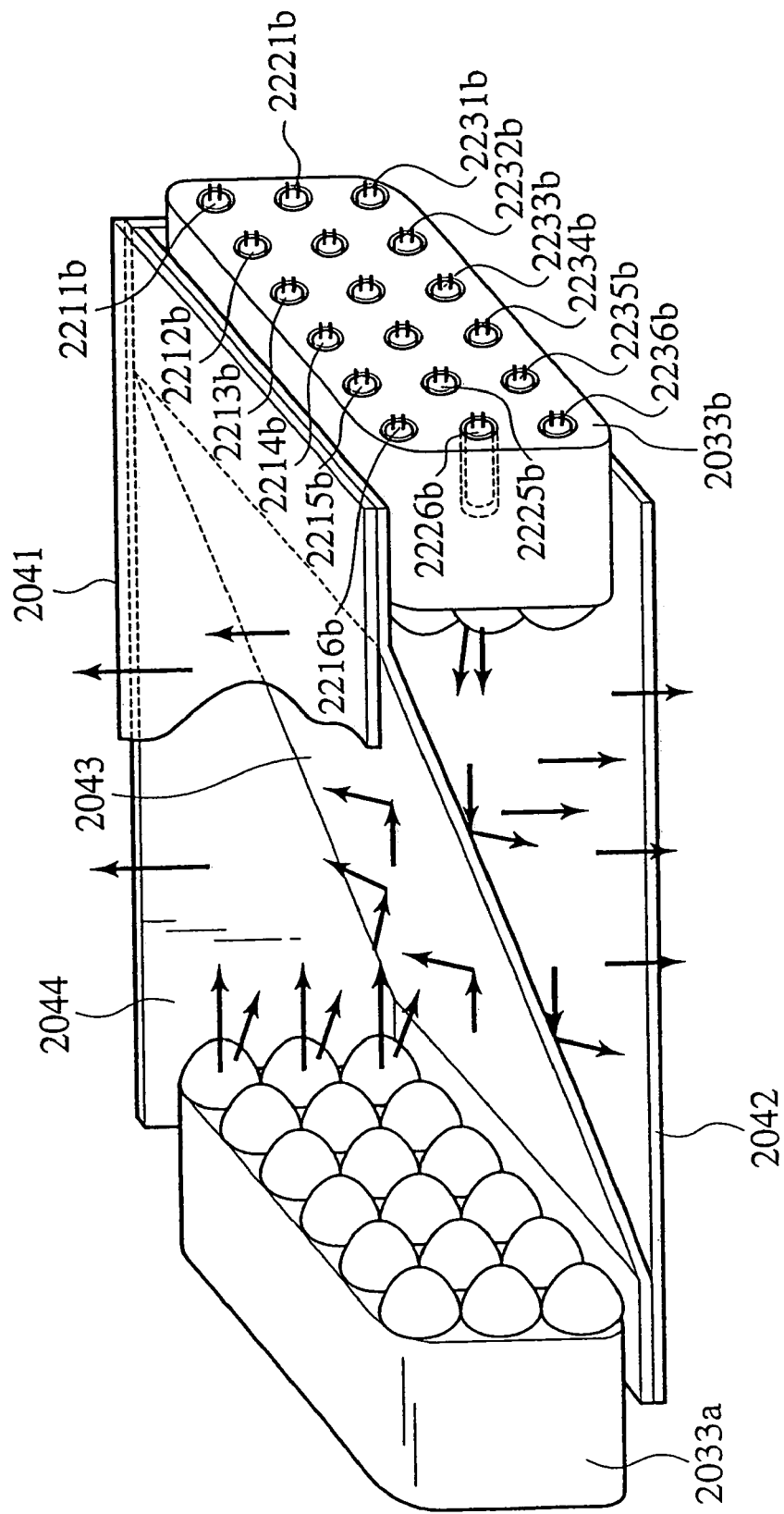

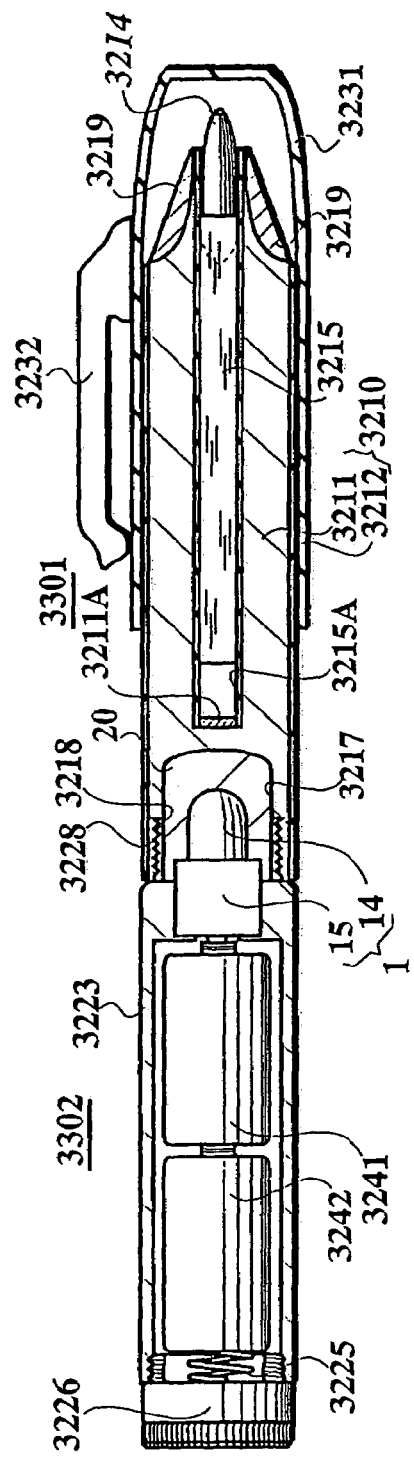
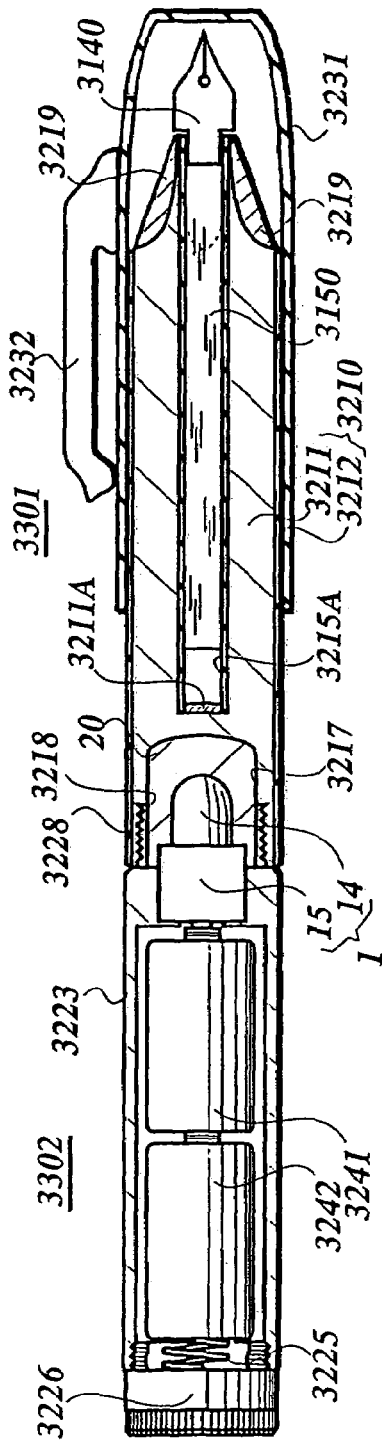
FIG.46A
FIG.46B

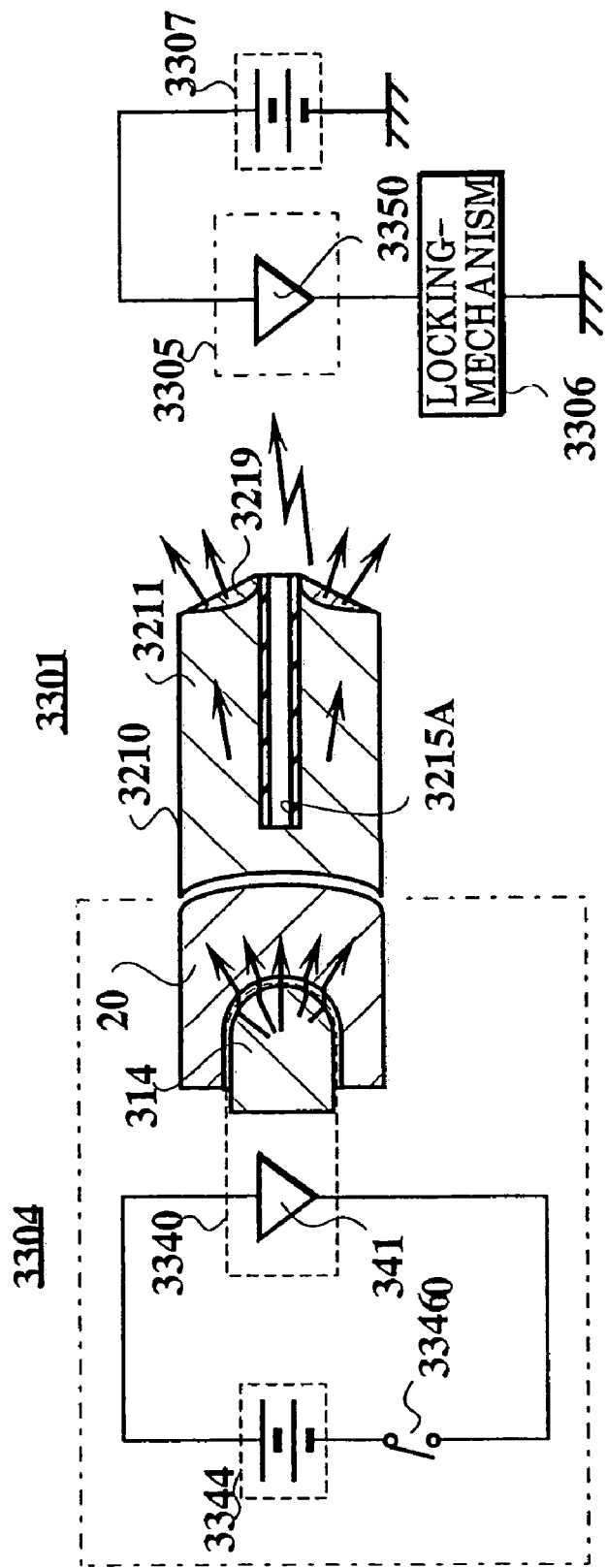

BULK-SHAPED LENS, LIGHT-EMITTING UNIT, AND LIGHTING EQUIPMENT

CROSS-REFERENCE TO RELATED APPLICATION

This application is a continuation application of Application No. 10/048,373 filed Jan. 29, 2002 now U.S. Pat. No. 6,961,190.

BACKGROUND OF THE INVENTION

1. Field of the Invention

The present invention relates to a proposal of an optical lens having a new structure. In particular, the present invention is directed to the optical lens preferable for using the semiconductor light-emitting elements such as a light emitting diode (LED). Further, the present invention pertains to a light-emitting unit using the lens and lighting equipment using the light-emitting unit. Still further, the present invention relates to an optical information system embracing the light-emitting unit and a light-receiving unit.

2. Background-Art

Flashlights having slender bodies employing halogen lamps are marketed recently. But, these kinds of flashlights have disadvantages such that the life of the batteries are short such as around 3 hours, and the life of halogen lamps are short themselves, in continuous lighting operation conditions.

On the other hand, to personal computers, word processors, small portable televisions, vehicle-mounted televisions, the liquid crystal display (LCD) units are popularly used. For the illumination of a liquid crystal display substrate, a fluorescence discharge tube (a fluorescent lamp) is used as the backlight. There is a problem that the fluorescent lamp for the backlight is easily damaged, or is easily deteriorated in the performance, when the personal computer or the portable television installing the fluorescent lamp is dropped. In addition, when it is operated under low temperature environment of winter season in cold districts, the emission of light efficiency becomes low, because the mercury vapor pressure in a tube becomes low, making it impossible to get enough brightness. Furthermore, stability and reliability are insufficient for a long time operation. In addition, as for the most important problem, the power consumption is large. If a portable personal computer is taken an example, a power consumption of the LCD unit is overwhelmingly larger than electricity used in the microprocessor or in the memory. In view of above situation, it is difficult to operate for long time the portable television or the portable personal computer by a battery when the fluorescent lamp is used as backlight illumination. In addition, a fluorescent lamp operates with pulse like emission of light, corresponding to the frequency of a power supply. Therefore, although there may be differences between individuals, the flickering feeling causes a problem of fatigue of human eyes. That is to say, for the application which is near to direct lighting method such as the backlight illumination, there is a problem of influence to the human body coming from fatigue of the eyes by directly looking the light from the fluorescent lamp for a long time, or coming from the fatigue itself of the eyes.

Since the semiconductor light-emitting element such as the light emitting diode (LED) convert the electric energy directly into light energy, compared with the incandescence lamp such as the halogen lamp, or the fluorescent lamp, the semiconductor light-emitting element has high conversion efficiency and characteristics being not accompanied with generation of heat at the emission of light. In an incandescent lamp, because the electric energy is once converted into the heat energy, and the light radiation due to the generation of heat is used, the conversion efficiency of the incandescent lamp to the light is theoretically low, and the conversion efficiency cannot exceed 1%. Similarly, because the electric energy is converted once into electric discharge energy in the fluorescent lamp, the conversion efficiency of the fluorescent lamp is low. On the other hand, in the LED, it is possible to achieve the conversion efficiency of more than more than 20%, which is about 100 times higher than the incandescent lamp or the fluorescent lamp. Furthermore, because the semiconductor light-emitting element such as the LEDs can be considered that the life is almost semi permanent, and there is no problem of flickering such as the light from the fluorescent lamp, it may be called that the light emitted from the semiconductor light-emitting element is "the light-mild-to-human", which does not give bad influence to human eyes and body.

Although the LED has such superior features, applications of the LEDs are limited to extremely limited fields, such as the indication lamps on the control panel in various apparatuses or the display unit such as the electric signboard, and there are few examples in which the LEDs are employed by lighting equipments (illumination apparatus). In a part of application, LED products for illuminating keyholes are known recently, but only small areas can light up by the LED products. In this way, apart from the special example, generally the LED is not employed for illumination.

The above situation is ascribable to the fact that, even the brightness of the LED is extremely high, since the light-emitting-area of a single LED is small of around 1 $mm^2$, the enough light flux required for the lighting equipment not being obtained.

In this way, with the conventional optical system, the illumination intensity on an object plane of illumination does not reach desired illumination intensity by the emission of light of a single LED. In other words, a light flux per a unit area on a plane to be lighted up by the light is not enough.

If the lighting equipment, in which a plurality of LEDs are arranged in the matrix form, is provided specific illumination intensity will be obtained. However, as for the main material of the LED, an expensive compound semiconductor is used for the present, and there is a definite limit in reduction of production cost of the LED, because advanced manufacture technologies such as an epitaxial growth and impurities diffusion are required. Furthermore, in a substrate of an epitaxial growth of the gallium nitride, which is materials of a blue LED, an expensive sapphire substrate is used, and there are other situations peculiar to each semiconductor materials.

Therefore, it is not realistic to assemble the lighting system (lighting equipment) by the manner arranging a lot of expensive LEDs in order to get desired illumination intensity, because it becomes too expensive. In addition, although in silicon (Si), a wafer of a diameter of 300 mm begins to be employed, as epitaxial growth substrate of the compound semiconductor, which is required for the material of the LED, such a large diameter wafer cannot be obtained in the present technical situation. Furthermore, there are problems on manufacturing technology such as the homogeneity of epitaxial growth, it is difficult to manufacture the LED having a large luminescence area fundamentally.

SUMMARY OF THE INVENTION

The present invention is proposed to solve above problems. Therefore, an object of the present invention is to provide a bulk-shaped lens providing a desired illumination intensity without requiring large number of the light sources, a light source such as the LED can be employed.

Another object of the present invention is to'provide a bulk-shaped lens, extracting inherent light energy from a commercially available light source, capable of controlling the modification of optical path such as the optical divergence and optical convergence or changing the focal point, without modifying the configuration of the commercially available light source.

Still another object of the present invention is to provide a light-emitting unit having stability and reliability for long term, and is low cost, capable of achieving the enough illumination intensity.

Still another object of the present invention is to provide a light-emitting unit with low power consumption, capable of eliminating the flickering of light.

Still another object of the present invention is to provide a lighting equipment with which the life of a battery is long and is suitable for carrying.

Still another object of the present invention is to provide an optical information system, which is high in reliability and conversion efficiency.

In view of above objects, the first aspect of the present invention inheres in a bulk-shaped lens encompassing a bulk-shaped lens body identified by top, bottom and contour surfaces, a well-shaped concavity implemented in the bulk-shaped lens body, dug from the bottom of the lens body along the direction to the top surface. A ceiling surface of the concavity established in the interior of the lens body serves as a first lens surface, a top surface of the lens body serves as a second lens surface, the inside of the concavity serves as a storing cavity of a light source or a photodetector. That is to say, the first lens surface serves as an entrance surface, and the second lens surface serves as an exit surface when the light source is installed in the inside of the concavity. On the other hand, the second lens surface serves as the entrance surface, and the first lens surface serves as the exit surface when the photodetector is installed in the inside of concavity. With a term of "bulk-shape", a bullet-shape, an egg-shape, a cocoon-shape, or a barrel vault-shape can be included. As for the sectional geometry, which is perpendicular to the optical axis, a complete circle, an ellipse, a triangle, a quadrangle, a polygon, or another shape is possible. As for the cross-sectional contour surface of the bulk-shaped lens body, the surface may be parallel with the optical axis such as the circumferential surface of a cylinder or a prism, or the surface may have a taper against the optical axis.

The bulk-shaped lens body is required to be a transparent material to the wavelength of light, because the lens body serves as the optical transmission medium, connecting the exit surface to the entrance surface. As "a transparent material", transparent resins (transparent plastic materials) such as an acryl resin, or various kinds of glass materials such as quartz glass, soda-lime glass, borosilicate glass, or lead glass can be employed. Or, crystalline materials such as zinc oxide (ZnO), zinc sulphide (ZnS), silicon carbide (SiC) may be used. In addition, even a material having pliability, flexibility or elasticity, such as transparent elastomer can be employed. In addition, in view of the generation of heat, when an incandescent lamp such as a halogen lamp is used as the light source, a heat-resisting optical material should be used. As the heat-resisting optical material, heat-resisting glass such as quartz glass, sapphire glass is preferable. Or, heat-resisting optical materials may include heat-resisting resins such as polysulfone resin, polyethersulfone resin, polycarbonate resin, polyeteresteramide resin, methacrylic resin, amorphous polyolefin resin, and polymeric materials having parfluoroalkyl radix. A crystalline material such as SiC is superior in heat-resisting characteristics, too.

However, as "the light source", element not generating remarkable heat at the luminescence operation, such as an LED or a semiconductor laser, are desirable. If the LED is used, when "the light source" was installed in the concavity (a storing cavity) of the bulk-shaped lens of the first aspect of the present invention, the thermal effect is not given to the bulk-shaped lens by the heat action.

Desired illumination intensity can be easily achieved without requiring large number of light sources, according to the bulk-shaped lens of the first aspect of the present invention. The illumination intensity of the present invention cannot be achieved by an optical system using the earlier optical lenses. That is to say, the illumination intensity that cannot be predicted by earlier technical common sense can be achieved by simple and small configuration. Although the details are described below, the equivalent function of the bulk-shaped lens of the present invention cannot be implemented by earlier thin optical lenses such as a conventional "double convex lens", "a planoconvex lens", "a meniscus convex lens", "a double concave lens", "a planoconcave lens", "a meniscus concave lens". Or, the equivalent function would only become possible by using a large-scale earlier thin optical lens having a diameter of infinity.

LED has an internal quantum efficiency and an external quantum efficiency, but the external quantum efficiency is usually lower than the internal quantum efficiency. With efficiency nearly equal to the internal quantum efficiency, it becomes possible to extract the inherent light energy from the LED, by installing the LED in the storing cavity (concavity), which is formed in the bulk-shaped lens, according to the first aspect of the present invention.

In addition, modification of the optical path such as divergence or convergence of light, and modification of the focal point are easily implemented without modifying the configuration of the light source itself, such as the LED itself, according to the bulk-shaped lens of the first aspect of the present invention.

"Light source" of the first aspect of the present invention is preferably an element emitting the light in particular direction in predetermined divergence angle. This is because, if the divergence angle of the light is known, emitting the light to a particular direction, the design of optics such as convergence or dispersion of light becomes easy, and because the choice of radiuses of curvature of the first and second surfaces can be simplified. In addition, we should pay attention that one of the first and second curved surfaces can have infinite radius of curvature, or can be identified as the near flat plane. If one of the first and second curved surfaces is assigned by the predetermined (limited) radius of curvature, which is not infinity, the convergence or divergence of light is controllable. In addition, we should pay attention that "the predetermined divergence angle" may include zero°, or that parallel rays can be included. In addition, even if the divergence angle is 90°, since the storing cavity encapsulate nearly completely the main luminescence portion of the light source, the condensing of the light can be executed efficiently. This effectiveness cannot be achieved by the optical system of earlier optical lenses.

That is to say, the inner wall of the storing cavity other than the portion serving as the entrance surface (the ceiling surface) identified by the first curved surface can serve as the effective entrance portion of the light.

To be concrete, "the light source" of the first aspect of the present invention is preferable to be a molded semiconductor light-emitting element, molded by a transparent material having the first refractive index, and the storing cavity install the light source through fluid or liquid material having a second refractive index different from the first refractive index. Here, "the fluid" may be gas or liquid, which is transparent to wavelength of the light emitted from the light source, and it may be air in the simplest choice. "The liquid material" may be sol-like material, colloid-like material or gel-like material, which is transparent to wavelength of the light emitted from the light source. Or "the main luminescence portion of light source" in the first aspect of the present invention is implemented by an edge of an optical fiber having transmission portion made of a transparent material with the first refractive index, and the storing cavity can install, through fluid or liquid material having the second refractive index different from the first refractive index, the edge of the optical fiber. In this case, the light source employed to input the predetermined light, from the other end of the optical fiber, is not always limited to the semiconductor light-emitting element. Because, even if the light is emitted from the incandescent lamp, the edge of the optical fiber received inside of concavity of the bulk-shaped lens (a storing cavity) can be kept at low temperature.

The second aspect of the present invention inheres in the light-emitting unit, encompassing at least a light source, emitting light of predetermined wavelength, and a bulk-shaped lens, encapsulating nearly completely the main luminescence portion of the light source. And the bulk-shaped lens is identified by the structure described in the first aspect, and it embraces the bulk-shaped lens body identified by top, bottom and contour surfaces and the well-shaped concavity implemented in the lens body, the concavity being dug from the bottom to top surface. And the ceiling surface of the concavity established in the interior of the lens body serves as the entrance surface, while the top of the lens body serves as the exit surface, and the inside of concavity serves as the storing cavity of the light source.

In the light-emitting unit of the second aspect of the present invention, it is preferable to install a semiconductor light-emitting element such as an LED in the inside of the concavity of the bulk-shaped lens (the storing cavity), since the generation of heat is so small from the semiconductor light-emitting element at luminescence operation, even if the light source is received in the concavity, that the thermal effect is not given to the bulk-shaped lens, and therefore, in long term operation, high reliability and stability can be achieved.

According to the light-emitting unit of the second aspect of the present invention, desired illumination intensity can be easily obtained by small number of the light sources. This illumination intensity provides a high enough brightness, which cannot be predicted by earlier technical common sense, or the illumination intensity is not achieved by known optical system. Furthermore, the light-emitting unit consumes small electricity, without flickering.

In the light-emitting unit of the second aspect of the present invention, the light source is preferable to have an optical geometry so as to emit a beam to particular orientation with a predetermined divergence angle. If the divergence angle of light is known, the design of optics such as condensing and dispersing becomes easy, and the selections of radius of curvatures of the first and second curved surfaces can be simplified. In addition, as described in the first aspect, either of the first and second curved surfaces can include the surface, which is nearly flat having infinite or nearly infinite radius of curvature.

In the light-emitting unit of the second aspect of the present invention, light source is preferable to be a molded semiconductor light-emitting element in a transparent material having a first refractive index, and it is preferable that the storing cavity receives the light source through a fluid or a liquid material having a second refractive index different from the first refractive index. "The fluid" can be construed as gas or liquid, and "the liquid material" as a sol-like, colloid-like, or a gel-like material, as defined in the first aspect.

Or, in a light-emitting unit of the second aspect of the present invention, an edge of an optical fiber having transmission core made of a transparence material having the first refractive index can serve as the main luminescence portion of light source, the optical fiber is connected optically to a predetermined light source, the storing cavity installs the edge of the optical fiber through the fluid or liquid material having the second refractive index different from the first refractive index.

A third aspect of the present invention inheres in a lighting equipment encompassing a power supply unit and the light-emitting unit described in the second aspect. As the power supply unit for portable lighting equipment, a battery is preferable. As the light source, a semiconductor light-emitting element configured to emit light of predetermined wavelength is desirable, in which a semiconductor chip is molded in a transparence material, the chip having anode and cathode electrodes, both connected to the battery. The lighting equipment is preferable to use the bulk-shaped lens, nearly completely encapsulating the main luminescence portion of the semiconductor light-emitting element. A bulk-shaped lens is implemented by the configuration described in the first aspect.

In the lighting equipment of the third aspect of the present invention, since a single semiconductor light-emitting element is enough to be used, the structure becomes simple, and it can be manufactured in lower cost. In addition, the bulk-shaped lens extracts the inherent light energy of this semiconductor light-emitting element so that the enough illumination intensity required for lighting is achieved. Furthermore, this lighting equipment is superior in stability and reliability for a long term, operates without flickering. Furthermore, because the power dissipation is low, a lifetime of battery is long.

The fourth aspect of the present invention inheres in an optical information system embracing a light-emitting unit and a light-receiving unit. Similarly as described in the second aspect, the light-emitting unit encompasses a first bulk-shaped lens body, identified by first top, first bottom and first contour surfaces, and a light source emitting light of predetermined wavelength, installed in the well-shaped first concavity, the concavity is implemented in the inside of the first lens body, dug from the first bottom to the first top surface. On the other hand, the light-receiving unit encompasses a second bulk-shaped lens body, identified by second top, second bottom and second contour surfaces and a photodetector detecting light of the predetermined wavelength, installed in the well-shaped second concavity implemented in the second bulk-shaped lens, the second concavity is dug to the second top from the second bottom. The ceiling surface of the first concavity serves as the first entrance surface, the first top surface serves as the first exit surface, the second top surface serves as the second entrance surface, and the ceiling surface of the second concavity serves as the second exit surface.

In the optical information system of the fourth aspect of the present invention, it is preferable to employ a semiconductor light-emitting element such as an LED as the light source, by which the generation of heat is low at the luminescence operation, such that the light source is installed in the inside of concavity (the storing cavity) of the bulk-shaped lens, because even if the light source is installed in the concavity, the thermal effect is not given to the bulk-shaped lens so that, in a long term operation, high reliability and high stability can be achieved. In addition, an optical signal can be transmitted with high conversion efficiency as already explained in the second aspect. On the other hand, in the light-receiving unit, the light arrives to photodetector in the reverse process of the light-emitting unit so that the photo detection with extremely high sensitivity is achieved.

BRIEF DESCRIPTION OF THE DRAWINGS

FIG. 2A is a schematic view showing a measuring system, configured to measure vertical optical intensity (illumination intensity) profile to optical axis orientation, using the bulk-shaped lens of the first embodiment of the present invention.

FIG. 2B is a schematic view showing a measuring system using an earlier double convex lens, comparing with FIG. 2A.

FIG. 6 is a list showing the corresponding geometrical configurations in the bulk-shaped lens shown in FIG. 5, respectively.

FIG. 35 shows a schematic cross-sectional view of a light-emitting unit according to a 14th embodiment of the present invention.

FIG. 39 shows a bird's-eye view of a two-dimensional light-emitting unit of another modification of the 16th embodiment of the present invention.

FIG. 40A shows a partially broken bird's-eye view of a two-dimensional light-emitting unit according to a 17th embodiment FIG. 40B is a bird's-eye view showing a bulk-shaped lens to be used to the two-dimensional light-emitting unit shown in FIG. 40A.

FIG. 41 shows a partially broken bird's-eye view of a two-dimensional light-emitting unit according to a 18th embodiment

FIG. 46A shows a schematic cross-sectional view of a hand-held instrument according to a modification of the 20th embodiment of the present invention.

FIG. 46B shows a sectional view of a hand-held instrument according to another modification of the 20th embodiment of the present invention.

FIG. 47 is a schematic view showing a locking/release system according to a 21st embodiment of the present invention.

DETAILED DESCRIPTION OF THE INVENTION

Figure 1:
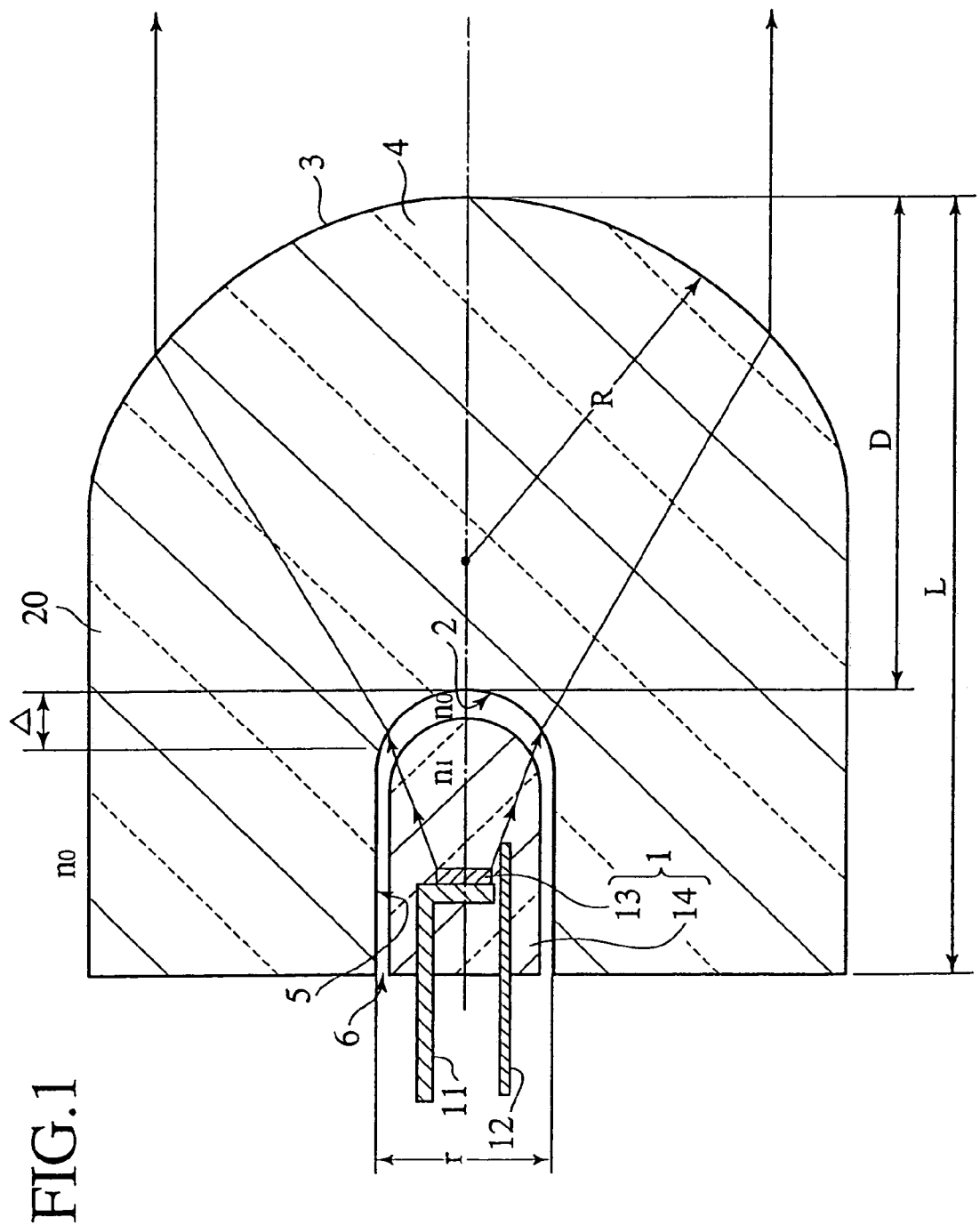
FIG. 1 is a schematic cross-sectional view showing the light-emitting unit according to a first embodiment of the present invention.

First embodiment to 27th embodiment of the present invention will be described with reference to the accompanying drawings. It is to be noted that the same or similar reference numerals are applied to the same or similar parts and elements throughout the drawings. However the drawings are represented schematically, and it will be appreciated that the relationships between the layer thicknesses and the plane size, the proportions of thickness of each layer are different from the real configuration. Therefore, concrete thickness and size must be determined taking into consideration of following discussion. Further, and it will be appreciated that the various drawings are not drawn to scale from one figure to another, and included the portion in which the relationship or proportion of mutual sizes are different.

First Embodiment

FIG. 1 is a schematic cross-sectional view showing a light-emitting unit of the first embodiment of the present invention. As shown in FIG. 1, the light-emitting unit of the first embodiment of the present invention embraces at least a light source 1 emitting light having predetermined wavelength and a bulk-shaped lens 20 encapsulating nearly completely the light source 1. And, the bulk-shaped lens 20 encompasses a bulk shape (bullet-shape) lens body 4 identified by top surface 3, bottom surface and contour surface and a well-shaped concavity 6 implemented in the inside of lens body 4, dug to top surface 3 from the bottom surface. A ceiling surface of the concavity 6 implemented in the interior of lens body 4 serves as a first lens surface 2, the top surface of the lens body serves as a second lens surface 3, the inside of the concavity serves as a storing cavity 6 of the light source 1.

The first lens surface 2 serves as an entrance surface 2 identified by the first curved surface. Staring cavity 6 encompasses a ceiling surface 2 identified by a first curved surface and a sidewall portion, which is configured to form the concavity in succession to the ceiling surface 2. The light incident from the entrance surface 2 outputs from the exit surface 3, or the second lens surface 3 identified by the second curved surface. The portion connecting the enirance surface 2 and the exit surface 3 of lens body 4 should be made of a transparent material to wavelength of light emitted from the light source, because the portion serves as an optical transmission medium.

The light source 1 shown in FIG. 1 is a resin-molded LED encompassing a first pin 11, a susceptor connected to the first pin 11 so as to merge into a single body, an LED chip 13 mounted on the susceptor, molding resin 14 configured to encapsulate the LED chip 13, and a second pin 12 opposing to the first pin 11. A top surface of a main luminescence portion of this resin molded LED 1 has a convex-shaped curved surface as shown in FIG. 1. In this way, the light emitted from LED chip 13 is directed in predetermined divergence angle to right direction in FIG. 1, because the vicinity of the top surface of the resin mold 14 has the convex-shaped curved surface.

For example, apart from the convex-shaped curved surface portion, the resin molded LED 1 has a cylinder geometry of diameter (outside diameter) $2r_{LED}$=2-3 mm$^\Phi$. As for the side wall region of the storing cavity 6 of the bulk-shaped lens 20, the storing cavity 6 has a cylindrical geometry of diameter (inside diameter) $2r$=2.5-4 mm$^\Phi$ to be able to receive a main luminescence portion of resin molded LED 1. Although the illustration is omitted, between the storing cavity 6 of the LED 1 and the bulk-shaped lens 20, a spacer of thickness around 0.25-0.5 mm is interposed in order to fix the LED 1 and the bulk-shaped lens 20. The outside diameter $2r_{LED}$ of the LED 1 is approximately same as the inside diameter $2r$ of the storing cavity 6, and the outside diameter $2r_{LED}$ of the LED 1 is set slightly smaller than the inside diameter 2r. It is preferable that the spacer is disposed to exclude the main luminescence portion of the LED 1, or the left portion from the bottom face of LED chip 13 in FIG. 1. Bulk-shaped lens 20 has a almost cylinder geometry, similar to the geometry of the LED 1, apart from the top surface having the exit surface, identified by the convex-shaped second curved surface. Diameter (outside diameter) 2Ro of cylinder geometry portion of this bulk-shaped lens 20 is 10-30 mm$^\Phi$. The diameter (the outside diameter) 2Ro of the bulk-shaped lens 20 can be chosen depending on purposes of use of the light-emitting units of the first embodiment of the present invention. Therefore, it can be less than 10 mm$^\Phi$, and even more than 30 mm$^\Phi$. However, in order to increase the condensing efficiency, it is preferable to satisfy the relationship:

$$10r > Ro > 3r \quad (1)$$

Diameter (outside diameter) 2Ro of the bulk-shaped lens 20 can be more than 10 times of the inside diameter 2r of the storing cavity 6, and the large dimensional bulk-shaped lens of the present invention can operate similarly, but it is unfavorable for the purpose of miniaturization, because it becomes larger than requirement.

Generally, the light appearing from region aside from a convex-shaped curved surface of the resin mold 14 of the LED 1 does not contribute to lightings, because it becomes so-called stray light component. However, in the geometrical configuration according to the first embodiment of the present invention, in which the geometry satisfy the Eq. (1), because the resin molded LED 1 is nearly completely encapsulated in the storing cavity 6 of the bulk-shaped lens 20, the stray light component become possible to contribute significantly to lighting. That is to say, the inner wall portion 5 of the storing cavity 6 aside from the entrance surface (the ceiling surface) 2, identified by the first curved surface, can serve as the effective entrance surface of the light. In addition, components of light reflected back in each interface repeats multiple reflections between the storing cavity 6 of the LED 1 and the bulk-shaped lens 20 so that it become the stray light components. By an optical system of the earlier known optical lenses, these stray light components cannot be extracted so as to contribute to effective lighting. However, these stray light components can finally contribute to lighting, because these stray light components are confined in the inside of the storing cavity 6, in the first embodiment of the present invention. Because the geometrical configuration being designed to satisfy Eq. (1), the light input from the inner wall portion 5 of the storing cavity 6 can be prevented from leaking from the contour surface of the bulk-shaped lens 20 again. Consequently, it becomes possible to extract the inherent light energy from the LED chip 13, with extraction efficiency approximately same as the internal quantum efficiency, without depending on geometry of the resin mold 14 nor the reflection component of the mutual optical system.

FIG. 2A is schematic view showing a measurement system, in which the optical intensity profiles (the illumination intensity profiles) are measured vertically to optical axis, using the bulk-shaped lens 20 of the first embodiment of the present invention. Intensity of radiation (the illumination intensity) from an exit surface of the bulk-shaped lens 20 is measured at a measuring distance x=(Constant) from the LED 1, while the illuminometer 102 is moved along y-axis direction. A measuring distance (x) is measured along the optical axis direction. On the other hand, FIG. 2B shows the optics in which an earlier double convex lens is used, and similar measurement is done. In the measurement shown in FIGS. 2A and 2B, an outside diameter of the bulk-shaped lens 20 of the first embodiment of the present invention is selected to be 30 mm$^\Phi$, and the outside diameter of the double convex lens 101 used in comparison is selected to be 63 mm$^\Phi$, which is over two times of the bulk-shaped lens 20. Even if, as can be seen in following discussion, even the outside diameter of the earlier thin optical lens (the double convex lens) 101 is selected such as a little over two times of the bulk-shaped lens 20, the equivalent optical characteristic cannot be obtained as the bulk-shaped lens 20 of the first embodiment of the present invention by the earlier thin optical lens. Double convex lens 101 employed has a focal distance 190 mm, which is disposed from the LED 1 in a location of 150 mm along the x direction. In addition, by the earlier optical system shown in FIG. 2B, additional instruments such as a lens holder or a driving unit is required aside from the illustrated instruments, and adjustment is complicated, but expansion or convergence of the optical path, can be realized by the simple configuration shown in FIG. 2A with the bulk-shaped lens 20 of the first embodiment.

Figure 3:
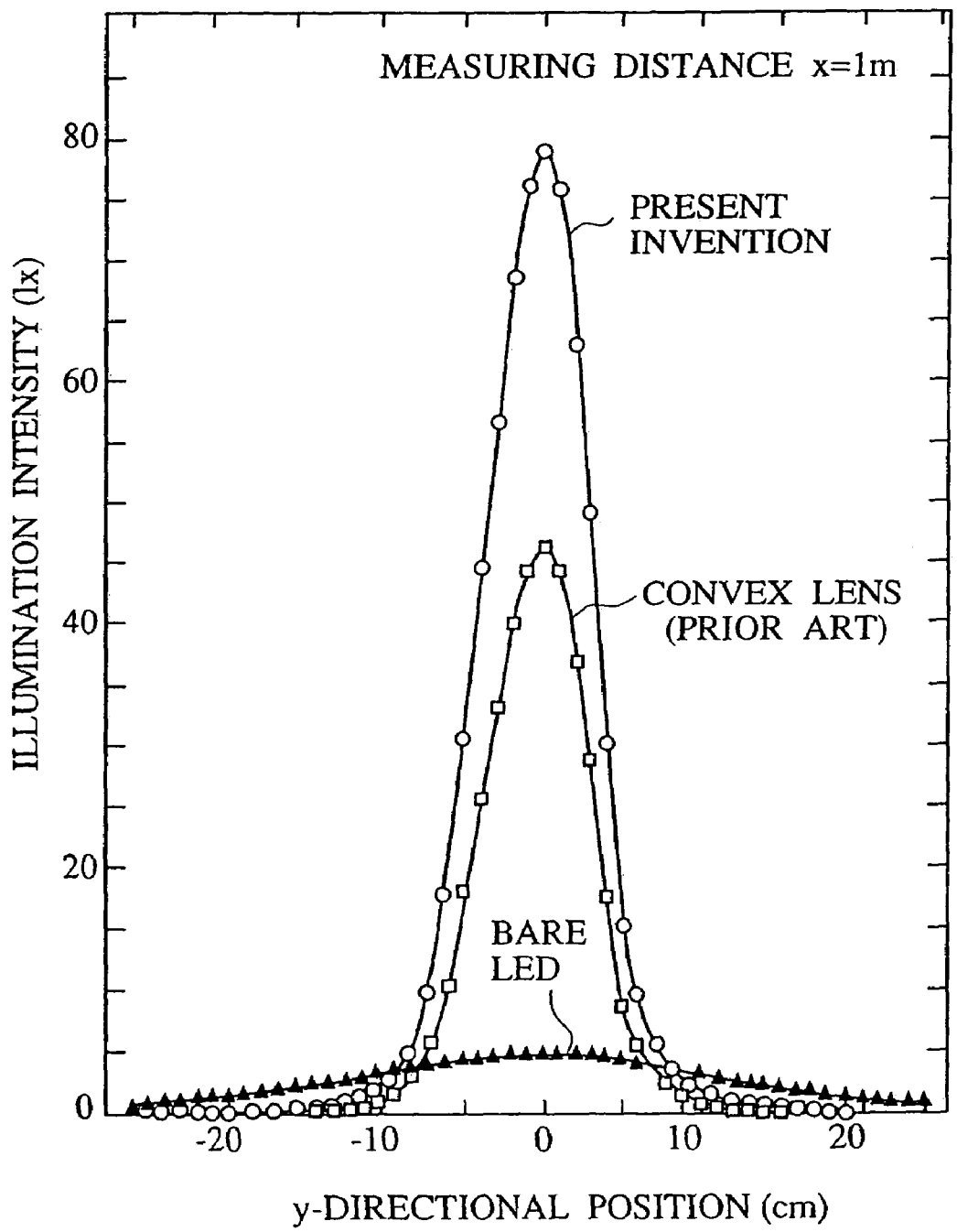
FIG. 3 is a diagram showing the measured results, when output intensity profiles (illumination intensity profiles) along y direction of radiation from the bulk-shaped lens of the first embodiment of the present invention, an earlier thin optical lens (a double convex lens), and bare LED, and each of the output intensity profiles were measured at measuring distance x=1 m.

FIG. 3 shows the results, in which intensity (illumination intensity) profiles along y-direction of radiation from the bulk-shaped lens 20 of the first embodiment of the present invention, the earlier thin optical lens (double convex lens) 101 and a bare LED without using the bulk-shaped lens were respectively measured at measuring distance x=1 m. It is found that, by the bulk-shaped lens 20 of the first embodiment of the present invention, illumination intensity two times larger than that of the earlier thin optical lens (double convex lens) 101 is achieved.

Figure 4:
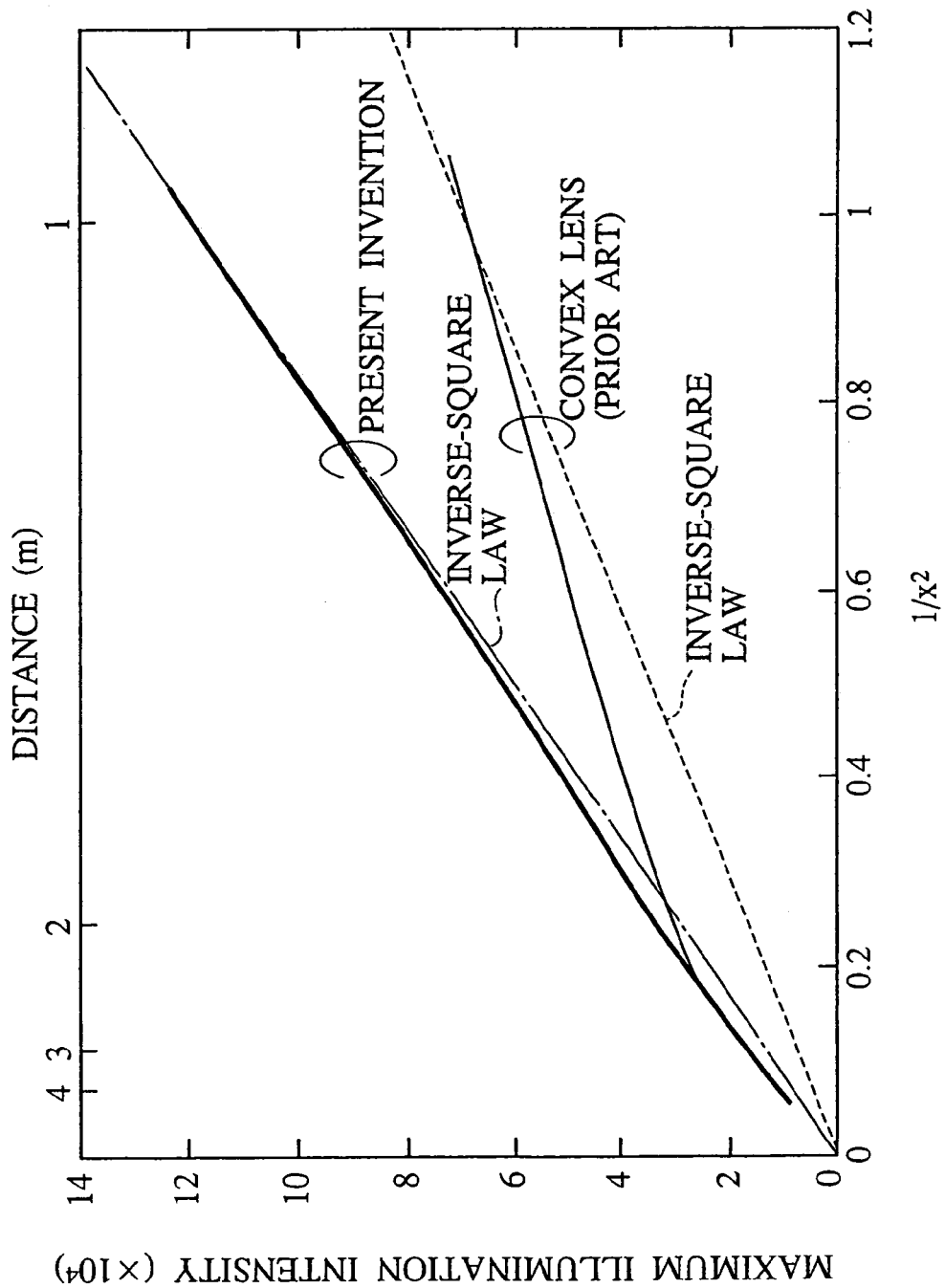
FIG. 4 shows similar results as shown in FIG. 3, but the output intensity profiles (the illumination intensity profiles) along y direction were measured, changing the measuring distance x.

FIG. 4 shows the intensity (illumination intensity) profile along y-direction similar to the data shown in FIG. 3, but the illumination intensity profiles are measured at various measuring distance x, and they are gathered up. Abscissa of FIG. 4 represents inverse-square of measuring distance x, that is to say of $1/x^2$, while ordinate represents maximum intensity (peak intensity) measured at respective measuring distance x. As shown in FIG. 4, data points are plotted perfectly on a line showing the inverse-square law, that is to say, on the line, which shows $1/x^2$, for the case of the bulk-shaped lens 20 according to the first embodiment of the present invention. On the other hand, for the case of the earlier thin optical lens (the double convex lens) 101, data points are deviated from the inverse-square law. That is to say, for the case of the bulk-shaped lens 20 of the first embodiment of the present invention, the beam parallelism of radiation is good, but in the case of the earlier thin optical lens (the double convex lens) 101, it is found that data points are deviated from the inverse-square law because the beam is not in parallel. By means of the double convex lenses of other focal distances, even if the distances between the LED and the double convex lenses are changed, the very similar results are obtained. If the double convex lens of diameter infinity were used, it might be possible, but even if any kind of realistic double convex lens is used, it is impossible to get the same results as the bulk-shaped lens 20 of the first embodiment in such compact configuration as shown in FIG. 2A. From consideration of simple geometrical optics, it is extremely impossible to bring the convex lens close to the LED. We should use the convex lens of very small focal distance, such as being used in microscope, to bring the convex lens close to the LED. However, condensing efficiency decreases when the convex lens is brought close to the LED in this way. When a short focus optical lens having large diameter is prepared in order to improve the condensing efficiency, the distance between the LED and the center of the convex lens gets impossible to be shortened substantially, because the optical lens becomes thick as the diameter becomes large. It can be concluded that the extremely giant diameter and complex optical system is required after all in order to get the same results as the bulk-shaped lens 20 of the first embodiment of the present invention. In other words, with thin optical lenses such as an earlier "double convex lens", "a planoconvex lens", "a meniscus convex lens", "a double concave lens", "a planoconcave lens", "a meniscus concave lens", if we do not use the large-scale optical lens having diameter of infinity, the equivalent function implemented by the bulk-shaped lens 20 of the first embodiment of the present invention cannot be achieved.

Figure 5:
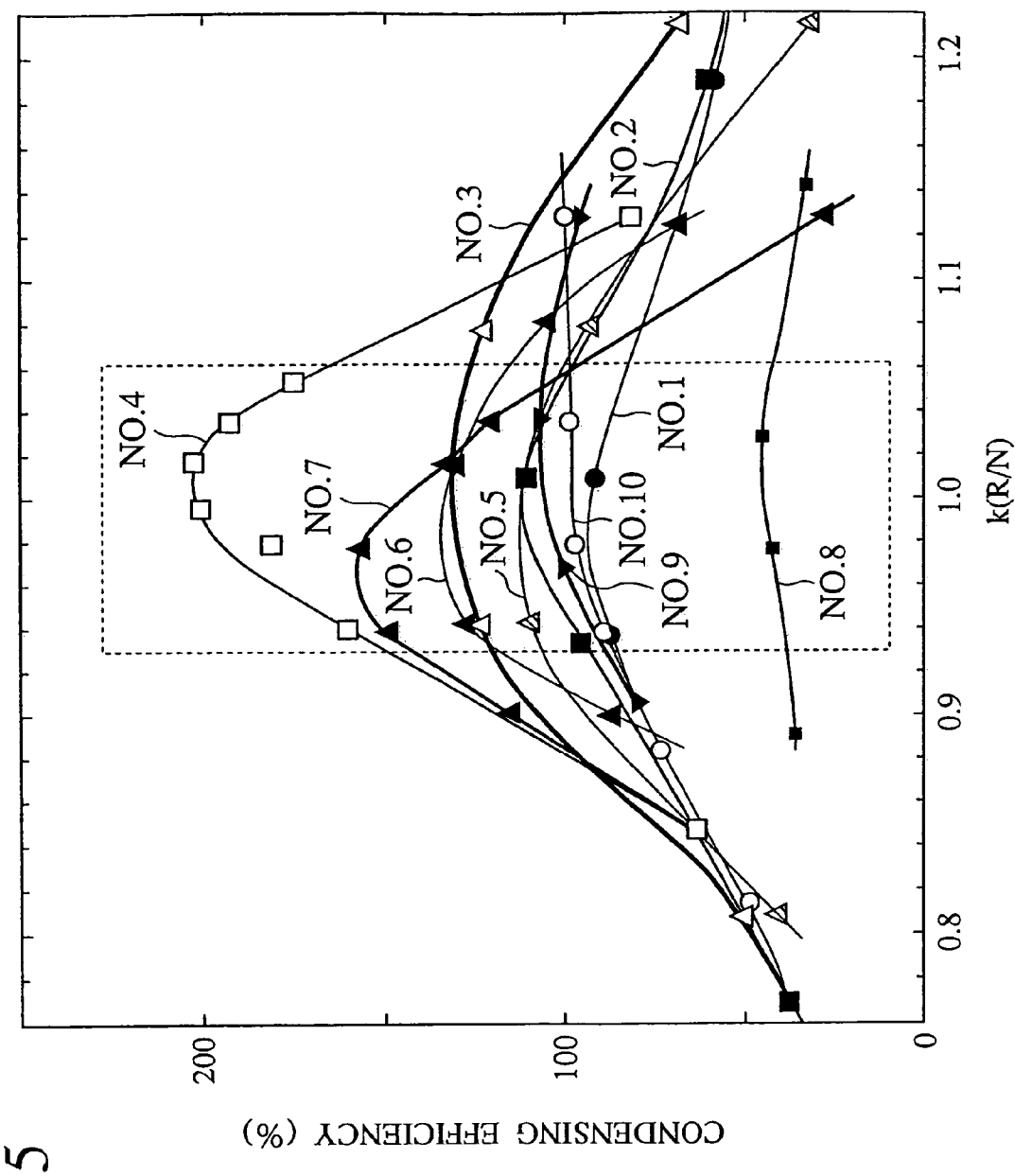
FIG. 5 is a diagram showing relationships between geometrical configurations and the corresponding condensing efficiencies of the bulk-shaped lenses of the first embodiment of the present invention.

FIG. 5 shows relationships between geometrical configurations of the bulk-shaped lens of the first embodiment of the present invention and corresponding condensing efficiency. Here, "the condensing efficiency" is defined as the value: "Quantity of output light in divergence angle less than ±1° from the bulk-shaped lens" divided by "quantity of light in divergence angle less than ±15° from light source(LED)".

Figure 7:
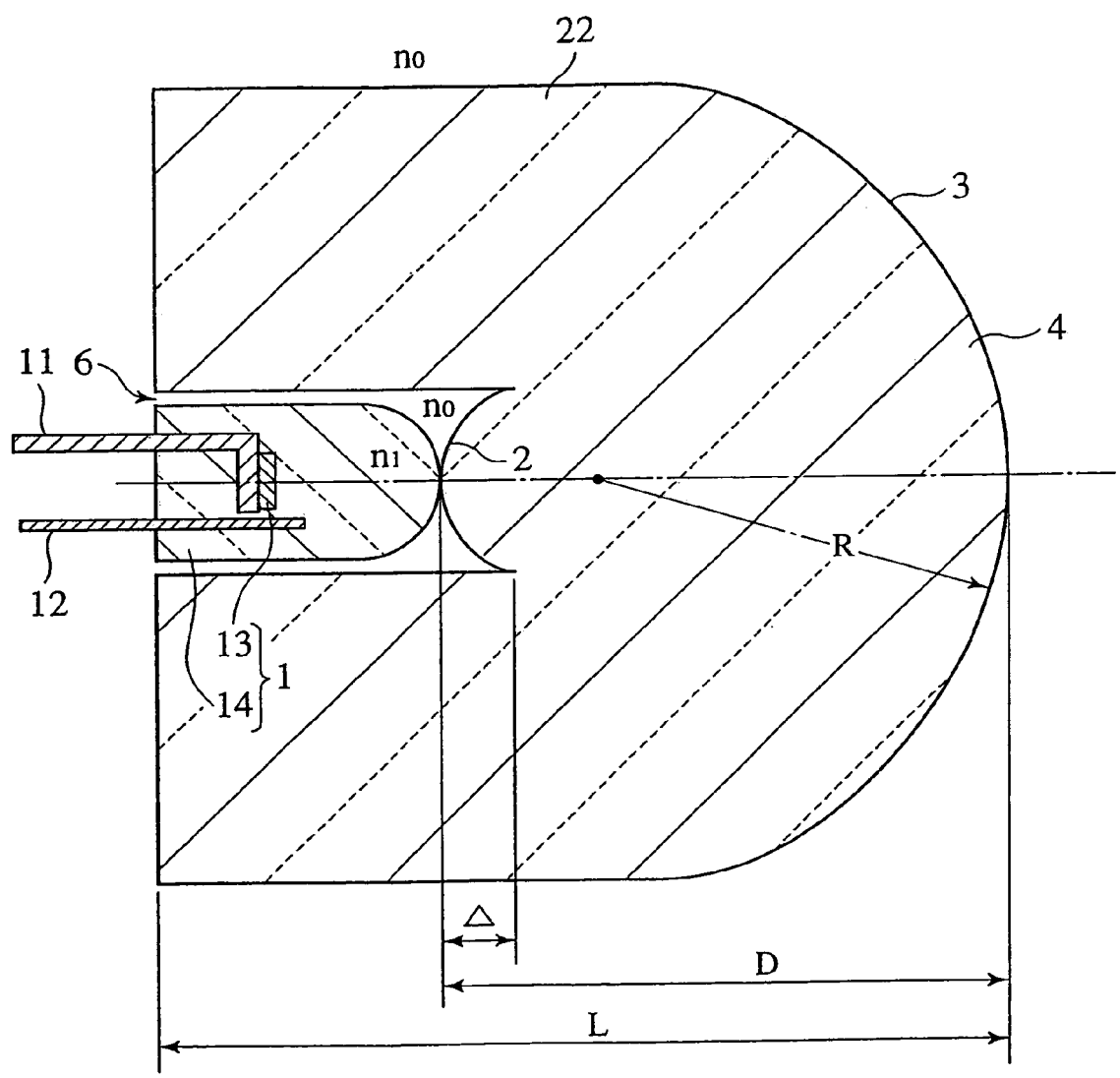
FIG. 7 is a schematic cross-sectional view showing a light-emitting unit according to a modification of the first embodiment of the present invention.
Figure 8A:
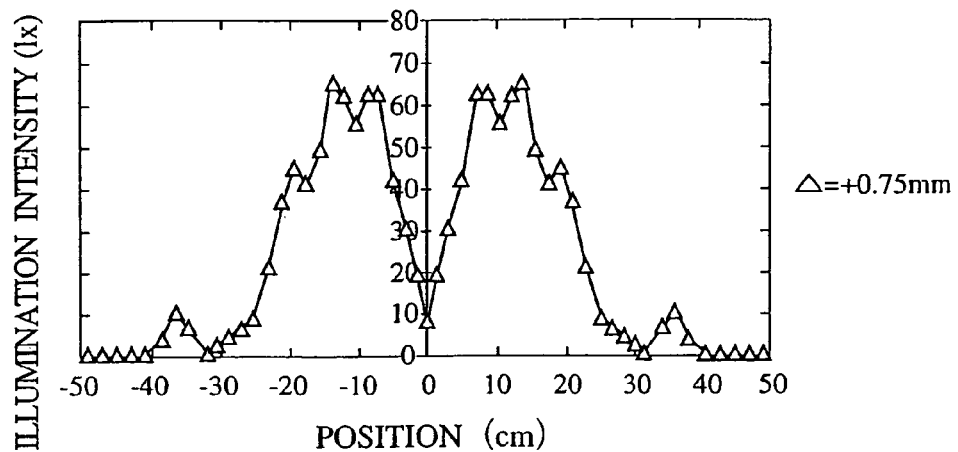
FIGS. 8A to 8C show relationships between the protruding heights A implemented by the first lens surfaces and the corresponding beam intensity profiles, respectively.
Figure 8B:
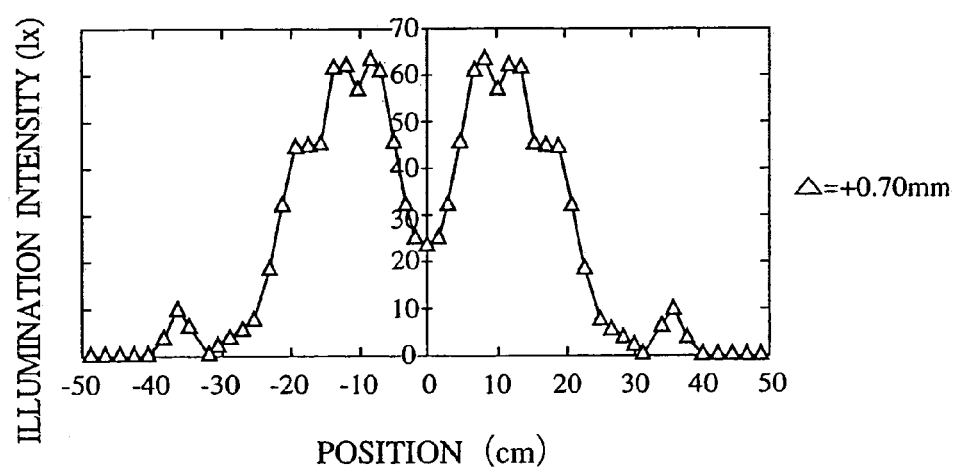
Figure 8C:
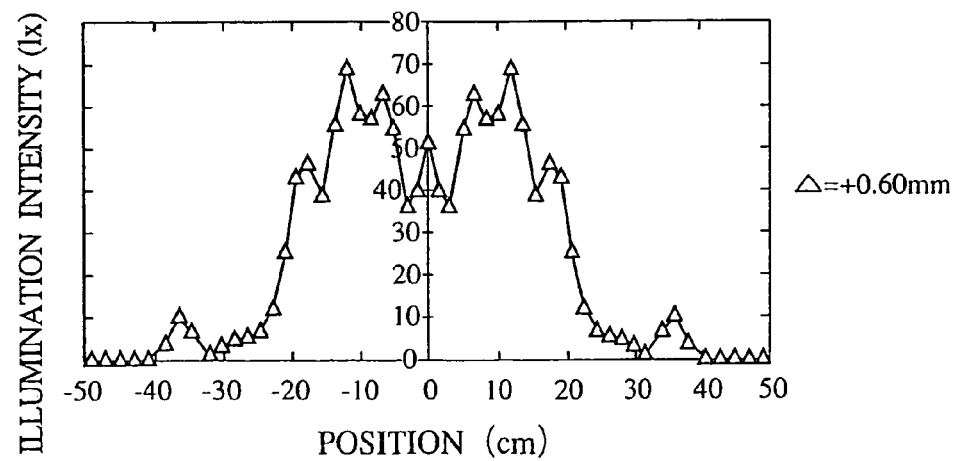
Figure 9A:
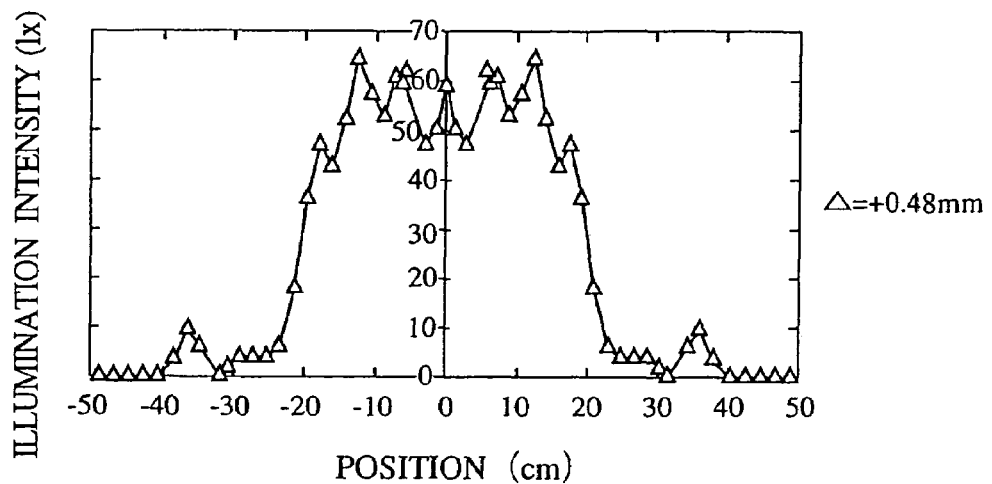
FIGS. 9A to 9C show relationships between the protruding heights A implemented by the first lens surfaces and the corresponding beam intensity profiles, respectively.
Figure 9B:
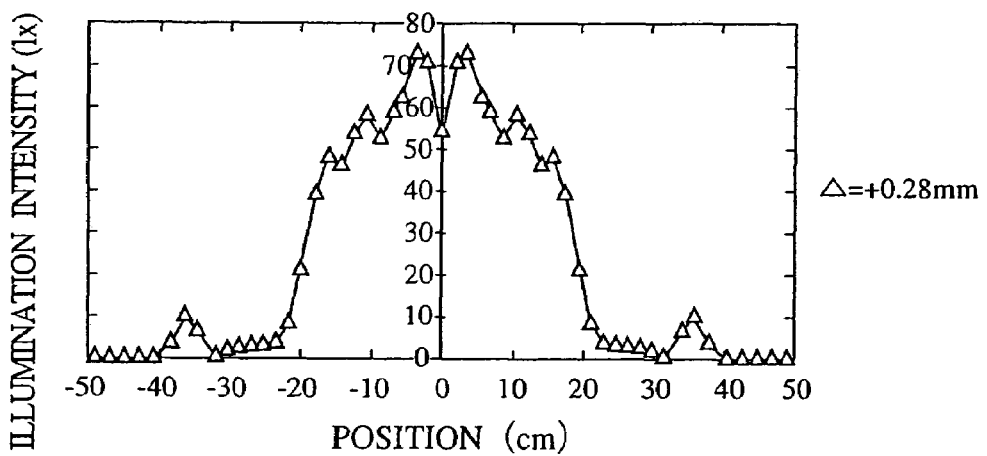
Figure 9C:
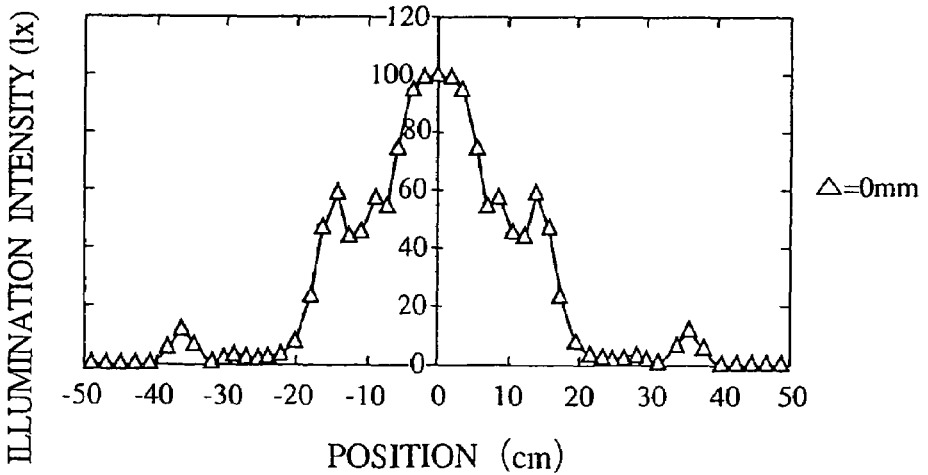
Figure 10A:
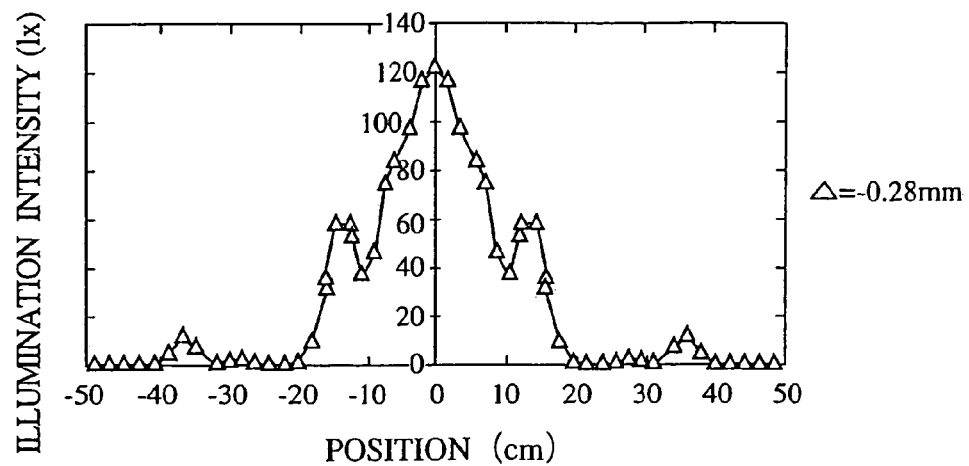
FIGS. 10A to 10C show relationships between the protruding heights A implemented by the first lens surfaces and the corresponding beam intensity profiles, respectively.
Figure 10B:
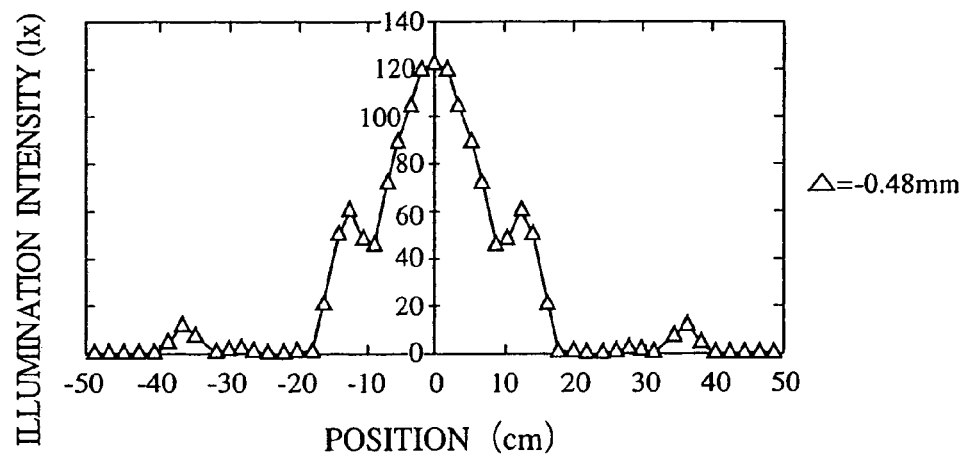
Figure 10C:
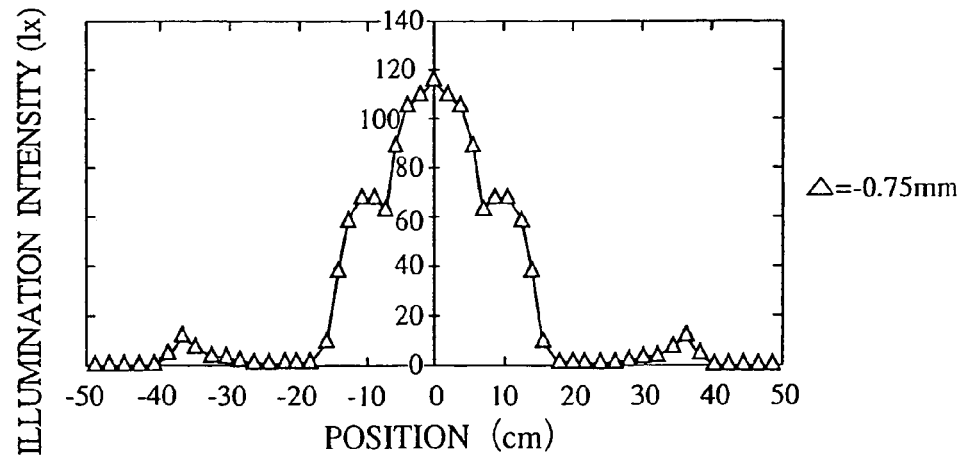

From the results shown in FIG. 5, with radius R of curvature of the second lens surface (the second curved surface) 3 and overall length L of the bulk-shaped lens, to improve the condensing efficiency, it is found that it should satisfy:

$$0.93 < k(R/L) < 1.06 \qquad (2)$$

$$k = 1/(0.35 \cdot n - 0.168) \qquad (3)$$

where, n is a refractive index of the bulk-shaped lens. In addition, radius Ro of the cylinder geometry region of the bulk-shaped lens 20 does not have to be always equal to radius R of curvature of the second curved surface. FIG. 6 is a list showing the geometrical configurations of respective bulk-shaped lenses shown in FIG. 5, namely, radius R of curvature of the second curved surface, overall length L of the bulk-shaped lens, distance D between the first and second lens surfaces, inside diameter r of the storing cavity 6, and protruding height Δ implemented by the first lens surface. Here, "the protruding height Δ implemented by the first lens surface" is the pushing out quantity of the convex part (the first curved surface), as defined in FIG. 7. In addition, FIG. 7 is a schematic cross-sectional view showing a light-emitting unit related to a modification of the first embodiment of the present invention. Bulk-shaped lens 20 shown in FIG. 1 had the first concave-shaped lens surface and the second convex-shaped lens surface. However, FIG. 1 is an example, and the first and second lens surfaces can accept various kinds of topologies depending on purposes, and the protruding height Δ implemented by the first lens surface can take positive or negative value. In addition, even Δ=0 can be employed. Here, the positive direction of Δ is defined as the convex-shaped case, namely the positive direction corresponds to the topology of the first lens surfaces shown in FIG. 7.

Figure 11:
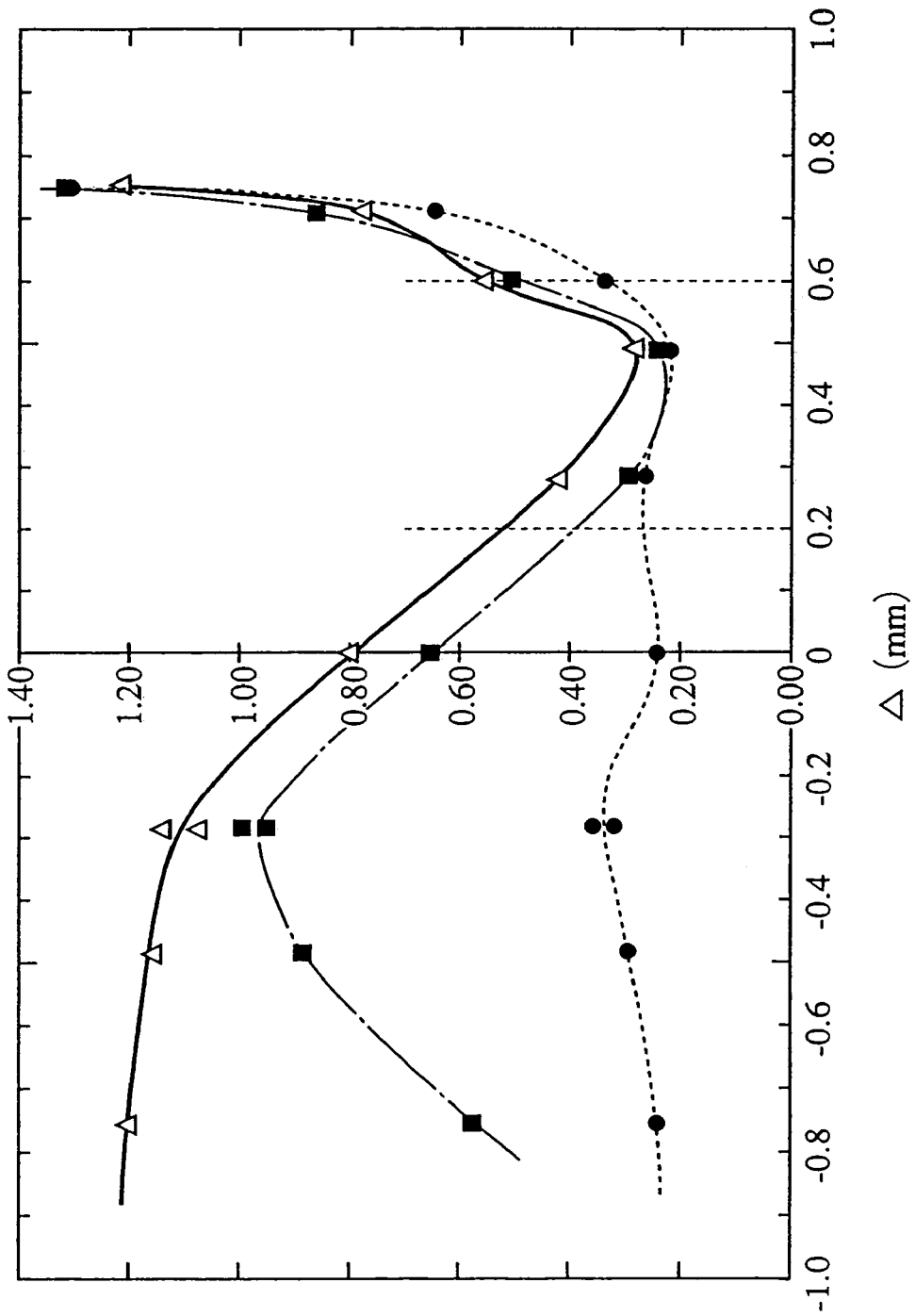
FIG. 11 is a diagram showing relationships between the protruding heights Δ implemented by the first lens surfaces and the corresponding flatness of the illumination intensity profiles, respectively.

FIGS. 8A-8C, FIGS. 9A-9C and FIGS. 10A-10C show the relationships between the protruding heights Δ of the convex portions defined in FIG. 7 and the beam intensity profiles, respectively. Outside diameter Ro of the cylinder geometry portion of the bulk-shaped lens 20 used for measurement is 15 mm, overall length L of the bulk-shaped lens is 25 mm, distance D between the first and second lens surfaces is 16 mm, inside radius r of the storing cavity 6 is 5.2 mm, refractive index n of a bulk-shaped lens is 1.54. Radius R of curvature of the second lens surface of this bulk-shaped lens is 8.25 mm. In addition, a contour of resin molded LED 1 used for measurement is 5 mm. And FIG. 11 shows relationships between the flatness of the illumination intensity profiles and the protruding heights Δ of the convex portions, obtained by the results of FIGS. 8A-8C, FIGS. 9A-9 and FIGS. 10A-10C in the irradiation areas defined by ±15 cm at the measuring distance of 1 m. Here, the flatness of the illumination intensity is defined by:

$$((\text{maximum}) - (\text{minimum}))/(\text{mean value}) \qquad (4)$$

In the case that outside diameter 2Ro=15 mm of the bulk-shaped lens 20, it is found that it is preferable to improve the flatness of the illumination intensity profile:

$$0.2 \text{ mm} < \Delta < 0.6 \text{ mm} \qquad (5)$$

More generally, it is preferable to assume:

$$0.025 < \Delta/\text{Ro} < 0.075 \qquad (6)$$

A transparent material having the first refractive index $n_1$, such as epoxy resin, molds the LED 1 of the first embodiment of the present invention. And the bulk-shaped lens 20 installs the LED 1 through air, having the second refractive index $n_0$, which is different from the first refractive index $n_1$.

The LED 1 may be installed in the storing cavity 6 with fluid or liquid material aside from air. Various kinds of "fluid" can be employed, if it is the gas or liquid, which is transparent to wavelength of light emitted from the LED 1. Spacer oil can be used between the LED 1 and the storing cavity 6 of the bulk-shaped lens 20. In addition, as "the liquid material", transparent materials of various kinds such as sol-like, colloid-like or gel-like materials can be employed. In addition, it is preferable that the bulk-shaped lens 20 has a third refractive index $n_2$ different from the second refractive index $n_0$. The light from the LED chip 13 can be scattered or converged by choosing the first refractive index $n_1$, the second refractive index $n_0$ and the third refractive index $n_2$ so that each has the optimum value. And the optical path may be designed such that the third refractive index $n_2$ manifested by the optical transmission medium of the bulk-shaped lens 20 is gradually increasing or decreasing. In this way, according to the light-emitting unit of the first embodiment of the present invention, desired light flux to required irradiation area is achieved, as the light beam contributing to lighting, without employing a large number of the resin molded LEDs 1, and desired illumination intensity can be easily obtained. This illumination intensity cannot be achieved by the optical system of the earlier known optical lenses. Surprisingly, only single LED realized the illumination intensity implemented by the commercially available flashlight using the halogen lamp. In this way, according to the light-emitting unit of the first embodiment of the present invention, the illumination intensity that cannot be predicted at all can be realized in the simple configuration as shown in FIG. 1.

In addition, as resin molded LED 1 to be used in the light-emitting unit of the first embodiment of the present invention, any LED of various kinds of color (wavelength) can be employed. But, for lighting purpose such as a flashlight, white LED is preferred, because it is natural to a human eye. As to the white LED, various kinds of configuration can be employed. For example, three pieces of LED chips including the red (R) green (G) and blue (B) chips can be stacked vertically so as to compose the white LED (cf. FIG. 24). In this case, from the resin mold 14, corresponding to the respective LED tips of different colors, totally six pins can be extracted. As inside electric wirings of the resin mold 14, six pins may be merged into two pins, so as to assemble the LED in a configuration having two external pins. In addition, the number of the external pins become four, when one electrode (earth electrode) is elected to be common. In addition, if the drive voltages of three pieces of LED chip, consisting of red (R) color, green (G) color and blue (B) color chips are controlled mutually independently, mixing of every color is possible, so that changes of tone of color can be enjoyed.

As the bulk-shaped lens 20 to be employed in the light-emitting unit of the first embodiment of the present invention, transparent plastic materials such as acryl resin or various kinds of glass materials such as quartz glass, soda-lime glass, borosilicate glass, lead glass can be employed. Or crystalline materials such as ZnO, ZnS, SiC may be used. In addition, even materials having pliability, flexibility and elasticity such as, for example, sol, gel, sol-gel mixture or transparence elastomer can be employed. In addition, it may be used in configurations such that sol, gel, sol-gel mixture are stored in container made of a transparent elastomer or a flexible transparent plastic material. Among them, transparent plastic materials such as, acryl resin is material to be preferable for mass-producing the large number of the bulk-shaped lens 20. That is to say, if die is made once, the large number of the bulk-shaped lenses 20 are molded simultaneously using this die, and the bulk-shaped lens 20 are easily mass produced.

Second Embodiment

Figure 12:
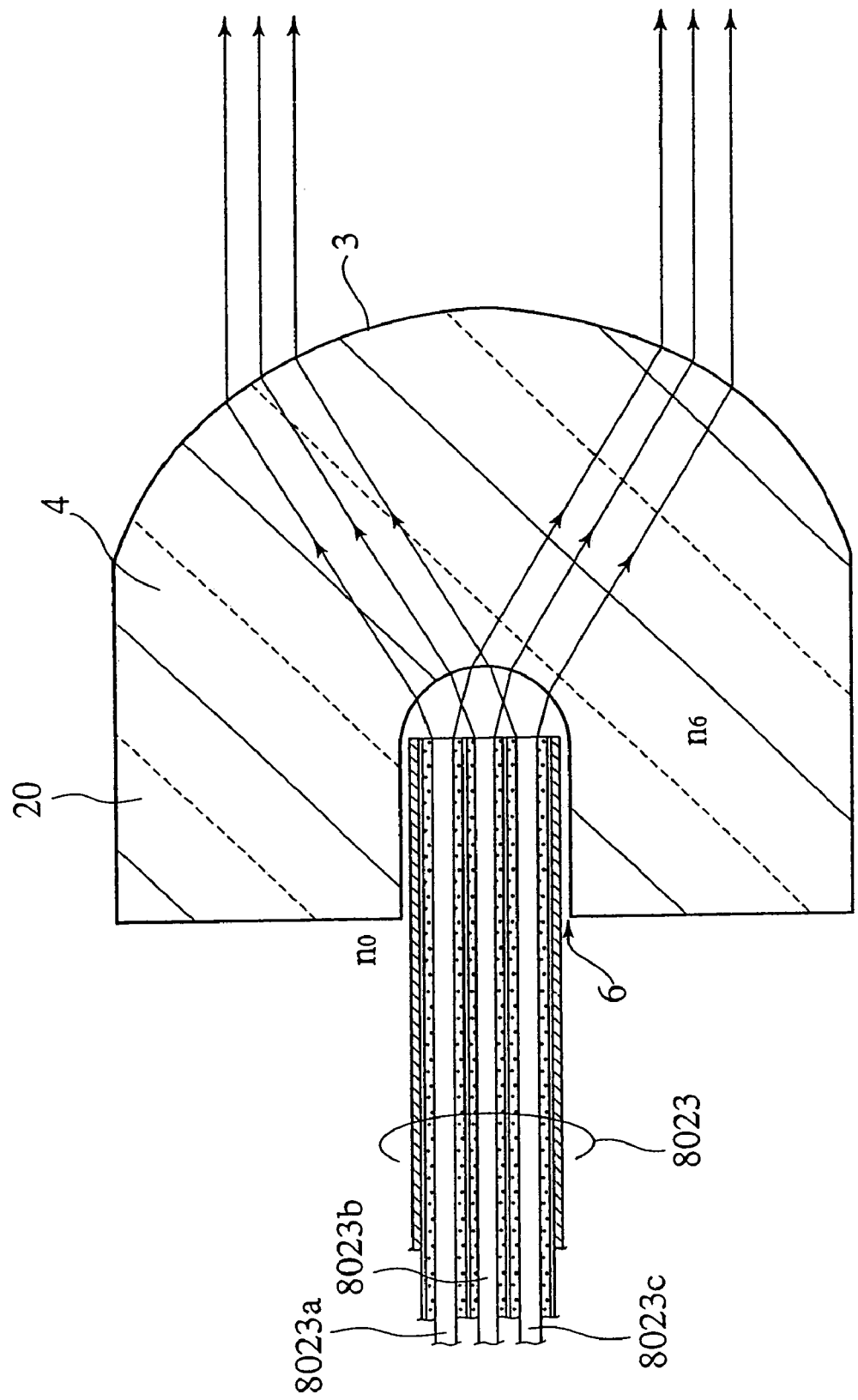
FIG. 12 is a schematic cross-sectional view showing a light-emitting unit according to a second embodiment of the present invention.

As shown in FIG. 12, a light-emitting unit of the first embodiment of the present invention encompasses a main luminescence portion 8023 of light source, emitting light of predetermined wavelength, and a bulk-shaped lens 20 encapsulating nearly completely the main luminescence portion 8023 of light source. And, the bulk-shaped lens 20 encompasses a bulk-shaped lens body 4 having a top surface 3, bottom surface and a contour surface, and a well-shaped concavity 6 implemented in the inside of lens body 4, dug toward top surface 3 from the bottom surface. A ceiling surface of concavity 6, arranged in an interior of the lens body 4, serves as a first lens surface (an entrance surface) 2, a top surface of a lens body serves as a second lens surface (an exit surface) 3, and inside of concavity serves as a storing cavity 6 of light source 1. Here, "the main luminescence portion of light source" is an edge of optical fiber bundle 8023, each fiber having a transmission portion made of a transparent material having the first refractive index.

Optical fiber bundle 8023 shown in FIG. 12 merges plural optical fibers 8023a, 8023b, 8023c, . . . . Lights from plural optical fibers 8023a, 8023b, 8023c, . . . . emit in predetermined divergence angle to right direction of FIG. 12. Configuration of respective plural optical fibers 8023a, 8023b, 8023c, . . . , composing optical fiber bundle 8023, may have straight geometry or twisting topology may be added to the straight geometry. In addition, even a single optical fiber rather than optical fiber bundle 8023 can be employed, of course.

For example, contour of the optical fiber bundle 8023 may be a cylinder having a diameter (an outside diameter) 4-5 mm$^\Phi$. The side wall portion of the storing cavity 6 of the bulk-shaped lens 20 is implemented with a cylindrical geometry of diameter (inside diameter) 4.5-6 mm$^\Phi$ so that it can install the edge of optical fiber bundle 8023. Although the illustration is omitted, between the storing cavity 6 of optical fiber bundle 8023 and the optical fiber bundle, a spacer of thickness around 0.25-0.5 mm is interposed in order to fix the LED 1 and the optical fiber bundle. The bulk-shaped lens 20 has cylinder geometry, apart from the top surface serving as the exit surface 3, the top surface being identified by the convex-shaped second curved surface. Diameter of cylinder geometry portion of the optical fiber bundle (an outside diameter) is 10-30 mm$^\Phi$. Diameter of the optical fiber bundle (an outside diameter) can be chosen depending on purposes of the light-emitting units of the second embodiment of the present invention. Therefore, it can be less than 10 mm$^\Phi$, and even more than 30 mm$^\Phi$.

The optical fiber bundle 8023 of the second embodiment of the present invention embraces a plurality of optical fibers 8023a, 8023b, 8023c . . . , each having clad layer with the first refractive index $n_1$. And the bulk-shaped lens 20 installs the edge of the optical fiber bundle 8023, through air having second refractive index $n_0$, which is different from the first refractive index $n_1$. The edge of the optical fiber bundle 8023 may be installed in the storing cavity 6 though a fluid or liquid material aside from air. In addition, the lens body 4 may have third refractive index $n_6$ different from the second refractive index $n_0$. And it can scatter or converge the light from the edge of the optical fiber bundle 8023, by choosing the optimum values of the first refractive index $n_1$, the second refractive index $n_0$, and the third refractive index $n_6$, respectively. In addition, optical paths may be designed by setting the value of the third refractive index $n_6$ of the lens body 4 such that it is increasing or decreasing gradually.

In the second embodiment of the present invention, component of light reflected back in multiple reflections at each of interfaces between the edge of the optical fiber bundle 8023 and the storing cavity 6 of the optical fiber bundle becomes stray light component. By an optical system of the earlier known optical lenses, these stray light components cannot be extracted such that it can contribute to lighting. However, because these stray light components are confined in the inside of the storing cavity 6 in the second embodiment of the present invention, it becomes the components, which can contribute to lighting finally. In this case, it is preferable to choose a geometrical configuration of the optical fiber bundle such that the already described Eqs. (1)-(3) or Eq. (6) are satisfied.

In this way, according to the light-emitting unit of the second embodiment of the present invention, we can choose desired irradiation area freely as the light beam contributing to lighting so that the illumination intensity desired can be easily obtained.

Light source to input predetermined light to the other end portion of the optical fiber bundle 8023 of the second embodiment of the present invention is not always limited to the semiconductor light-emitting element. Because even if it is the light from an incandescent lamp, the edge of the optical fiber bundle 8023 installed in the inside of the storing cavity 6 of the optical fiber bundle can be held at low temperature. Therefore, if light source other than the semiconductor light-emitting element is used, because limiting of the light flux, prescribed by the output of LED, as in the light-emitting unit of the first embodiment of the present invention, can be removed, and an extremely bright lighting system can be realized.

The geometry of the edge of the optical fiber bundle 8023 is not limited to the topology shown in the drawings, of course.

Third Embodiment

Figure 13:
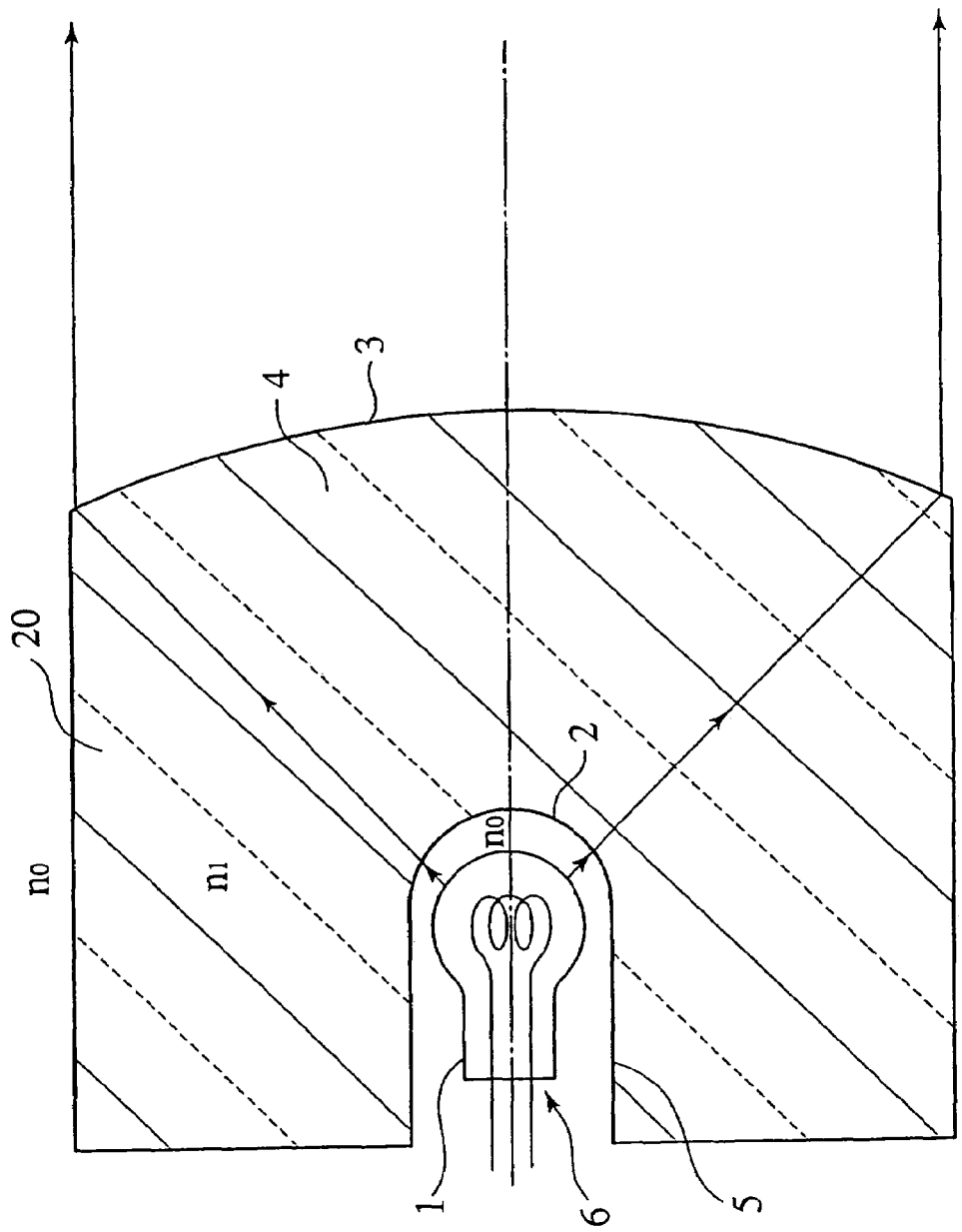
FIG. 13 is a schematic cross-sectional view showing a light-emitting unit according to a third embodiment of the present invention.

FIG. 13 is a schematic cross-sectional view showing a light-emitting unit of the third embodiment of the present invention. As shown in FIG. 13, the light-emitting unit of the third embodiment of the present invention embraces at least composed a light source 1 emitting light of predetermined wavelength and a bulk-shaped lens 20 encapsulating the light source 1 by nearly completely. And the bulk-shaped lens 20 encompasses a bulk-shaped lens body 4 identified by a top surface 3, a bottom surface and a contour surface and a well-shaped concavity 6 implemented in the inside of the lens body 4, dug toward the top surface 3 from the bottom surface. A ceiling surface of the concavity 6 serves as a first lens surface (an entrance surface) 2, a top surface of the lens body serves as a second lens surface (an exit surface) 3, inside of the concavity serves as a storing cavity 6 of the light source 1.

For example, as the light source 1, iodine ($I_2$)-tungsten lamp (halogen lamp) of diameter (outside diameter) 2-3 mm$_{100}$ measured at the greatest portion, namely an incandescent lamp with a miniature lamp geometry, can be employed. The cross sectional geometry of the bulk-shaped lens 20 is a bullet-shape as shown in FIG. 13. The concavity side wall 5 of the concavity 6 of the bulk-shaped lens 20 has a cylindrical geometry of diameter (inside diameter) 2.5-4 mm$^\Phi$ such that it can install the main luminescence portion of light source (an incandescent lamp) 1. Although the illustration is omitted, between socket portion of the light source 1 and the concavity 6 of the bulk-shaped lens 20, a spacer of thickness around 1-2.5 mm is interposed in order to fix the light source 1 and the bulk-shaped lens 20 (In FIG. 13, left side portion of the light source 1 corresponding to electrode-leads is called "socket part".) Diameter (outside diameter) of a cylinder shape portion of the bulk-shaped lens 20 of a bullet-shape can be chosen depending on purposes of the light-emitting unit of the third embodiment of the present invention. Therefore, it can be less than 10 mm$^\Phi$, and even more than 30 mm$^\Phi$. But, it is preferable to choose a geometrical configuration of the bulk-shaped lens 20 such that it satisfies the already described Eqs. (1)-(3) or Eq. (6), of course. In addition, the bulk-shaped lens 20 of the third embodiment of the present invention has different refractive index $n_1$ from refractive index $n_0$ of air.

In FIG. 13, concavity sidewall 5 of the concavity 6 aside from the entrance surface 2 (the ceiling surface) can serve as an entrance surface of effective light. Component of lights reflected back in each interfaces do multiple reflections between the concavity 6 of the light source 1 and the bulk-shaped lens 20 become stray light components. By an optical system of the earlier known optical lenses, these stray light components cannot be extracted so as to contribute to lighting. However, because these stray light components beings confined in the inside of the concavity 6 in the third embodiment of the present invention, they become the components which can contribute to lighting finally. In this way, in the third embodiment of the present invention, because the light source 1 is confined nearly completely in the concavity 6 of the bulk-shaped lens 20, including stray light components emitted from the light source 1, all output lights can effectively contribute to lighting.

In this way, according to the light-emitting unit of the third embodiment of the present invention, without needing large number of light source, desired light flux at irradiation area is obtained as light beam contributing to lighting, and desired illumination intensity can be easily achieved. This illumination intensity cannot be achieved by an optical system of the earlier known optical lenses. In this way, according to the light-emitting unit of the third embodiment of the present invention, the illumination intensity which cannot be predicted at all by earlier technical common sense can be achieved in the simple configuration as shown in FIG. 13. As is apparent from the comparison between FIG. 2A and FIG. 2B, in order to obtain the focusing property of same level of the present invention, in the case using an earlier convex lens, even the convex lens having diameter two times larger than the cylinder portion diameter of the bulk-shaped lens of the present invention 20 is insufficient, and parallelism of the beam is not provided with the convex lens having diameter around three times larger either. That is to say, it can be concluded that miniaturization more than ⅓ is achieved.

When, as materials of the bulk-shaped lens 20 for the light-emitting unit of the third embodiment of the present invention, in view of the generation of heat by the light source (incandescent lamp) 1, a heat-resisting optical material is preferred. As the heat-resisting optical materials, heat-resisting glass such as quartz glass, sapphire glass are preferable. Or, heat-resisting optical materials of heat-resisting resins such as a polysulfone resin, a polyethersulfone resin, a polycarbonate resin, a polyeter ester amide resin, methacrylic resin, an amorphous polyolefin resin, polymeric materials having perfluoroalkyl radix can be employed.

Even a crystalline material of SiC is preferable. In addition, because generation of heat is not accompanied, when a semiconductor light-emitting element such as an LED is used as the light source 1, we can employ weak heat-resisting resin such as acryl resin.

Fourth Embodiment

By the way, a high-insulating sapphire substrate is used as epitaxial growth substrate of GaN, GaN is generally known as a material of blue LED. Because of this high-insulating sapphire substrate, the anode and cathode electrodes of GaN blue LED are usually extracted together to the front face side of the GaN epitaxial growth layer. Because this sapphire substrate is transparent to wavelength of blue LED, depending on the configurations of packages for the blue LEDs, luminescence from the blue LED can be extract from the rear surface direction of the substrate (FIG. 13, right direction). However, in the light-emitting unit of above mentioned embodiments of the present invention such as shown in FIG. 13, the configuration so as to take advantage of luminescence from the rear surface direction of substrate (the right direction) was not considered positively.

Figure 14A:
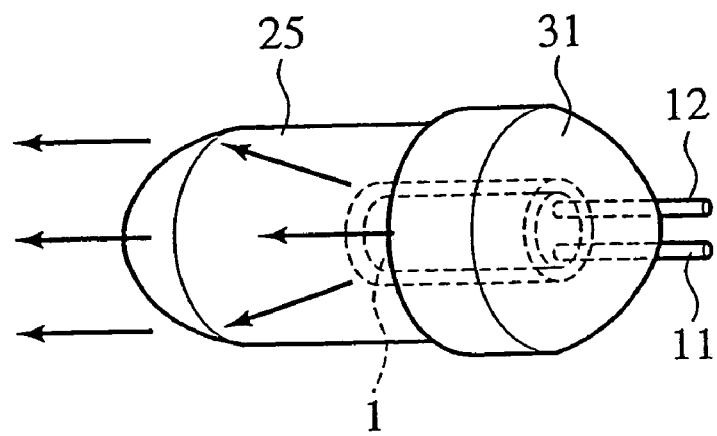
FIG. 14A is a bird's-eye view showing a light-emitting unit according to a fourth embodiment of the present invention.
Figure 14B:
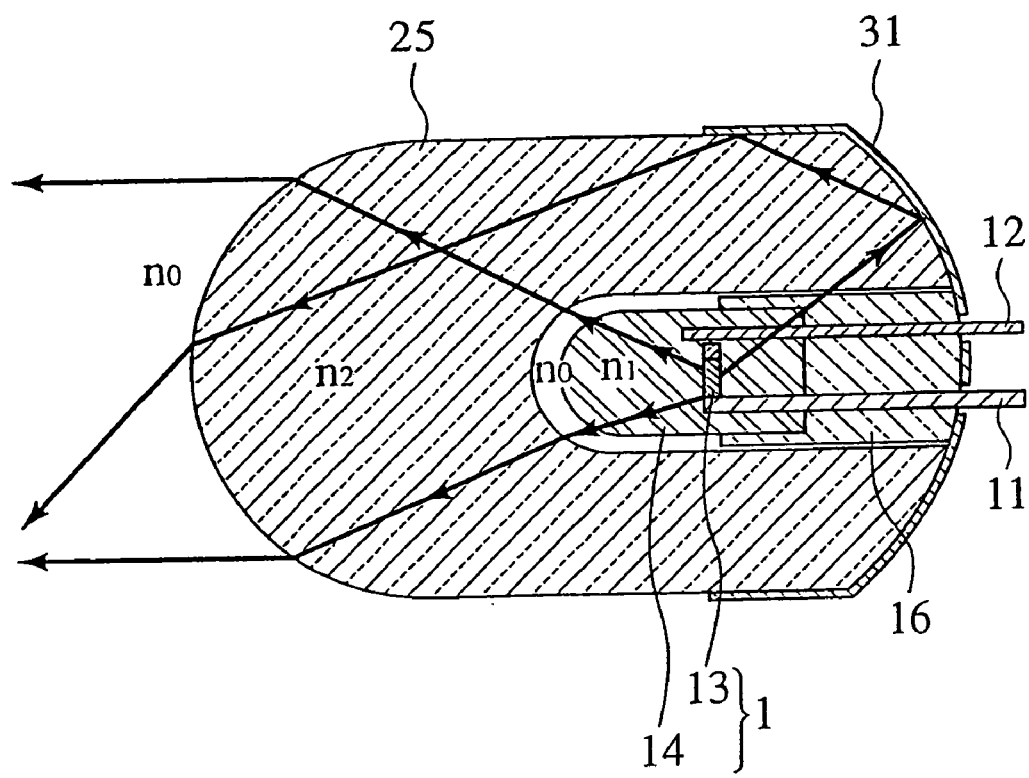
FIG. 14B is a schematic cross-sectional view showing the light-emitting unit of the fourth embodiment of the present invention.

As shown in FIGS. 14A and 14B, a light-emitting unit of the fourth embodiment of the present invention embraces a semiconductor light-emitting element 1 and a bulk-shaped lens 25. And, this bulk-shaped lens 25 encompasses a bulk-shaped lens body 4 having a top surface 3, a bottom surface facing to the top surface and a contour surface and a well-shaped concavity 6 implemented in the inside of the lens body 4, the concavity 6 being dug toward the top surface 3 from the bottom surface. A ceiling surface of the concavity 6 arranged at an interior of the lens body 4 serves as a first lens surface (an entrance surface) 2, a top surface of a lens body serves as a second lens surface (an exit surface) 3, inside of the concavity serves as a storing cavity 6 of light source 1. And, at bottom surface of the lens body 4, a back mirror 31 is formed. The back mirror 31 is extended to a part of the contour surface of bulk-shaped lens 25. In FIGS. 14A and 14B, although the back mirror 31 covers a part of the contour surface of bulk-shaped lens 25, it may be possible to cover almost entire surface of the contour surface of the bulk-shaped lens 25. The back mirror 31 may be shaped by lathe/milling machine using metal such as Al, brass, stainless into geometry shown in FIGS. 14A and 14B, or it may be molded by press working machines, and after that the face is polished. Furthermore, it is preferable that nickel (Ni) plating and gold (Au) plating are given to these surfaces, because reflectivity can be improved. As a low cost and simple manner, the configuration in which a high reflectivity metallic thin film such as Al thin film is bonded to the contour surface of the bulk-shaped lens can be employed. Or, the configuration in which thermoplastic is processed into the geometry shown in FIGS. 14A and 14B by extrusion or injection molding, and the metallic thin film having high reflectivity such as Al foil, or dielectric multi-layer films is deposited on the surface by vacuum evaporation or sputtering, or even the configuration in which the high reflectivity polyester white film is adhesively bonded on the surface can be employed. Furthermore, configuration in which the high reflectivity metallic thin film or the dielectric multilayer films is directly deposited on the bottom surface of the bulk-shaped lens 25 by vacuum evaporation or sputtering, the configuration in which the high reflectivity metallic thin film is plated, or the configuration in which these composite films are deposited can implement the back mirror 31. In this case, thin film of various kinds of thickness of 50 nm to 20 μm level can be employed as the back mirror 31.

The semiconductor light-emitting element 1 shown in FIGS. 14A and 4B is a molded LED 1, which embraces, a first pin 11, an LED chip 13 inserted in a hollow portion of a pedestal ring connected to the first pin 11, the LED chip 13 is fixed at the edge, a resin mold 14 encapsulating the LED chip 13, and a second pin 12 facing to the first pin 11. In the back mirror 31, holes are opened so as to penetrate the first pin 11 and the second pin 12, configured such that the back mirror 31 does not cause the electrical short-circuit failure between the first pin 11 and the second pin 12. Because the central portion of the pedestal ring connected to the first pin 11 is hollow, the LED chip 13 can execute the double sided luminescence oparatin, in which the luminescences are extracted from both front and rear surfaces of the LED chip 13 (in FIGS. 14A and 14B, the luminescence from the rear surface emits to the right direction). A pedestal ring is not required to have the configuration in which the ring is completely closed, and even the ring having topology not closing, such as C-shape, U-shape, can be employed. The important thing is, any configuration, which can fix a part of the end surface of LED chip 13, can be employed. A top surface of this molded LED 1 has a convex-shaped curved surface as shown in FIGS. 14A and 14B. The vicinity of the top surface of resin mold 14 has a convex-shaped curved surface in this way, and light outputting in the left direction (front side direction) from the LED chip 13 has directivity in predetermined divergence angle. On the other hand, light emitted to the right direction (the rear surface side direction) from the LED chip 13 is reflected back at the back mirror 31, and output from the front surface of LED chip 13 to the left direction. After all, to the light output to the right direction of LED chip 13 (rear surface side direction), a predetermined divergence angle is given by a curved surface, or the convex-shaped top surface.

Figure 15:
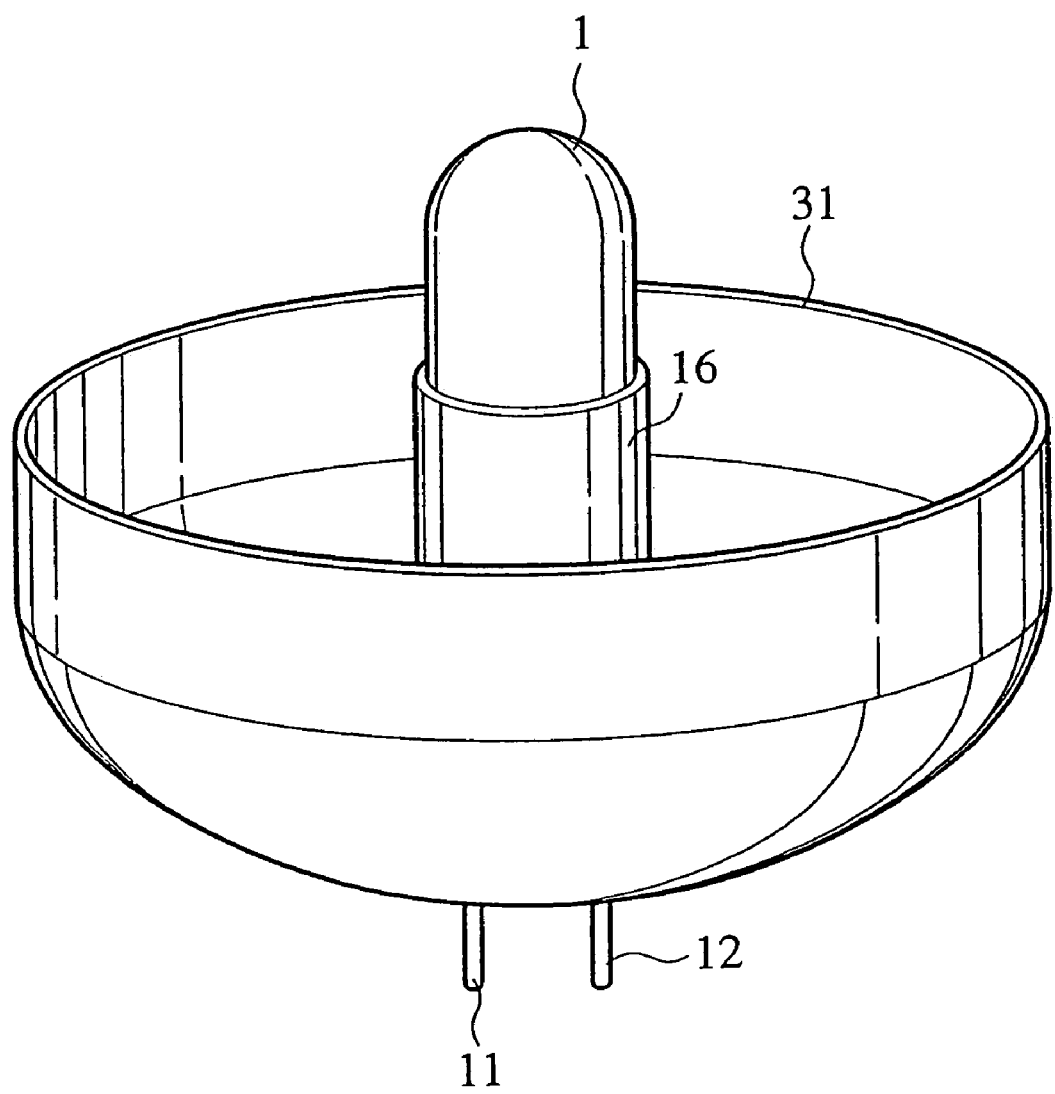
FIG. 15 is a bird's-eye view showing a back mirror and a LED holder of the light-emitting unit of the fourth embodiment of the present invention.

For example, apart from the convex-shaped curved surface, the molded LED 1 is a cylinder configuration having diameter (outside diameter) 2-3 mm$^\Phi$. A side wall portion of the concavity of bulk-shaped lens 25 is identified by a cylindrical geometry having diameter (inside diameter) 2.5-4 mm$^\Phi$ so that it can install the molded LED 1. As shown in FIG. 14B and FIG. 15, the molded LED 1 is fixed to the LED holder 16, the head of the LED holder having a cup geometry, through the LED holder 16, the molded LED 1 and the bulk-shaped lens 25 are fixed each other. The LED holder 16 may be made of optically transparent material, having high electrical isolation property. For example, wall thickness of the LED holder 16, at the part of the cup geometry located between the molded LED 1 and the concavity of the bulk-shaped lens 25 is around 0.25-0.5 mm. And the bulk-shaped lens 25 has almost similar cylinder configuration as that of the molded LED 1. Diameter (outside diameter) of cylinder geometry portion of the bulk-shaped lens 25 is 10-30 mm$^\Phi$. Diameter (outside diameter) of the bulk-shaped lens 25 can be chosen depending on purposes of the light-emitting unit of the fourth embodiment of the present invention. Therefore, it can be less than 10 mm$^\Phi$, and even more than 30 mm$^\Phi$. But, it is preferable to choose the geometrical configuration of the bulk-shaped lens 20 such that it satisfies the already described Eqs. (1)-(3) or Eq. (6), of course.

The LED holder 16 can be made into a single piece with the back mirror 31 as shown in FIG. 15, for example, and if the molded LED 1 is inserted in this back mirror built-in LED holder 16, the assembly process of the light-emitting unit of the fourth embodiment of the present invention can be simplified. In the back mirror built-in LED holder 16 shown in FIG. 15, at the LED holder 16 disposed in a central portion, two through-holes for letting the first pin 11 and the second pin 12 go through are dug. The through-holes continue to the through-holes made in the above-mentioned back mirror 31. And by inserting the first pin 11 and the second pin 12 in these two through-holes, the molded LED 1 is fixed to the LED holder 16. The LED holder 16 can be made of transparent materials such as epoxy resin, having refractive index same as refractive index $n_1$ of the molded LED 1, or can be made of transparent materials having refractive index same as refractive index $n_2$ of the bulk-shaped lens 25. Or it may be made of transparent material having different refractive index from all of refractive index $n_1$ and refractive index $n_2$. At all events, the LED holder 16 can be made of the optical material transparent to wavelength of light emitted from the molded LED 1. As the bulk-shaped lens 25, transparent plastic materials, glass materials, crystalline materials can be employed, and resin of colored or resin including luminescence material can also be employed. Among them, thermoplastics such as acryl resin or polyvinyl chloride resin are preferable materials for mass-producing the bulk-shaped lens 25. That is to say, die is made once, and if this die does extrusion or injection molding, the bulk-shaped lens 25 can easily implemented with mass production.

In a general molded LED, light emitted from a place aside from the convex-shaped curved surface of resin mold 14 does not contribute to lighting, and it becomes so-called stray light components. However, in the fourth embodiment of the present invention, the molded LED 1 is nearly completely confined in the concavity of the bulk-shaped lens 25, and because, in bottom surface of the bulk-shaped lens 25, the back mirror 31 is disposed, all these stray light components can be output from the top surface, serving as the luminescence surface, finally. Therefore, all stray light components contribute to lighting effectively. That is to say, if we pay attention to the concavity, the inner wall portion 5 of the concavity aside from a ceiling surface serves as an entrance surface of effective light, the stray light component which transmitted through the inner wall portion 5 is reflected back at the back mirror 31, and it can be output from the luminescence surface side finally. In addition, components of light reflected back at each interfaces repeat multiple reflections in various directions between the concavity of the molded LED 1 and the bulk-shaped lens 25, such that they become stray light components. By an optical system of the earlier known optical lenses, these stray light components cannot be extracted so as to contribute to lighting. However, these stray light components are confined in the inside of the concavity in the fourth embodiment of the present invention, and they are reflected back at the back mirror 31 in the inside, and are guided to the top surface side which serves as the luminescence surface. As a result, all these stray light components are output finally from the luminescence surface.

As the result, not depended upon the extraction efficiency ascribable to the geometry of the resin mold 14 nor return components between the optical systems, it becomes possible to extract inherent light energy from the LED chip 13, with efficiency approximately equal to internal quantum efficiency.

In this way, according to the light-emitting unit of the fourth embodiment of the present invention, desired light flux at irradiation area is achieved as light beam contributing to lighting, without requiring large number of the molded LED 1, so that desired illumination intensity can be easily obtained. This illumination intensity cannot be achieved by an optical system of the earlier known optical lenses. Therefore, the illumination intensity of the same level as achieved by commercially available slender body flashlight using halogen lamp can be realized with only single LED. In this way, according to the light-emitting unit of the fourth embodiment of the present invention, the illumination intensity which cannot be predicted at all by earlier technical common sense can be realized by simple configuration as shown in FIGS. 14A and 14B.

In addition, when three pieces of LED chips including the red (R), green (G) and blue (B) chips were stacked, by adjusting each emission intensities of lights from red (R) green (G) and blue (B) chips, and by mixing them, all color in visible light band spectrum can be generated. In this case, actually, there may be the case that color phase irregularity occurs by dispersion on manufacturing process, but, by reflecting back each of lights emitted from red (R) green (G) and blue (B) LED chips at the back mirror 31, and by mixing them so that we can take balance of every color, the technical advantage that we can cancel the color phase irregularity is achieved.

Fifth Embodiment

Figure 16A:
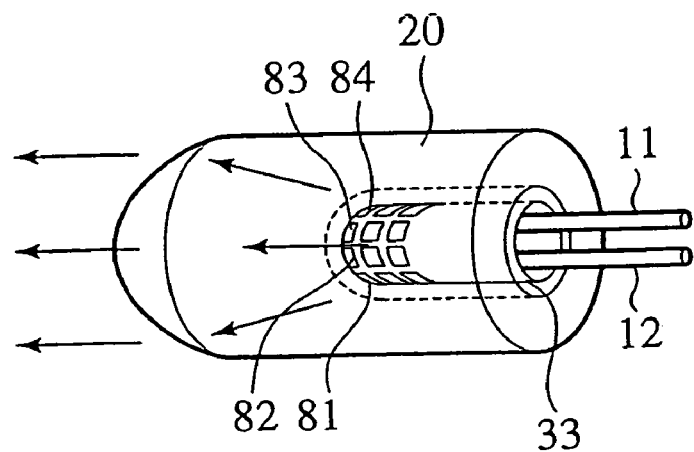
FIG. 16A is a bird's-eye view of a chart showing a light-emitting unit of a fifth embodiment of the present invention.
Figure 16B:
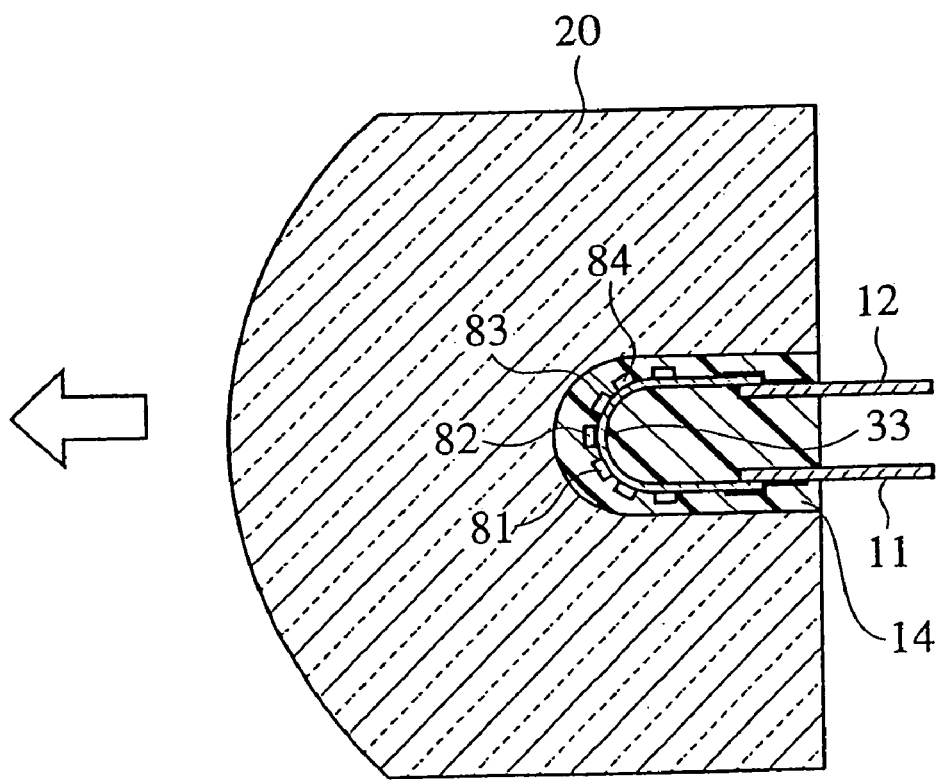
FIG. 16B shows a schematic cross-sectional view of the light-emitting unit of the fifth embodiment of the present invention.

FIG. 16A shows a schematic bird's eye view of a light-emitting unit of the fifth embodiment of the present invention, and FIG. 16B shows corresponding cross-sectional view. As shown in FIGS. 16A and 16B, a light-emitting unit of fifth embodiment of the present invention embraces at least a plurality of diode chips 81,82,83,84, . . . , each emitting light of predetermined wavelength, and a bulk-shaped lens 20 nearly completely installing the plurality of diode chips 81,82,83,84, . . . . To be concrete, diodes chip 81,82,83,84, . . . are molded in disc-shaped packages, respectively (in the following, these LED chips 81,82,83, 84, . . . molded in the disc-shaped packages are called as "the disc-shaped LEDs 81,82,83,84, . . . "). And, the bulk-shaped lens 20 embraces a lens body made of transparent material to wavelength of light emitted from the plurality of diode chips, which is identified by an entrance surface 2, an exit surface 3 emitting the light incident from the entrance surface 2, the transparent material connecting the entrance surface 2 and the exit surface 3. As shown in FIGS. 16A and 16B, the bulk-shaped lens 20 has geometry of a bullet-shape, identified by a contour surface of cylinder and a top surface of hemispheric. Furthermore, the bullet-shaped bulk-shaped lens 20 has a concavity, installing the disc-shaped LEDs 81,82,83,84, . . . . This concavity is identified by a entrance surface 2 and a sidewall portion formed in succession with the entrance surface 2. That is to say, the ceiling surface of the concavity serves as the entrance surface 2. In FIGS. 16A and 16B, the concavity is identified by a bullet-shaped geometry, defined by a cylinder-shaped contour surface and a hemispheric ceiling surface. Inside diameter of the cylinder defining the contour surface of the concavity may be around 2 mm-6.5 mm. On the other hand, outside diameter of the cylinder defining the contour surface of the bulk-shaped lens 20 can be chosen around 10 mm-50 mm. Difference between outside diameter 2Ro of the cylinder defining the contour surface of the bulk-shaped lens 20 and inside diameter r of the cylinder defining the contour surface of the concavity, or the wall thickness can be chosen such as same level of the inside diameter r of the cylinder defining the contour surface of the concavity, or it can be chosen larger than around two to three times of the inside diameter r. Preferably, the geometrical configuration of the bulk-shaped lens 20 should satisfy the already described Eqs. (1)-(3) or Eq. (6).

Figure 17A:
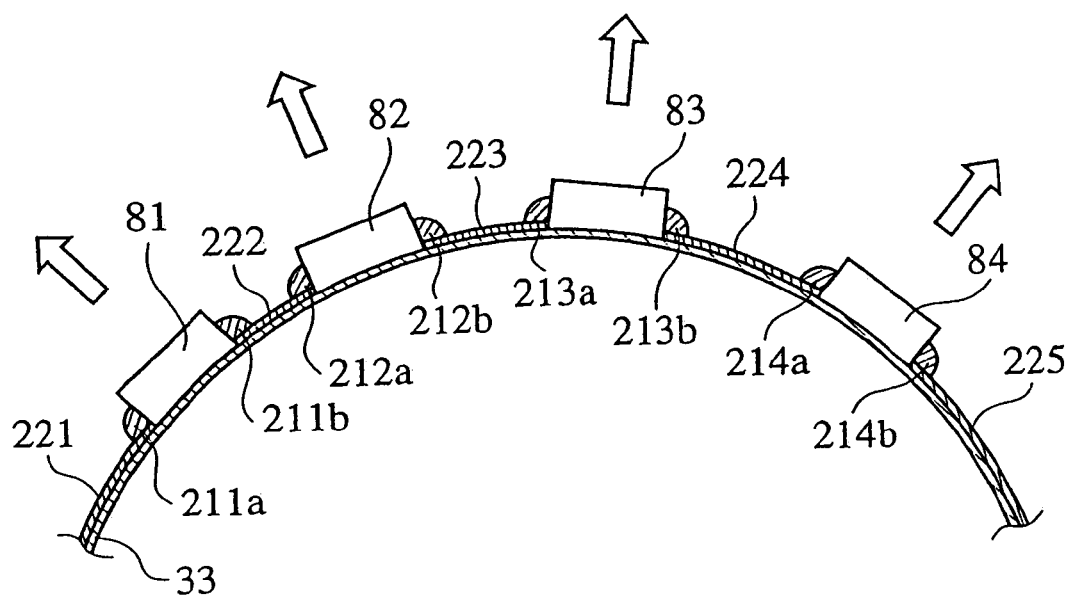
FIG. 17A is a schematic cross-sectional view of the light-emitting unit of the fifth embodiment of the present invention, showing a detailed configuration in which a plurality of disk-shaped LEDs are disposed on a film-like substrate.
Figure 17B:
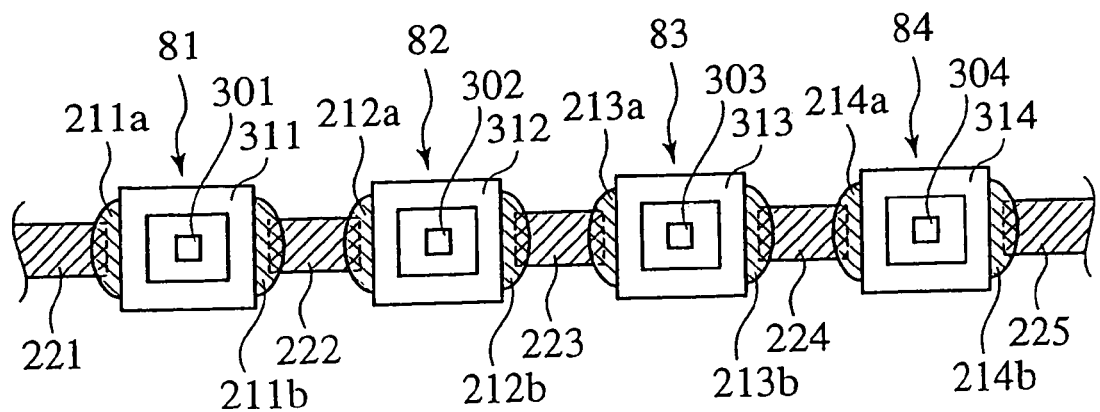
FIG. 17B shows a top plan view corresponding to FIG. 17A.

In FIGS. 16A and 16B, the plural disc-shaped LEDs 81,82,83,84, . . . are disposed on a film substrate 33, formed in a bullet-shape. In FIGS. 16A and 16B, although it is shown as if there is a gap between the entrance surface 2, corresponding to the ceiling surface of concavity, and the plural disc-shaped LEDs 81,82,83,84, . . . , it is preferable that the plural disc-shaped LEDs 81,82,83,84, . . . are disposed so as to contact with the entrance surface 2, because bright luminescence is obtained by the configuration. The film substrate 33 can be flexible organic materials. For example, thin polyethylene terephthalate (PET) thin film or polyimide film having thickness of 25 µm-50 µm level can be employed as material of the film substrate 33. On the surface of film substrate 33, as shown in FIGS. 17A and 17B, aluminum (Al) interconnections 221,222,223,224,225, . . . having thickness of 5 µm-15 µm level are delineated. Al interconnections 221,222,223, . . . are delineated by etching method, after the Al thin film is deposited on the entire surface of the film substrate 33. The Al interconnections 221,222,223, . . . may be delineated by screen printing method. Then, aperture portions are formed in the Al interconnections 221,222,223, . . . periodically at predetermined points so as to expose the surface of the film substrate 33, by patterning of the Al thin film. These aperture portions serve as rectangular aperture portions for mounting the disc-shaped LEDs 201,202,203, . . . . As shown in FIG. 17B, in respective disc-shaped LEDs 201,202,203, . . . , LED chips 301,302,303,304, . . . are disposed in the inside of corresponding ceramic packages 311,312,313,314, . . . respectively. The disc-shaped LEDs 201,202,203, . . . and the Al interconnections 221,222,223, . . . , are mutually connected by solders 211a, 211b, 212a, 212b, 213a, 213b. And each of two endpoints of Al interconnections 221,222,223, . . . are connected to the first pin 11 and the second pin 12, respectively. As shown in FIG. 16B, plural disc-shaped LEDs 81,82,83,84, . . . are molded in the inside of the concavity implemented in the bulk-shaped lens 20 by resin 14.

In the fifth embodiment of the present invention, because plural disc-shaped LEDs 81,82,83,84, . . . are confined nearly completely in the concavity of the bulk-shaped lens 20, every output light components, including stray light components, emitted from the semiconductor chips become possible to contribute to lighting effectively. That is to say, inner wall portion of the concavity, aside from the entrance surface 2 (the ceiling surface), can serve as the effective entrance surface of light. In addition, components of light reflected back at each interfaces repeats multiple reflections between plural disc-shaped LEDs 81,82,83,84, . . . and the concavity of the bulk-shaped lens 20, so that they become stray light components. By an optical system using the earlier known optical lenses, these stray light components cannot be extracted so as to contribute to lighting. However, because these stray light components beings confined in the inside of the concavity in the fifth embodiment of the present invention, they become the components contributing to lighting finally. As the result, not depended upon extraction efficiency ascribable to geometry of resin mold (plastic seal field) 14 nor return components between optical systems, it becomes possible to extract inherent light energies from plural disc-shaped LEDs 81,82,83,84, . . . so as to achieve efficiency which is approximately equal to internal quantum efficiency.

In this way, according to the light-emitting unit of the fifth embodiment of the present invention, desired light flux at the irradiation area, as light beam contributing to lighting, without requiring large number of disc-shaped LEDs 81,82, 83,84, . . . , is achieved, and desired illumination intensity can be easily obtained as well. This illumination intensity cannot be achieved by optical system of the earlier known optical lenses. In addition, as plural disc-shaped LEDs 81,82,83,84, . . . for the light-emitting unit of the fifth embodiment of the present invention, various kinds of LEDs having various color (wavelength) can be employed. But, for lighting purpose such as for example a flashlight, the white LED is preferred, described in the first embodiment, because the white LED is natural to an eye of human. That is to say, using white LEDs as the plural disc-shaped LEDs 81,82,83, 84, . . . shown in FIGS. 16A and 16B, and if we prepare a battery case and a battery (an AA battery, for example) installed in this battery case so as to apply predetermined voltage to the plural disc-shaped white LEDs 81,82,83, 84, . . . , a slender body flashlight of pen type (portable lighting equipment) is completed. The configuration, in which anode and cathode of this battery are connected to each of electrodes of the plural disc-shaped white LEDs 81,82,83,84, . . . , is preferable. As a result, by the simple configuration, the flashlight (the portable lighting equipment) can be manufactured at low cost. Because it is superior in stability and reliability for a long term, and in particular this flashlight (the portable lighting equipment) dissipates low power, lifetime of battery is long.

As the bulk-shaped lens 20 for the light-emitting unit of the fifth embodiment of the present invention, a glass material, a transparence plastic material, a crystalline material, which are described in the first embodiment, can be employed. Among them, transparent plastic materials such as acryl resin are preferable for materials for the bulk-shaped lens 20, because they are suited for mass production. That is to say, if die is made once, using this die, so as to ease the mass production, we can mold large number of the bulk-shaped lens 20.

Figure 18:
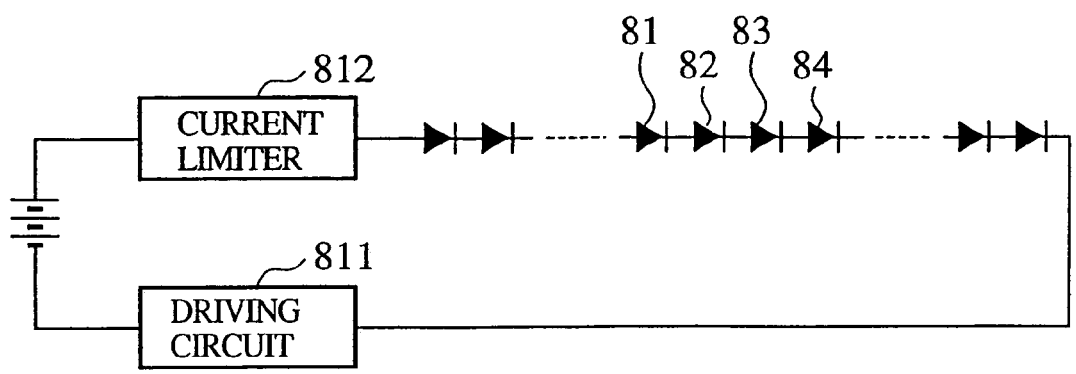
FIG. 18 is a figure showing circuit configuration in which plural disk-shaped LEDs are connected in series.
Figure 19:
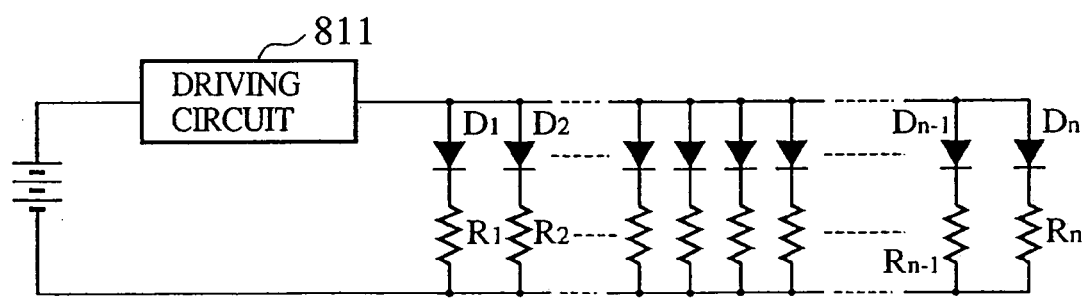
FIG. 19 is a figure showing circuit configuration in which plural disk-shaped LEDs are connected in parallel.

Plural disc-shaped LEDs 81,82,83,84, . . . may be connected in series as shown in FIG. 18, or they may be connected in parallel as shown in FIG. 19. In case of the series connection, it is preferable that a current limiting circuit 812 and a drive circuit 811 are employed to be connected in series so that excess current is limited to flow into the plural disc-shaped LEDs 81,82,83,84, . . . . In case of parallel connection, respective LEDs, or the $D_1$, $D_2$, . . . , $D_{n-1}$, $D_n$, should be connected to corresponding current limiting resistors $R_1$, $R_2$, . . . , $R_{n-1}$, $R_n$ in series, respectively, and the supply voltage is supplied through the drive circuit 811 to respective LEDs.

Figure 20:
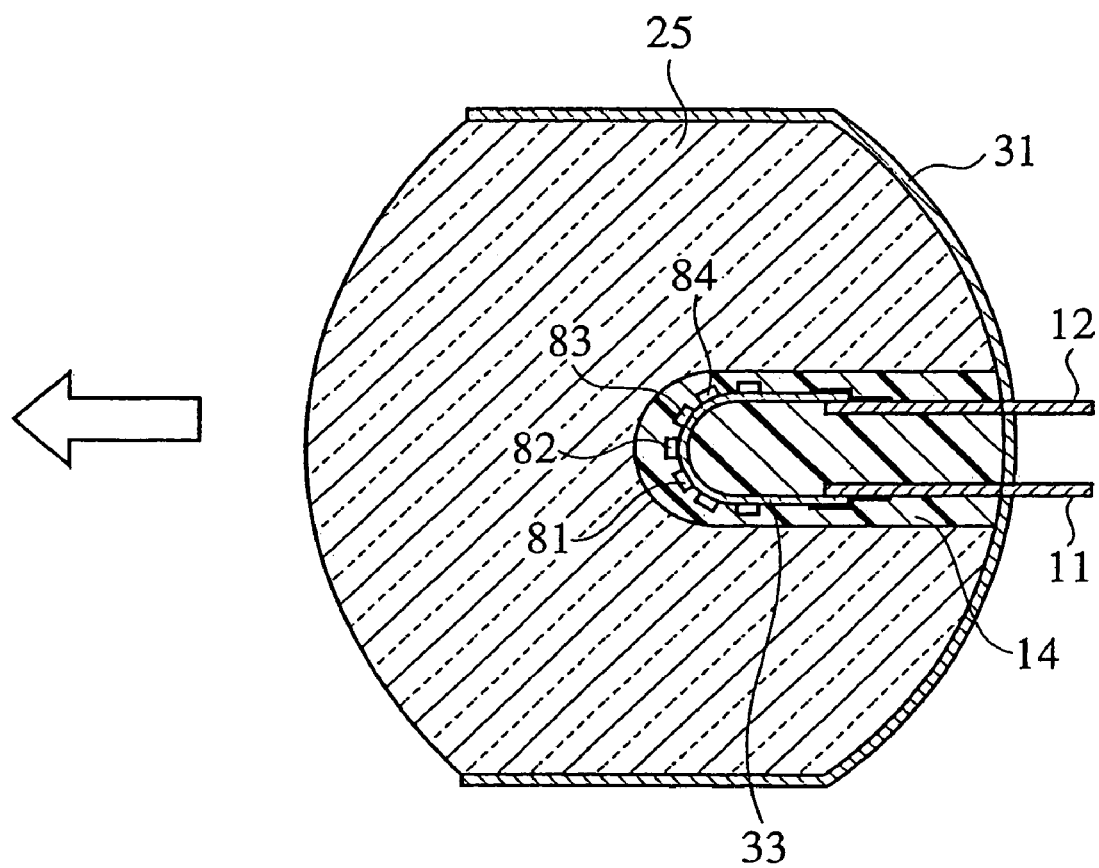
FIG. 20 shows a schematic cross-sectional view of the light-emitting unit according to a modification of the fifth embodiment of the present invention.

A high-insulating sapphire substrate is used as an epitaxial growth substrate of gallium nitride (GaN) based semiconductor material. Because of this insulating substrate, the anode and cathode electrodes of the blue LED is usually extracted together from the front surface side of the epitaxial growth layer of the GaN based semiconductor material. Because this sapphire substrate is transparent to wavelength of blue LED, if design of predetermined optics such as using transparent material at the bottom surface of the disc type package, and mounting the blue LED on the transparent material, luminescence from blue LED can be extracted to the rear surface direction of the substrate. In this case, as shown in FIG. 20, it is preferable to arrange a back mirror 31 at bottom surface of the bulk-shaped lens 25. In FIG. 20, although the back mirror 31 covers almost entirely the contour surface of the bulk-shaped lens 25, only a part of the contour surface of the bulk-shaped lens 25 may be covered, or the formation on the contour surface may be omitted.

Back mirror 31 may be formed by shaping the metal such as Al, brass, stainless using lathe/milling machine etc. to the geometry shown in FIG. 20, or molded by press working machines, and the surface is polished, afterwards. Furthermore, it is preferred, if nickel (Ni) plating and gold (Au) plating are given to the surface so as to improve reflectivity. As a low cost and simple method, the configuration in which metallic thin film of high reflectivity such as Al thin film is bonded to the surface can be employed. Or, the configuration in which thermoplastic may be formed into the geometry shown in FIG. 20, by extrusion or injection molding, and high reflectivity metallic thin film such as the Al foil or high reflectivity dielectric multilayer film may be deposited on the surface by vacuum evaporation or sputtering, or even the configuration in which high reflectivity polyester white film is adhesively bonded on the surface can be employed. Furthermore, the configuration in which the high reflectivity metallic thin film or dielectric multilayer film is directly deposited to the bottom surface of the bulk-shaped lens 25, by vacuum evaporation or sputtering, or the configuration in which composite films embracing these films are deposited on the surface can be employed.

Plural disc-shaped LEDs 81,82,83,84, . . . of FIG. 20 are mount on the film substrate 33, same as shown in FIGS. 17A and 17B, and are connected to the first pin 11 and the second pin 12 by the Al interconnections. In FIG. 20, although it is shown as if there is a gap between the entrance surface 2 identified by the ceiling surface of the concavity and the plural disc-shaped LEDs 81,82,83,84, . . . it is preferable such that these plural disc-shaped LEDs 81,82,83,84, . . . are contacted to the entrance surface 2, so as to obtain bright luminescence. Holes are formed at the back mirror 31 such that the first pin 11 and the second pin 12 can penetrate through the holes, because the configuration, in which the first pin 11 and the second pin 12 are not electrically short-circuited by the back mirror 31, is considered. If we made the film substrate 33, formed into the bullet-shaped, by transparent material, and the resin 14 filled in the inside of the bullet-shaped film substrate 33 is also made by the transparence material, luminescence from plural disc-shaped LEDs 81,82,83,84, . . . propagates to the rear surface direction (in FIG. 20, to the right direction). Lights from the plural disc-shaped LEDs 81,82,83,84, . . . , directing to the right direction (the rear surface side direction) are reflected back at the back mirror 31, and they are output from the front surface of the plural disc-shaped LEDs 81,82,83,84, . . . to the left direction. Lights output to the right direction of the plural disc-shaped LEDs 81,82,83,84, . . . (the rear surface side direction) are, after all, merged into the light which propagates to the front surface direction (in FIG. 20, to the left direction), and predetermined divergence angle is given by the exit surface 3. In this way, in the fifth embodiment of the present invention, since the plural disc-shaped LEDs 81,82,83,84, . . . are nearly completely confined in the concavity of the bulk-shaped lens 25, and at the bottom surface of the bulk-shaped lens 25 the back mirror 31 is disposed, all these stray light components can be output finally from the top surface, serving as the luminescence surface. Therefore, all stray light components become possible to contribute to lighting effectively. That is to say, if the concavity is considered, since inner wall portion of the concavity aside from the entrance surface 2 can serves as the effective entrance surface of light, and the stray light components transmitted through the inner wall portion are reflected back at the back mirror 31, and they can be output from the luminescence surface side finally. In addition, the components which repeat the multiple reflections at each interfaces between the concavity of the bulk-shaped lens 25 and the plural disc-shaped LEDs 81,82,83,84, . . . are confined in the inside of the concavity, and they are reflected back at the back mirror 31, they are led to the top surface serving as the luminescence surface. As a result, all these multiple reflection components are output finally from the luminescence surface.

In this way, according to the light-emitting unit of the fifth embodiment of the present invention, desired light flux at the irradiation area is obtained as the light beam contributing to lighting, without requiring extremely large number of disc-shaped LEDs 81,82,83,84, . . . , and desired illumination intensity can be easily obtained as well. This illumination intensity is not achieved by the optical system of the earlier known optical lenses.

Sixth Embodiment

Figure 21:
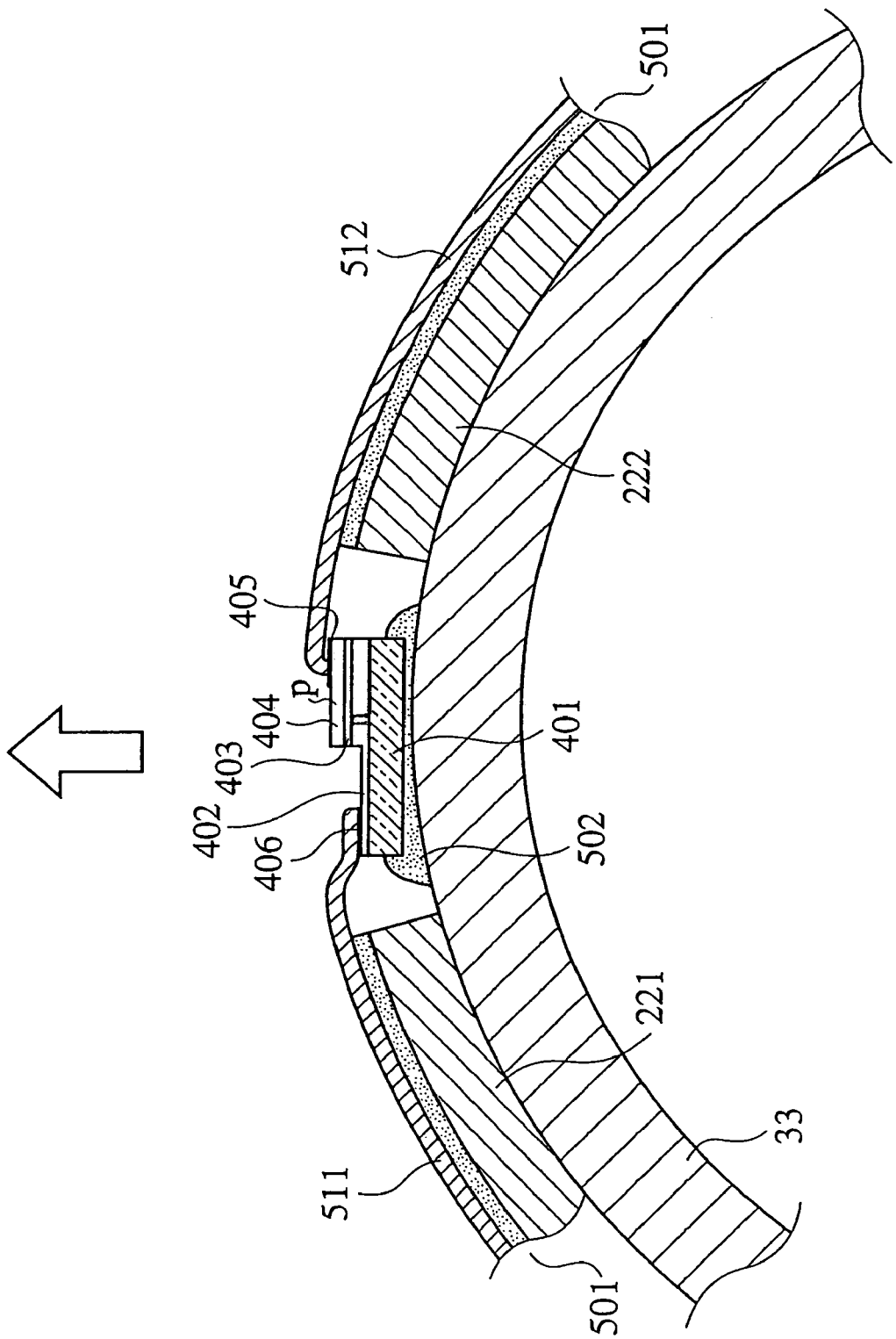
FIG. 21 is a schematic cross-sectional view of the light-emitting unit according to a sixth embodiment of the present invention, showing a detailed configuration in which a plurality of bare-chips (LED chips) are disposed on a film-like substrate.
Figure 22:
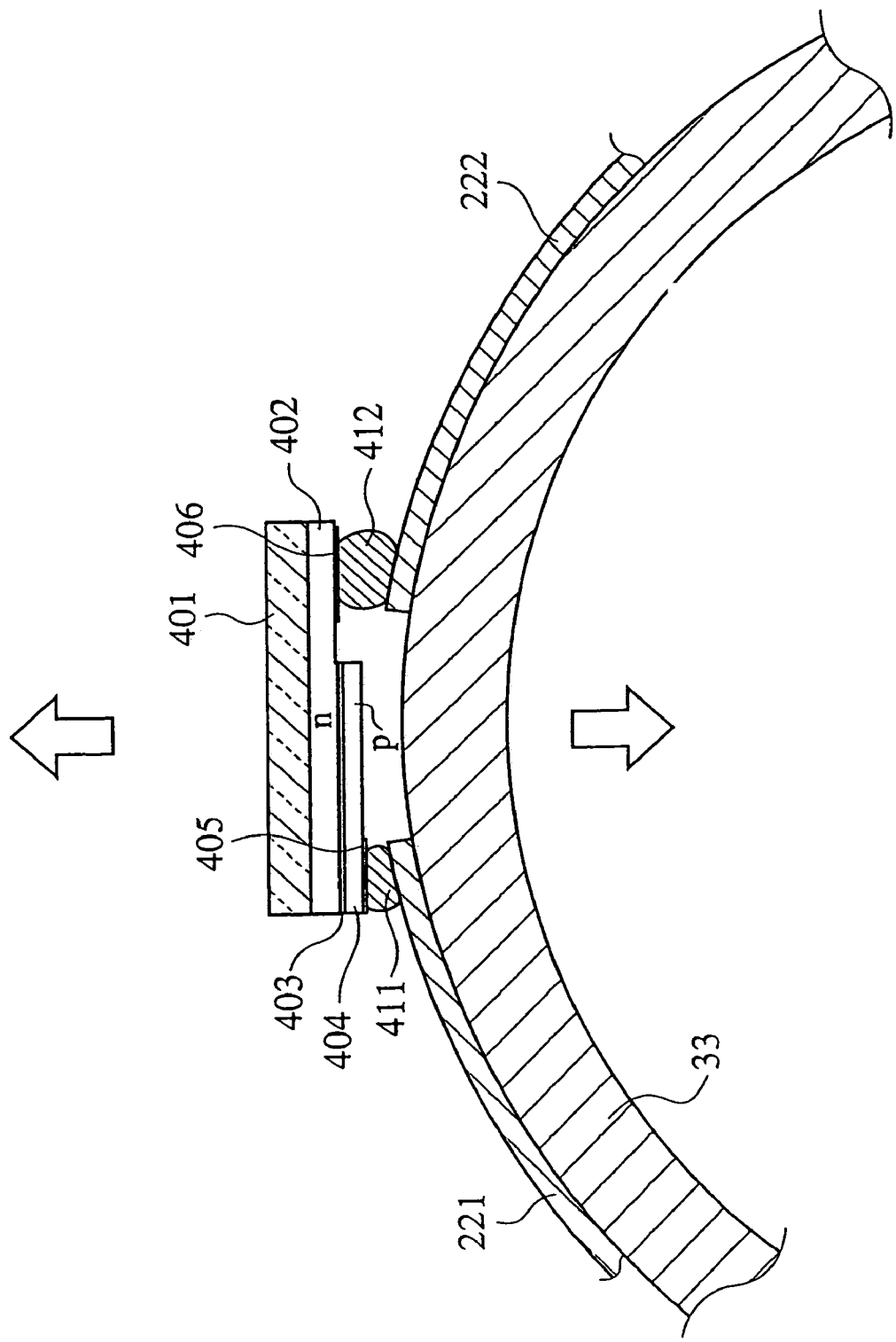
FIG. 22 is a schematic cross-sectional view of another light-emitting unit according to a modification of the sixth embodiment of the present invention, showing another mounting configuration in which a plurality of bare-chips (LED chips) are disposed on the film-like substrate.

In the light-emitting unit of the fifth embodiment of the present invention, a case in which plural diode chips 81,82, 83,84, . . . are molded in disc-shaped packages respectively is explained, but, in states of bare-chips, they may be disposed on the film substrate 33 formed into the bullet-shape. The state of bare-chip is preferred, because the bare-chips can be disposed more closely mutually. That is to say, in the description of a light-emitting unit of the sixth embodiment of the present invention, a concrete configuration in which plural LEDs 81,82,83,84, . . . in the states of bare-chips are disposed on the film substrate 33 formed into the bullet-shape, as shown in FIG. 21 and FIG. 22, is explained. Because the configuration of the bulk-shaped lens 25 is same as the configuration of the light-emitting unit of the fifth embodiment of the present invention, and the overlapped description is omitted.

The LED chip, as shown in FIG. 21, encompasses an n-type semiconductor layer 402, an active layer 403, a p-type semiconductor layer 404 disposed on the sapphire ($Al_2O_3$) substrate 401, through a buffer layer (the illustration is omitted). The sapphire ($Al_2O_3$) substrate 401 is fixed to the film substrate 33 by adhesives 502. Anode electrode 405 can be disposed on the entire surface of the top face of the p-type semiconductor layer 404. For improving an ohmic contact characteristic between the anode electrode 405 and the p-type semiconductor layer 404, it is desirable to insert a contact layer made of a GaN based p-type semiconductor (the illustration is omitted) between the anode electrode 405 and the p-type semiconductor layer 404. The anode electrode 405 may be made of a transparent electrode layer to luminescence from the active layer 403. To be concrete, metallic oxide such as tin (Sn) doped indium oxide (ITO) and tin oxide ($SnO_2$) can be employed. Or, metal layer may be formed into thinly enough so that it can serve as transparent electrode layer 405. Cathode electrode 406 serving as another electrode layer is not required, in particular, to be transparence. A bonding pad portion is arranged on a part of the anode electrode 405, and beam lead 512 made of copper (Cu) foil is connected to the bonding pad portion. Beam lead 511 made of the copper foil is connected to the cathode electrode 406 likewise. Beam leads 511,512 are connected to Al interconnections 221,222 through electrically conductive adhesives layer 501 respectively.

LED chip may be assembled using solder balls 411,412 as shown in FIG. 22, in flip-chip configuration. In FIG. 22, the anode electrode 405 is connected to the Al interconnection 221 through the solder ball 411, and the cathode electrode 406 is connected to the Al interconnection 222 through solder ball 412. If the film substrate 33 is made of transparent substrate, the light can propagate to two directions of front and rear surface directions. The light, which is emitted to rear surface direction reflects back at the back mirror 31 same as FIG. 20, and is returned to front surface direction.

Seventh Embodiment

Figure 23:
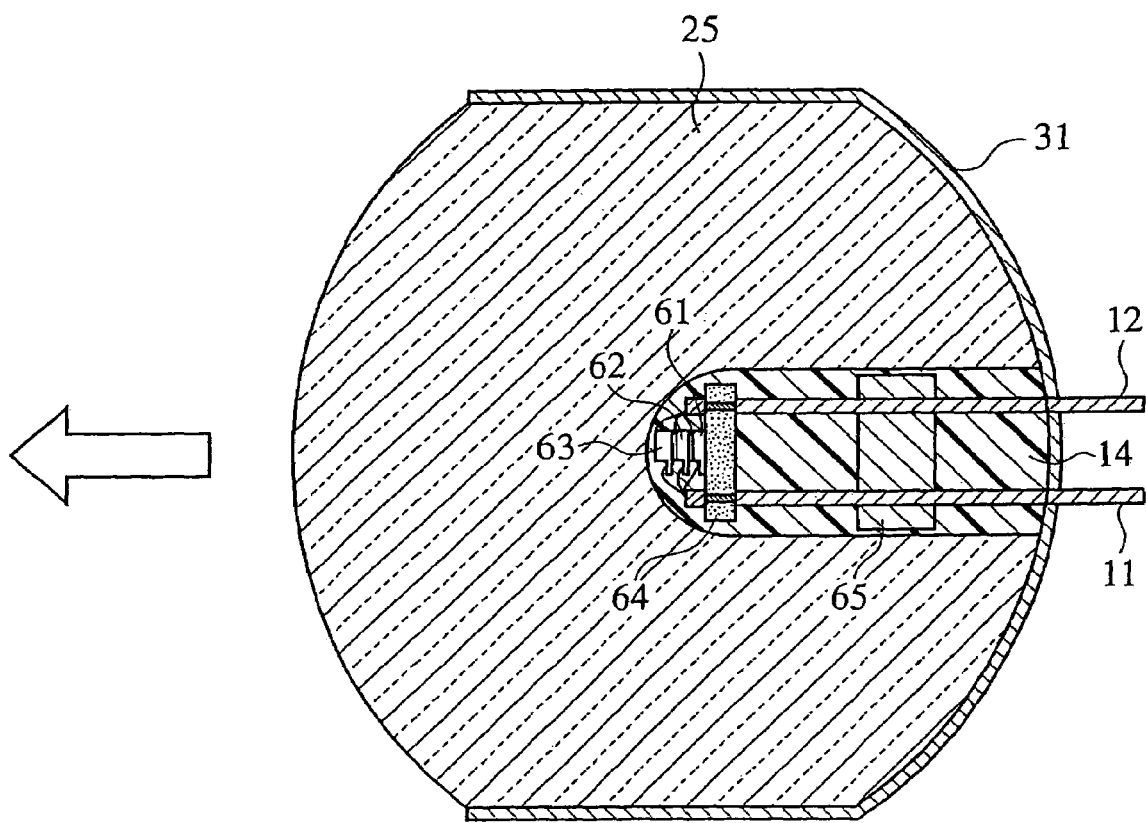
FIG. 23 is a schematic cross-sectional view of the light-emitting unit according to a seventh embodiment of the present invention, showing a detailed configuration in which a plurality of bare-chips (LED chips) are vertically stacked on a film-like substrate.
Figure 24:
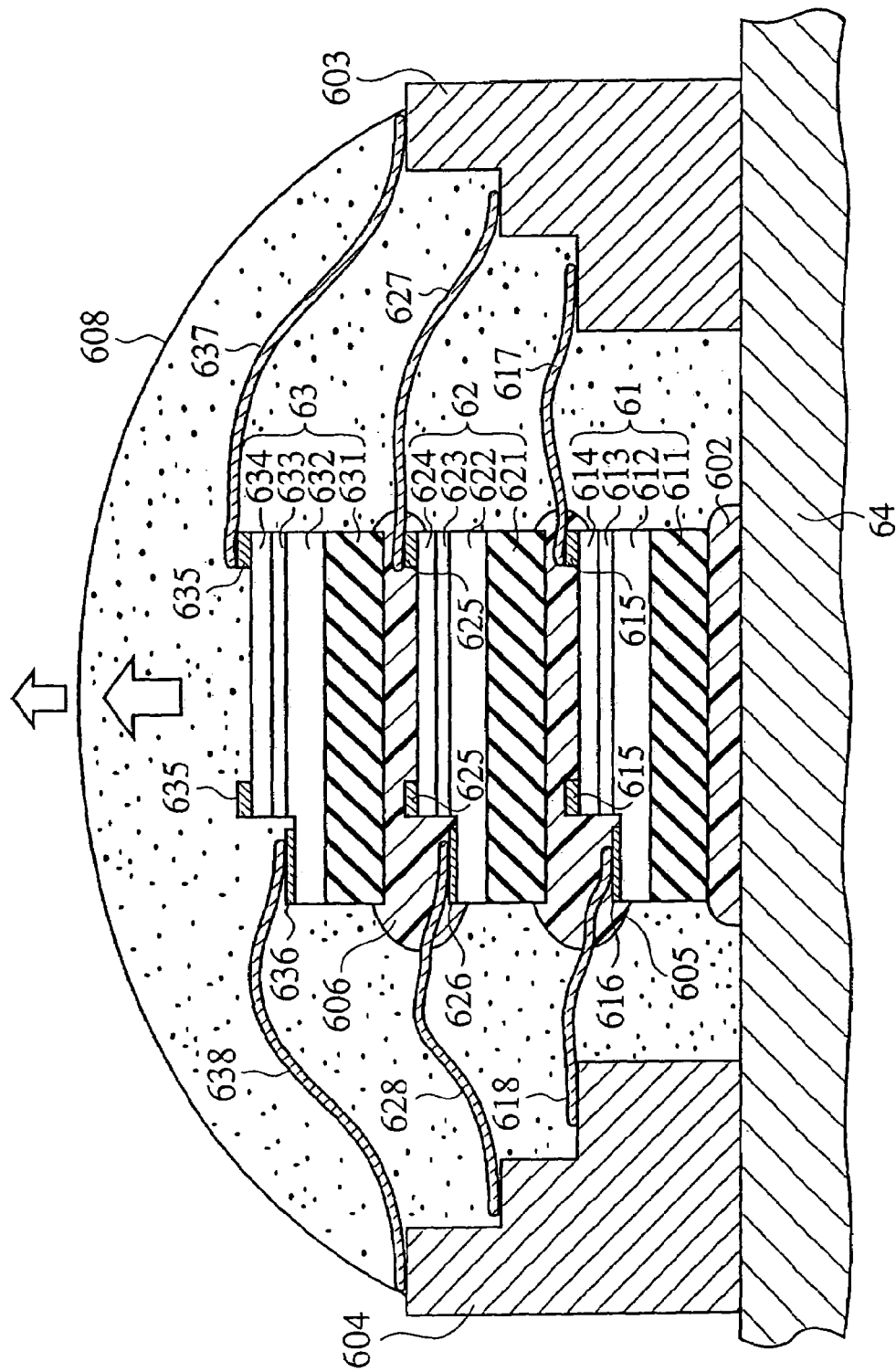
FIG. 24 shows a schematic cross-sectional view, in which the LED chips shown in FIG. 23 are magnified.

In the light-emitting units of the fifth and sixth embodiments of the present invention, plural diode chips 81,82,83, 84, . . . are disposed on the surface of the film substrate 33, which is formed into the bullet-shape, or they are arranged, so to speak, in quasi-planar topology (quasi-two dimensionally). In this case, because there are plural optical axes of the plural output lights corresponding to respective diode chips in reality, there is a case in which it becomes difficult to regard the plural diode chips 81,82,83,84, . . . as a point light source. In the light-emitting unit of the seventh embodiment of the present invention, plural diode chips 61,62,63, . . . are vertically stacked, as shown in FIG. 23, so that plural optical axes are merged into a single line. "The principal surfaces" are mutually facing two parallel planes, as already stated, and are parallel with respective p-n junction interfaces of diode chips 81,82,83,84, . . . . FIG. 24 shows in detail the stacked configuration embracing plural diode chips 61,62, 63, . . . . Three levels of stacked layers are shown in the drawing for simplification, but multi-level structure more than four levels can be adopted, of course. In FIG. 24, the first level diode tip (the first level LED) 61 encompasses, an n type semiconductor layer 612, an active layer 613 and a p-type semiconductor layer 614 stacked on the sapphire substrate 611. The sapphire substrate 611 is fixed to a susceptor 64 by adhesives 602. An anode electrode 615 can be formed on the entire surface of the top face of the p-type semiconductor layer 614. A central portion of the anode electrode 615 may be made of a transparent electrode layer to the luminescence from the active layer 613. A frame-shaped peripheral portion of the anode electrode 615 is made of a relatively thick gold (Au) thin film having the thickness of 0.5 μm-2 μm level for bonding. A cathode electrode 616 is not required to be transparence, in particular. TAB lead (beam lead) 617 made of copper (Cu) foil is connected to the frame-shaped peripheral portion of the anode electrode 615. TAB lead (beam lead) 618 made of the copper foil is also connected to the cathode electrode 616. A second level diode chip (second level LED) 62 encompasses an n type semiconductor layer 622, an active layer 623 and a p-type semiconductor layer 624 stacked on the sapphire substrate 621. The sapphire substrate 621 is fixed on the first level diode tip 61 by transparent adhesives 605. An anode electrode 625 can be formed on the entire surface of the top face of the p-type semiconductor layer 624. A central portion of the anode electrode 625 may be made of a transparent electrode layer to the luminescence from the active layer 623. A frame-shaped peripheral portion of the anode electrode 625 is made of a relatively thick gold (Au) thin film having thickness of 0.5 μm-2 μm level for bonding. A cathode electrode 626 is not required to be transparent, in particular. TAB lead (beam lead) 627 made of copper (Cu) foil is connected to the frame-shaped peripheral portion of the anode electrode 625. TAB lead (beam lead) 628 made of copper foil is also connected to the cathode electrode 626. Likewise, a third level diode chip (third level LED) 63 encompasses an type semiconductor layer 632, an active layer 633 and a p-type semiconductor layer 634 stacked on the sapphire substrate 631. The sapphire substrate 631 is fixed on the second level diode chip 62 by transparent adhesives 606. An anode electrode 635 can be formed on the almost entire surface of the top surface of the p-type semiconductor layer 634. A central portion of the anode electrode 635 can be made of a transparent electrode layer to luminescence from the active layer 633. A frame-shaped peripheral portion of the anode electrode 635 is made of relatively thick gold (Au) thin film of 0.5 μm-2 μm level for bonding. A cathode electrode 636 is not required to be transparence, in particular. TAB lead (beam lead) 637 made of copper (Cu) foil is connected to the frame-shaped peripheral portion of the anode electrode 635. TAB lead (beam lead) 638 made of copper foil is also connected to the cathode electrode. For joints between TAB leads (beam leads) 617,627,637,618,628,638 and bonding pads 615,625, 635,616,626,636, we can use the techniques usually used as TAB bonding technique such as thermo compression bonding, ultrasonic bonding, gold (Au) bump joints, solder joints. In addition, TAB leads (beam leads) 617,627,637 are connected to a terminal 603 by electrically conductive adhesives or solders etc. TAB lead (beam lead) 618,628,638 are connected to terminal 604 by electrically conductive adhesives or solders etc. Resin seal 608 molds plural diode chips 61,62,63.

As shown in FIG. 23, the terminal 603 is connected to the second pin 12, and the terminal 604 is connected to the first pin 11. The terminal 603 and the terminal 604 are drawn to outside from the through holes formed in the back mirror 31 through a strengthening member 65. If the resin 14 filled in the concavity of the bulk-shaped lens 25 is made of transparent material to luminescence from plural diode chips 61,62,63, the lights can propagate to the rear surface direction (FIG. 23, right direction). Lights emitted from the plural diode chips 61,62,63 to the right direction (rear surface side direction) are reflected back at the back mirror 31, and are output to left direction from the front surfaces of plural diode chips 61,62,63. After all, light emitted from the plural diode chips 61,62,63 to the right direction (rear surface side direction) are merged with the light propagating to the front surface direction (FIG. 23, left direction), and predetermined divergence angle is given by the exit surface 3. In this way, in the seventh embodiment of the present invention, plural diode chips 61,62,63 are confined nearly completely in the concavity of the bulk-shaped lens 25, and the back mirror 31 is arranged at the bottom surface of the bulk-shaped lens 25. Because of this, including the stray light components, all lights emit finally from the top surface, serving as the luminescence surface, so that they can be propagated along approximately same optical axis. Therefore, all luminescence components emitted from diode chips 61,62,63 to various directions are effectively collimated so that they can contribute to lighting.

Plural diode chips 61,62,63, . . . are not required to be the same LED chip. That is to say, as the plural diode chips 61,62,63, . . . , various kinds and configurations can be employed. For example, as plural diode chips 61,62,63, if three pieces of LED chips including the red (R) green (G) and blue (B) chips are stacked vertically, as a whole, an output light of white can be achieved. In the case of three pieces of LED chips including the red (R), green (G) and blue (B) chips, as the red (R) LED chip, $Al_xGa_{1-x}As$, as the green (G) LED chip, $Al_xGa_yIn_{1-x-y}P$ or GaP, and as blue (B) LED chip, $In_xGa_{1-x}N$ or ZnSe can be employed. In this case, $Al_xGa_{1-x}As$, $Al_xGa_yIn_{1-x-y}P$, GaP do not require the sapphire substrate.

Or ternary, quaternary, quinary, . . . compound semiconductor mixed crystal are chosen as the materials for plural diode chips 61,62,63, . . . , in which mole fractions may be changed. For example, if we choose plural diode chips

61,62,63, . . . made of $In_xAl_yGa_{1-x-y}N$, changing each of mole fractions, we can emit light in green (G)-blue (B) spectral range. Furthermore, there is a disadvantage that an optical axis may disperse, first stack embracing vertically laminated plural diode chips, second stack embracing vertically laminated plural diode chips, and third stack embracing vertically laminated plural diode chips may be disposed on a bullet-shaped susceptor in the quasi-planar topology. In this case brightness of 3*3=9 times can be obtained. If five diode chip stacks, each having three level laminated layers are arranged in the quasi-planar topology, brightness of 3*5=15 times can be obtained.

Eighth Embodiment

A plurality of the light-emitting units explained one of the first to seventh embodiments can be arranged so as to provide a lighting equipment. In this case, one-dimensional, two-dimensional or three-dimensional arrangement is possible. In addition, as "the light source" of lighting equipment (lighting apparatus), an incandescent lamp, a small discharge tube, an electrodeless discharge lamp, a semiconductor light-emitting element can be adopted. The incandescent lamp may includes halogen lamps such as an iodine ($I_2$)-tungsten lamp, a xenon (Xe)-tungsten lamp (xenon lamp), which may be called as "a Billiken lump", a krypton (Kr)-tungsten tungsten lamp (krypton lamp), which is also called as "the Billiken lump", and a miniature lamp with a vacuum evacuated tube or argon gas charged tube, the miniature lamp may be called "the nipple bulb" or "the spot bulb". Furthermore, a miniature lamp such as a halogen miniature bulb is included in the incandescent lamp. As the small discharge tube, other than a fluorescence discharge tube, a small xenon lamp, a small metal halide lamp, a small size high-pressure sodium lamp, and a small size mercury lamp can be employed. As the electrodeless discharge lamp, the configuration in which the discharge media is charged in a bulb made of quartz glass, the discharge media including the noble gas such as argon (Ar), neon (Ne), xenon (Xe), krypton (Kr), with metal halide such as gallium (Ga), indium (In), thallium (Tl), and further mercury (Hg), zinc (Zn), sulfur (S), selenium (Se), tellurium (Te) can be employed. And, if microwave of, for example, 100 MHz-2.45 GHz is applied to this bulb, the discharge medium discharges, and it emits light. For miniaturization, the microwave is preferable to be radiated from a transistor oscillating circuit. As the semiconductor light-emitting element, light emitting diode (LED) and a semiconductor laser can be employed.

The semiconductor light-emitting element such as the LED has the characteristic of long life with low power consumption, but, in general, compared with the incandescent lamp such as the halogen lamp, the illumination intensity is low. Therefore, if a plurality (n pieces) of the semiconductor light-emitting elements $D_1, D_2, \ldots, D_n$ are combined together so that they can simultaneously emit, desired brightness can be achieved. In order to make the plurality of the semiconductor light-emitting elements $D_1, D_2, \ldots, D_n$ emit light simultaneously, a control circuit is preferable to encompasses a rectifier circuit rectifying commercial alternating current, a current limiting element (fixed resistor) connected to the rectifier circuit, a smoothing circuit connected to the current limiting element, and a constant current element (or a constant current circuit) connected to the smoothing circuit. For example, a series circuit of n-pieces-semiconductor light-emitting elements $D_1, D_2, \ldots, D_n$ are shown, but the plural semiconductor light-emitting elements may be connected in parallel. A series connection of the semiconductor light-emitting elements (LEDs) of around 50 is preferable, because DC voltage of around 130V, which is obtained rectifying the commercial alternating current, can be just used, and the simplification of circuitry becomes easy. In order to make around 100 LEDs emit light simultaneously, it is preferable to make two 50-pieces-series circuits connected in parallel. The number of LEDs implementing the series connection can be chosen depending on the operating voltage.

Figure 25:
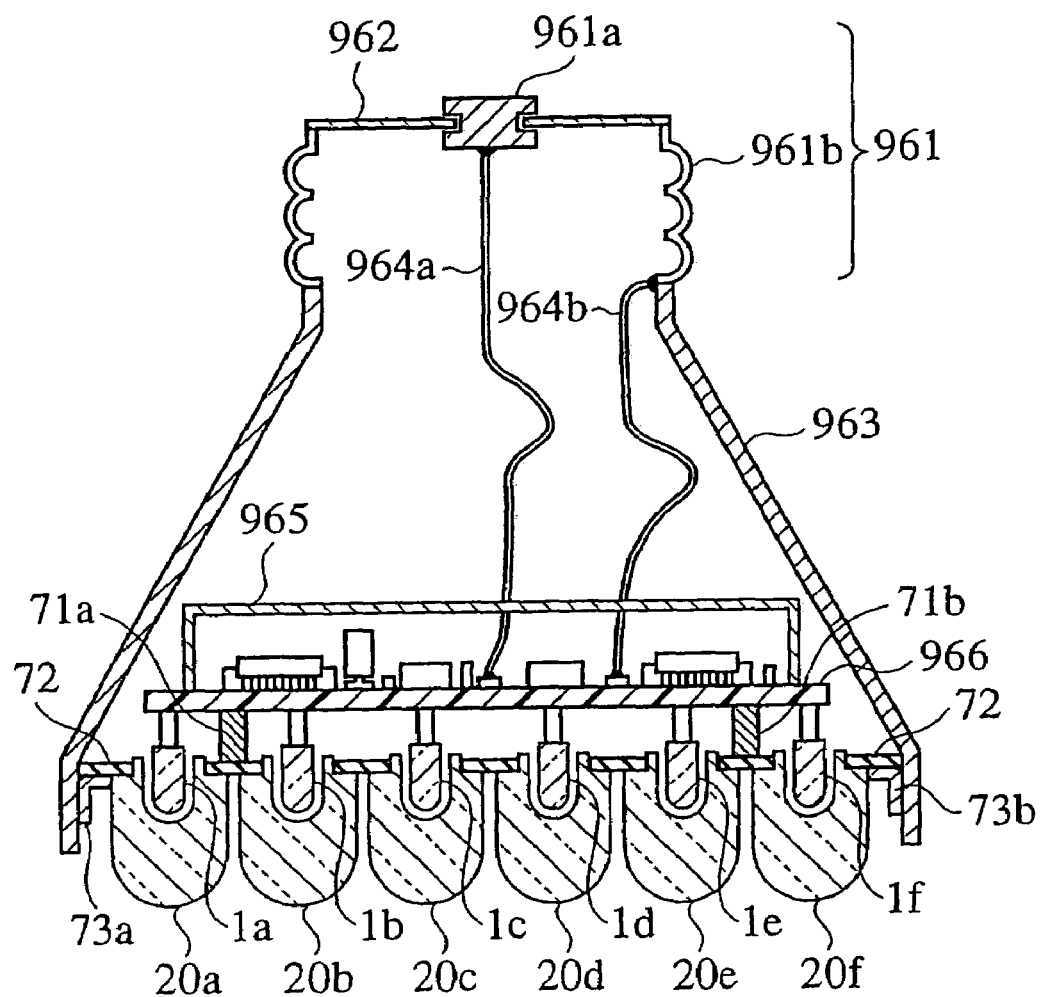
FIG. 25 shows a schematic cross-sectional view of a lighting equipment according to a eighth embodiment of the present invention.

To be concrete, as shown in FIG. 25, the lighting equipment embraces plural bullet-like bulk-shaped lenses 20a, 20b, . . . , 20f, . . . disposed adjacently each other, plural light sources (LEDs) 1a,1b, . . . ,1f, . . . , respective main luminescence portions of the light sources (LEDs) 1a,1b, . . . ,1f, . . . are installed in the inside of well-shaped concavities implemented in the plural bulk-shaped lens 20a, 20b, . . . ,20f, an optical-lens-fastening means (an optical-lens-fastening plate) 72 fixing plural bulk-shaped lens 20a, 20b, . . . ,20f, and a control circuit electrically connected respectively to the plural light sources (LEDs) 1a,1b, . . . , 1f, . . . , the control circuit disposed in the vicinities of the optical-lens-fastening means 72. Here, a configuration of each of plural bullet-like bulk-shaped lenses 20a, 20b, . . . , 20f, . . . are shown in FIG. 1. In FIG. 25, the control circuit is disposed on a circuit board 966, and is installed in the inside of a control circuit housing 965. For example, this control circuit embraces a rectifier circuit, a current limiting element, a smoothing circuit, and a constant current element, etc. The circuit board 966 and the control circuit housing 965 are received in the inside of a cone-shaped isolation case 963. And, the optical-lens-fastening means 72 is fixed with fixing-metals 73a, 73b, . . . to the isolation case 963. Furthermore, the circuit board 966 is fixed with fixing-metals 71a, 71b, . . . to the optical-lens-fastening means 72. From each of the LEDs, serving as the light sources 1a, 1b, . . . ,1f, . . . , couple of pins appear respectively (cf. FIG. 1.) The respective couples of pins from each of the LEDs are directly soldered to the circuit board 966, and predetermined currents are applied to the LEDs from the control circuit, respectively.

An AC-100V-electrode 961b is connected to the vicinity of the squeezed top portion of the cone-shaped isolation case 963 as shown in FIG. 25. The AC-100V-electrode 961b is isolated by an isolation termination 962 from an AC-100V-electrode 961a. An AC-100V-mouthpiece 961 encompasses the AC-100V-electrodes 961a, 961b and the isolation termination 962. A power supplying lead 964a is connected to the AC-100V-electrode 961a, and a power supplying lead 964b is connected to the AC-100V-electrode 961b, and AC 100V are supplied to the control circuit installed in the inside of the control circuit housing 965 through the power supplying leads 964a, 964b. The LEDs serving as the light sources 1a, 1b, . . . ,1f, . . . of the lighting equipment according to the eighth embodiment of the present invention (the lighting apparatus), can have configurations such as the bullet-shaped (the cannonball-shape) LED as shown in FIG. 25, or the disc-shaped (the surface mount type) LED. The LEDs of various colors (wavelengths) can be employed. But, for indoor lighting purpose, the white LED is preferable. In addition, plural LED chips can be disposed on the film substrate 33 formed as the bullet-shape as shown in FIGS. 16A and 16B, and they may be installed in the storing cavity 6. When it is used as a light for various decoration purposes or as an interior illumination light, the lightings of various colors become possible, using the outputs of respective LEDs as they are, each of LEDs emitting various color.

Therefore, the cluster of light sources $1a, 1b, \ldots, 1f, \ldots$ may include LEDs having different luminous colors.

The lighting apparatus (the bulk-shaped lens cluster) shown in FIG. 25 is suitable for spotlighting equipment (lighting apparatus), by using separately, since it is superior in beam parallelism. For example, if three spotlighting equipments, emitting three colors of RGB, are prepared, they can be used in horizon (cyclorama) illumination in a studio of a color TV broadcast. In this case, temperature rise in the studio can be suppressed, because the heat generation becomes low, by using LEDs as the light sources $1a, 1b, \ldots, 1f, \ldots$. Furthermore, a large reduction of the power consumption is possible, or the reduction of electric power around 1/100 is achieved. In addition, since high speed color change is possible because time responses of the LEDs are rapid, the lighting apparatus is suitable for the studio of a high definition TV broadcast, by using the LEDs as the light sources $1a, 1b, \ldots, 1f, \ldots$.

Figure 26:
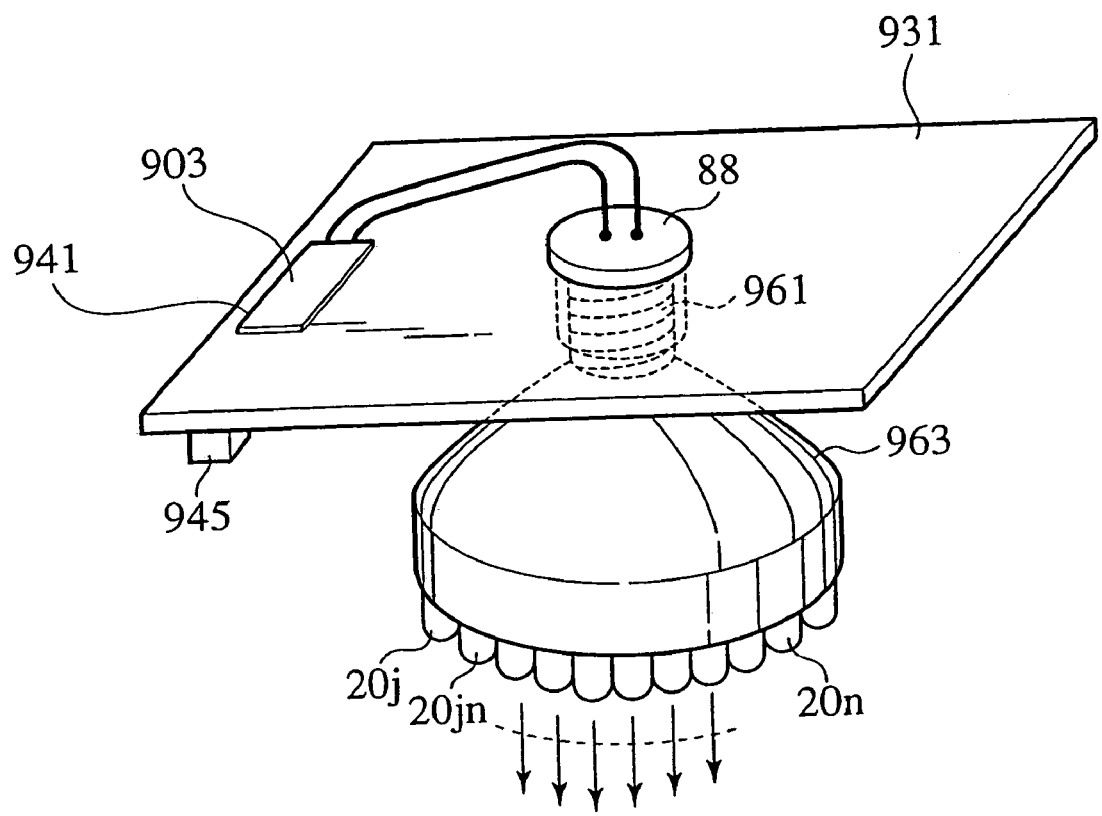
FIG. 26 is a bird's-eye view showing the configuration in which the lighting equipment of the eighth embodiment of the present invention is attached to a supporting substrate.

Or, the bulk-shaped lens cluster according to the eighth embodiment of the present invention may be attached to a supporting substrate 931 as shown in FIG. 26. That is to say, if the bulk-shaped lens cluster shown in FIG. 25 is attached to the supporting substrate 931 employing a socket pedestal 88, the lens cluster can be turned on/off by the information from a sensor 945. Because a mouthpiece 961 is attached to a cone-shaped isolation case 963 of the bulk-shaped lens cluster shown in FIG. 25, if the bulk-shaped lens cluster is inserted in the lamp-socket mounted on the socket pedestal 88 disposed at the ceiling, which is identified as a supporting substrate 931, the lens cluster can be easily fixed to the supporting substrate 931.

As shown in FIG. 26, a circuitry portion 903 controlling lighting states of the bulk-shaped lens cluster shown in FIG. 25 is disposed in a rear face of the supporting substrate 931. And the sensor 945 is connected to the circuitry portion 903. The sensor 945 supplies necessary information in order to control the lighting states of the bulk-shaped lens cluster. On the supporting substrate 931, a circuit board 941 mounting the circuitry portion 903 for AC 100V control is attached.

Ninth Embodiment

Figure 27:
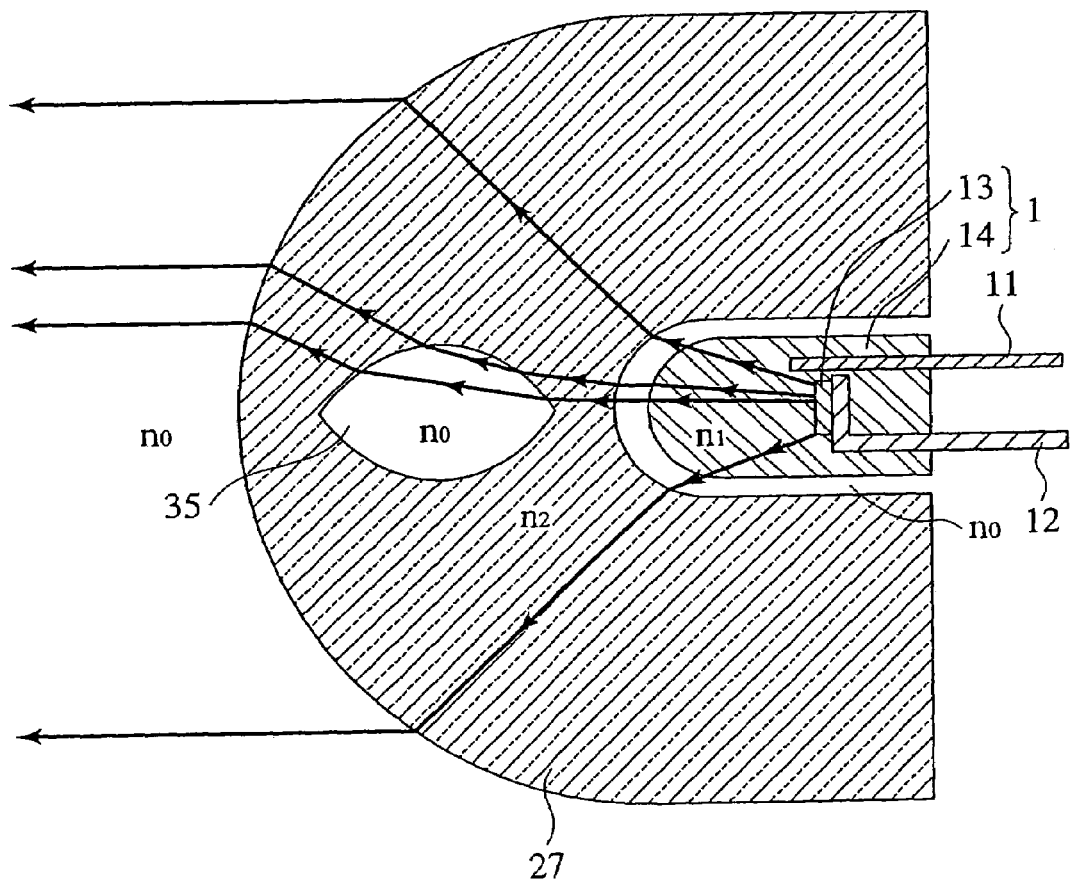
FIG. 27 shows a schematic cross-sectional view of a light-emitting unit according to a ninth embodiment of the present invention.

As shown in FIG. 27, a light-emitting unit according to the ninth embodiment of the present invention embraces a bulk-shaped lens 27 having at least a top surface serving as a luminescence surface, a bottom surface facing to the top surface and a lens body connecting the bottom surface to the top surface, the lens body having the first refractive index $n_2$, a concavity formed from a part of the bottom surface to the top surface direction, in the inside of the lens body, and an optical path modification portion 35 with second refractive index $n_0$ different from the first refractive index $n_2$ formed inside of the lens body between the top surface and the concavity and a semiconductor light-emitting element 1 installed in the concavity.

As the optical material implementing the lens body having the first refractive index $n_2$, a transparent plastic material (thermoplastic), a glass material and a crystalline material, etc. can be employed. As an optical path modification portion having the second refractive index $n_0$, a hollow space charged with air of refractive index $n_0$ as shown in FIG. 27, or space filled with other solid material can serve. In any case, if the optical path modification portion has the second different refractive index $n_0$ different from the first refractive index $n_2$, because deflection occurs at interface between the portion having the first refractive index $n_2$ and the portion having the second refractive index $n_0$, it is possible to change the propagation direction of the optical path.

In this way, in the light-emitting unit according to the ninth embodiment of the present invention, because the optical path modification portion 35 having the second refractive index $n_0$ is provided in the inside of the lens body between the top surface and the concavity, the optical path modification portion 35 changes propagation direction of the light emitted from the semiconductor light-emitting element 1, incident from the ceiling surface of the concavity. In the geometry of optical path modification portion 35 designed to have the major axis along the central axis direction of the bulk-shaped lens 27 as shown in FIG. 27, if the first refractive index $n_2$ is lager than the second refractive index $n_0$, the luminous flux density around the central portion of the luminescence surface becomes low, and the lighting in which around the central portion of the optical axis is relatively dark is achieved. If, in the case of similar geometry of optical path modification portion 35, if the first refractive index $n_2$ is smaller than the second refractive index $n_0$, the luminous flux density around the central portion of the luminescence surface increases, and the lighting in which around the central portion of the optical axis is relatively bright is enabled.

A light-emitting unit according to the ninth embodiment of the present invention, because it is basically similar to the light-emitting unit according to the first embodiment, the overlapped description is omitted.

Figure 28:
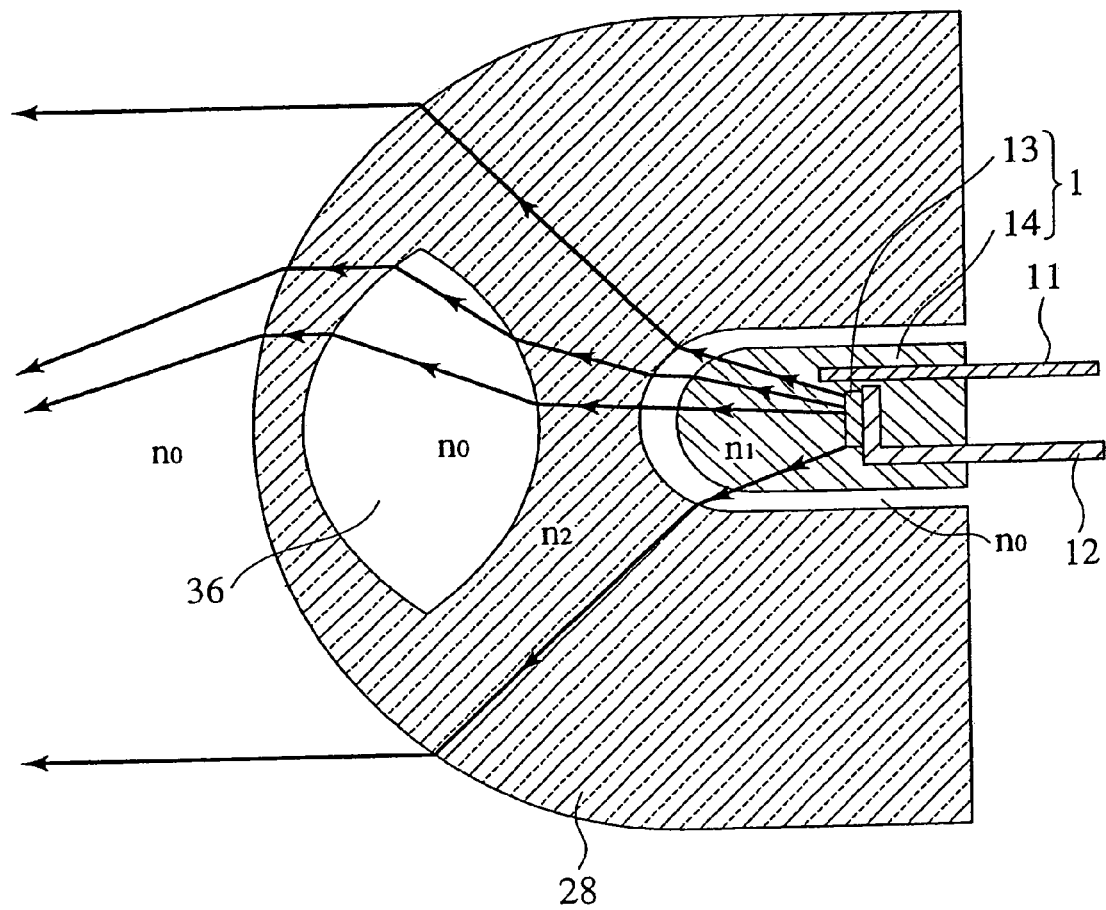
FIG. 28 shows a schematic cross-sectional view of a light-emitting unit according to a modification of the ninth embodiment of the present invention.

Turning now to a modification of the ninth embodiment of the present invention as shown in FIG. 28, the geometry of optical path modification portion 36 designed to have the major axis perpendicular to the central axis direction of the bulk-shaped lens 28, the converse optical path modification occurs, when the optical path modification portion 36 is disposed between the top surface and the concavity in the inside of the lens body. That is to say, if the first refractive index $n_2$ is larger than the second refractive index $n_0$, the luminous flux density around the central portion of the luminescence surface increases, and the lighting around the central portion of the optical axis is relatively bright is achieved. In the case of similar geometry of the optical path modification portion 36, if the first refractive index $n_2$ is smaller than the second refractive index $n_0$, the luminous flux density around the central portion of the luminescence surface becomes low, and the lighting that around the central portion of the optical axis is relatively dark is achieved.

Figure 29:
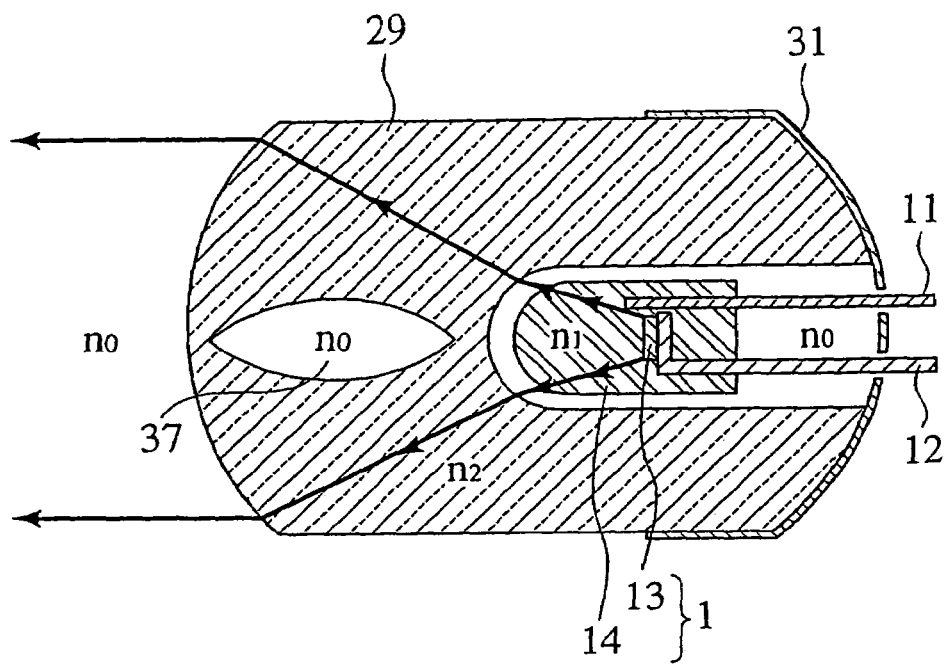
FIG. 29 shows a schematic cross-sectional view of a light-emitting unit according to another modification of the ninth embodiment of the present invention.

FIG. 29 shows a schematic view showing a configuration of a light-emitting unit according to another modification of the ninth embodiment of the present invention, in which a back mirror 31 is disposed at a bottom surface of a bulk-shaped lens 29. In FIG. 29, luminescence component from the rear surface of the LED chip 13 and stray light components are reflected back at back mirror 31, and they are led to the top surface side serving as a luminescence surface. As a result, all these stray light components are output finally from the luminescence surface, and extremely high conversion efficiency lighting is achieved, and the regulation of light intensity distribution at the irradiation surface becomes possible.

In addition, the cross-sectional shapes of the optical path modification portions 35, 36, 37 in the ninth embodiment of the present invention can have various geometries other than the double-convex geometry as shown in FIGS. 27, 28 and 29, such as the plano-convex geometry or meniscus geometry.

Tenth Embodiment

Figure 30:
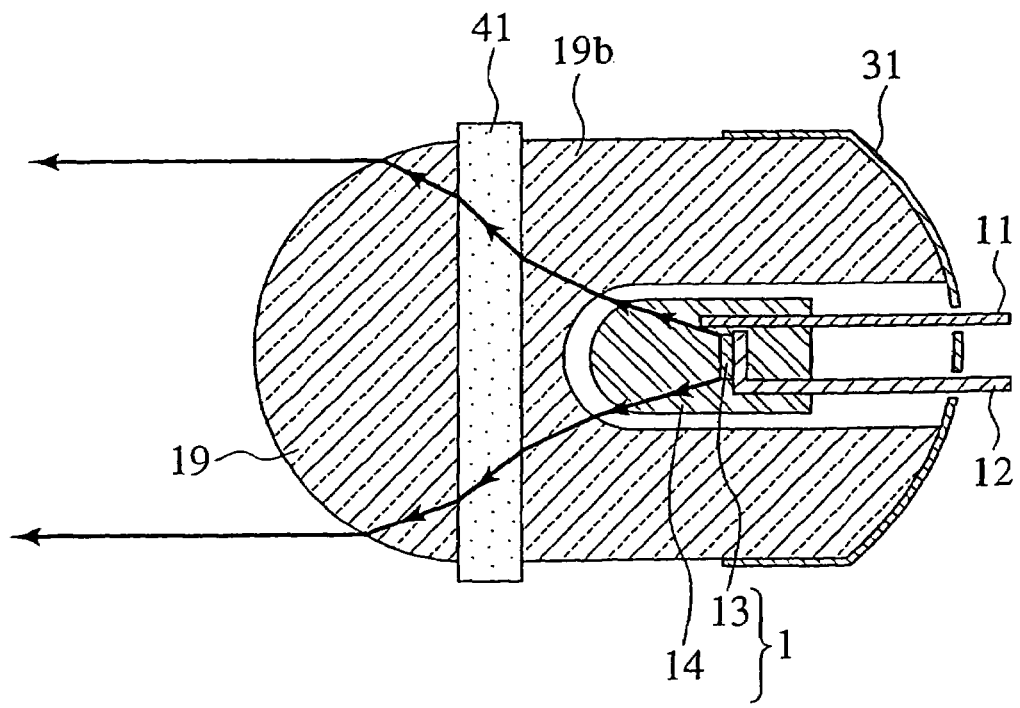
FIG. 30 shows a schematic cross-sectional view of a light-emitting unit according to a tenth embodiment of the present invention.

As shown in FIG. 30, a light-emitting unit according to tenth embodiment of the present invention embraces a bulk-shaped lens (19a, 19b) having at least a top surface serving as a luminescence surface, a bottom surface facing to the top surface, a lens body connecting the bottom surface to the top surface, and a concavity formed from a part of the bottom surface to the top surface, the concavity is implemented in the inside of the lens body, a transmittance-changing means 41 disposed between the top surface and the concavity, the transmittance-changing means 41 disposed in the inside of the lens body, and a semiconductor light-emitting element 1 installed in the concavity.

As the transmittance-changing means 41, a mechanical shutter, an iris, or an electric transmittance-changing means such as a liquid crystal can be employed. In FIG. 30, although the transmittance-changing means 41 is interposed between the front head portion 19a and the central portion 19b, depending on purposes, another configuration in which the transmittance-changing means 41 is embedded in a part of the bulk-shaped lens can be employed. The light-emitting unit according to the tenth embodiment of the present invention is, apart from the transmittance-changing means 41, basically similar to the light-emitting unit according to the first embodiment, and the overlapped description is omitted, According to the light-emitting unit according to the tenth embodiment of the present invention, by driving the transmittance-changing means 41 with mechanically or electrically, the optical intensity and beam diameter can be changed freely. When, as the transmittance-changing means 41, the liquid crystal is employed, an active matrix implemented by thin film transistors (TFTs) may be disposed in the inside of the transmittance-changing means 41, and the each of the active matrix element may be driven with shift registers. When, as the transmittance-changing means 41, the mechanical shutter, or the iris is used, a mechanical drive system such as micromotors will be disposed adjacent to the bulk-shaped lens (19a, 19b).

Although, as the light-emitting unit according to the tenth embodiment of the present invention, the configuration in which the back mirror 31 is disposed at the bottom surface of the bulk-shaped lens 27 as shown in FIG. 30, but, another configuration such that there is no back mirror, as for example FIG. 1, can be employed, implementing the transmittance-changing means 41 in the lens body.

Eleventh Embodiment

Figure 31:
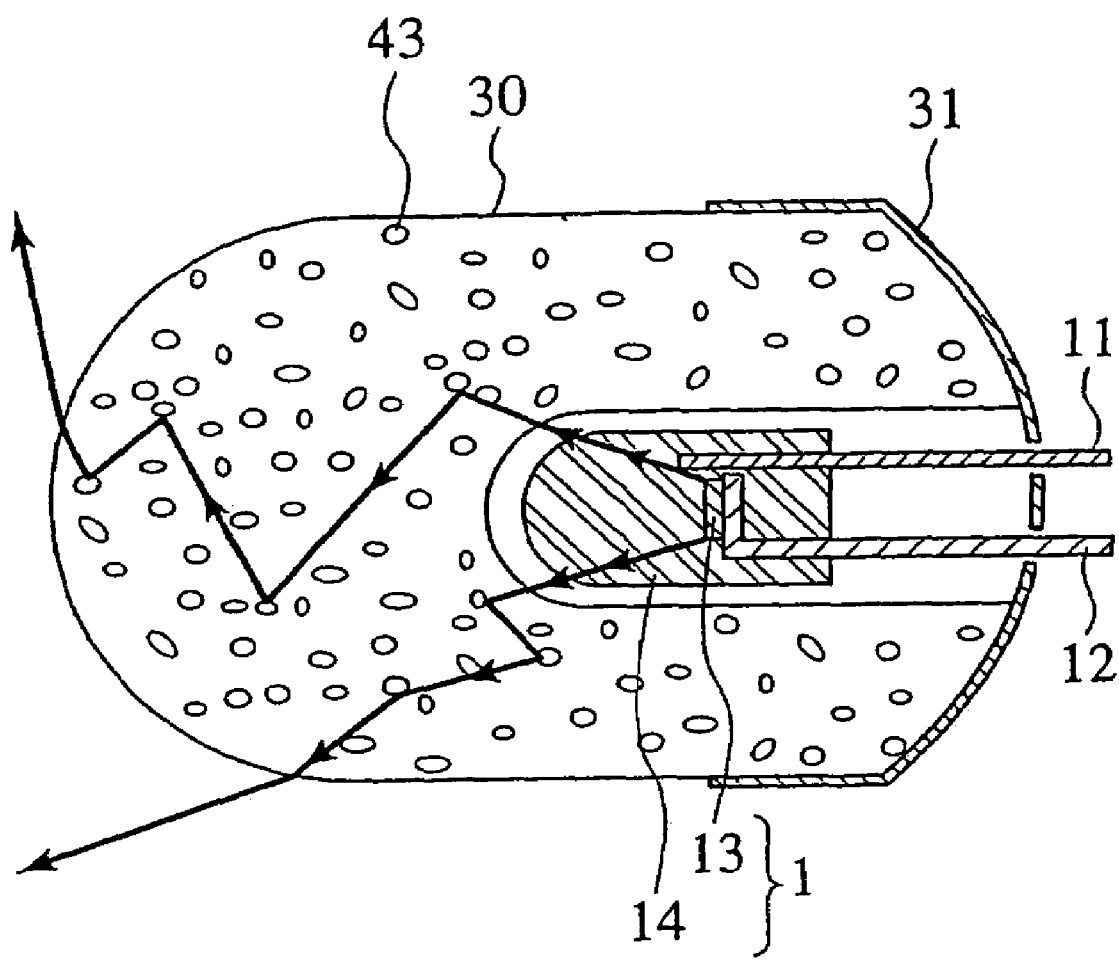
FIG. 31 shows a schematic cross-sectional view of a light-emitting unit according to a eleventh embodiment of the present invention.

As shown in FIG. 31, a light-emitting unit according to the eleventh embodiment of the present invention embraces a bulk-shaped lens 30 encompassing having at least a top surface serving as a luminescence surface, a bottom surface facing to the top surface, a lens body connecting the bottom surface to the top surface, a concavity formed from a part of the bottom surface to the top surface direction, implemented in the inside of the lens body, and several scatterers 43 formed inside of the lens body between the top surface and the concavity, and a semiconductor light-emitting element 1 installed in the concavity.

To implement the scatterers 43, it is preferable to dope metal powders such as Al, Au, W, Ti, Mo into the bulk-shaped lens 30 made of transparence plastic material, a glass material etc., so that the metal powders coexist with the bulk-shaped lens 30. These metal powders will be mixed into the bulk-shaped lens 30, when the extrusion or the injection molding of the thermoplastic such as, for example, acryl resin or polyvinyl chloride resin is executed. The dimension of the scatterers 43 are selected such that they are larger than the wavelength of light, and various kinds of dimension are possible, which may include around micron order to several mm order, and any geometries can be adopted.

Although the light-emitting unit of the first embodiment of the present invention is suited for the lighting equipment in the application fields in which relatively strong light beam with high directivity is required, the light-emitting unit according to the eleventh embodiment makes the illumination intensity directivity weak, and is configured such that whole body of the light-emitting unit glitters, and it is suitable for the lighting equipment providing the beautiful sight. For example, it may be used as an emergency light or bedside illumination equipment, or it may be used for decorating the interior of the room or the outdoors. To use the feature in which the whole body of the light-emitting unit glimmers by it self, we can increase the diameter or one side length of the bulk-shaped lens 30 such as around 5 cm-30 cm, or around 1 m. It is possible to make such a big bulk-shaped lens to shine by only one semiconductor light-emitting element 1, and the power consumption is extremely small. For the purpose of decoration, instead of the simple configuration as shown in FIG. 31, more complex topologies including miscellaneous unique shapes resembling to animal, tree, or building, etc., can be employed for the bulk-shaped lens 30.

Twelfth Embodiment

Figure 32A:
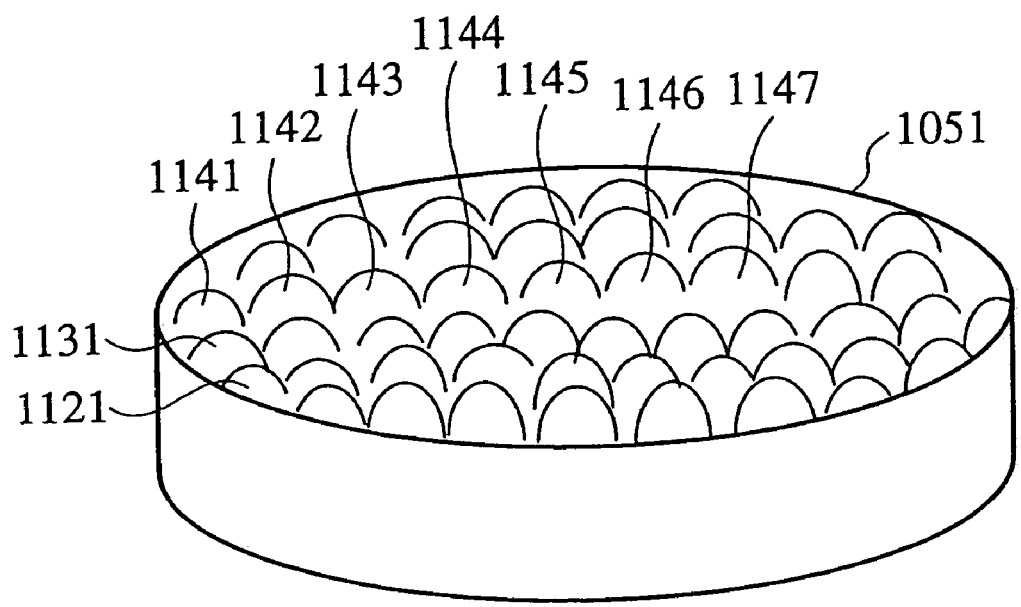
FIG. 32A are bird's-eye views of a lighting equipment (display unit) according to a twelfth embodiment of the present invention.

If a plurality of light-emitting units related to the first embodiment are arranged, a very bright lighting equipment and display unit can be implemented. To be concrete, one-dimensional, two-dimensional or three-dimensional arrangement of the light-emitting units may be possible. For example, as shown in FIG. 32A, if plural light-emitting units 1121, . . . ,1131, . . . ,1141, . . . are arranged two-dimensionally in circumstance case 1051, a traffic signal lamp can be implemented. In this case, employing the plural light-emitting units 1121, . . . ,1131, . . . ,1141, . . . installing molded LEDs, in each of which three pieces of red (R), green (G) and blue (B) double-sides-luminescence LED chips are stacked vertically on a transparent substrate, if each emission intensities of the red (R), green (G) and blue (B) LED chip is adjusted based on predetermined time schedule, red (R), yellow (Y) and green (G) can be displayed by the same lamp.

Figure 32B:
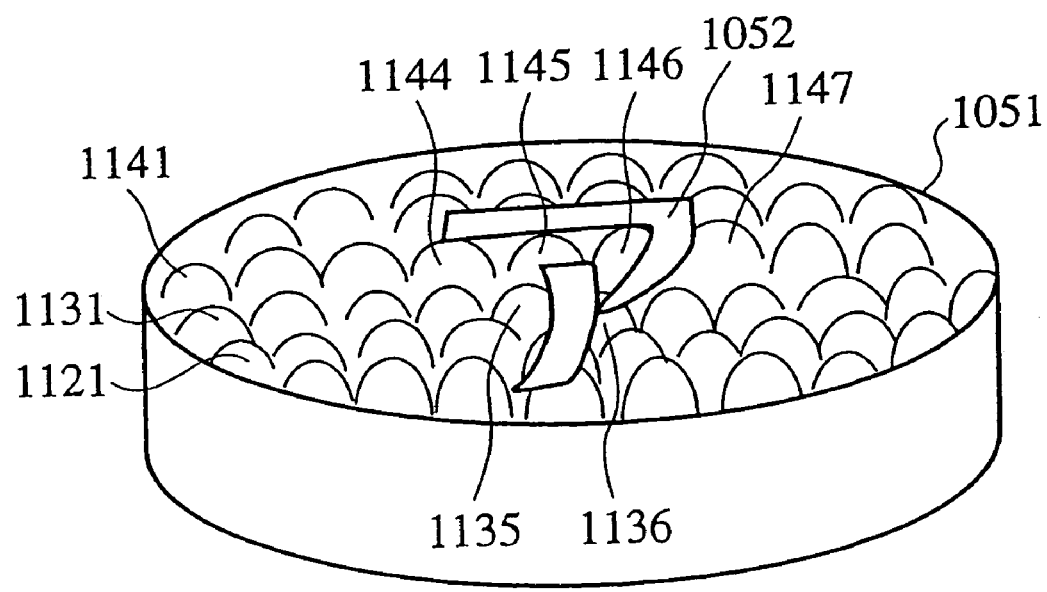
FIG. 32B shows a bird's-eye view of the display unit according to a modification of the twelfth embodiment of the present invention.

Furthermore, as shown in FIG. 32B, if grooves are cut at the surfaces of specific light-emitting units 135,136,144, 145,146,147 among plural light-emitting units 1121, . . . , 1131, . . . ,1141, . . . two-dimensionally arranged, modifications of the optical path and the optical intensity can be implemented at these portions so that we can display predetermined display pattern 1052. For example, an image of human walk can be embossed on two-dimensional array pattern of the traffic signal lamp at crosswalk.

Figure 33:
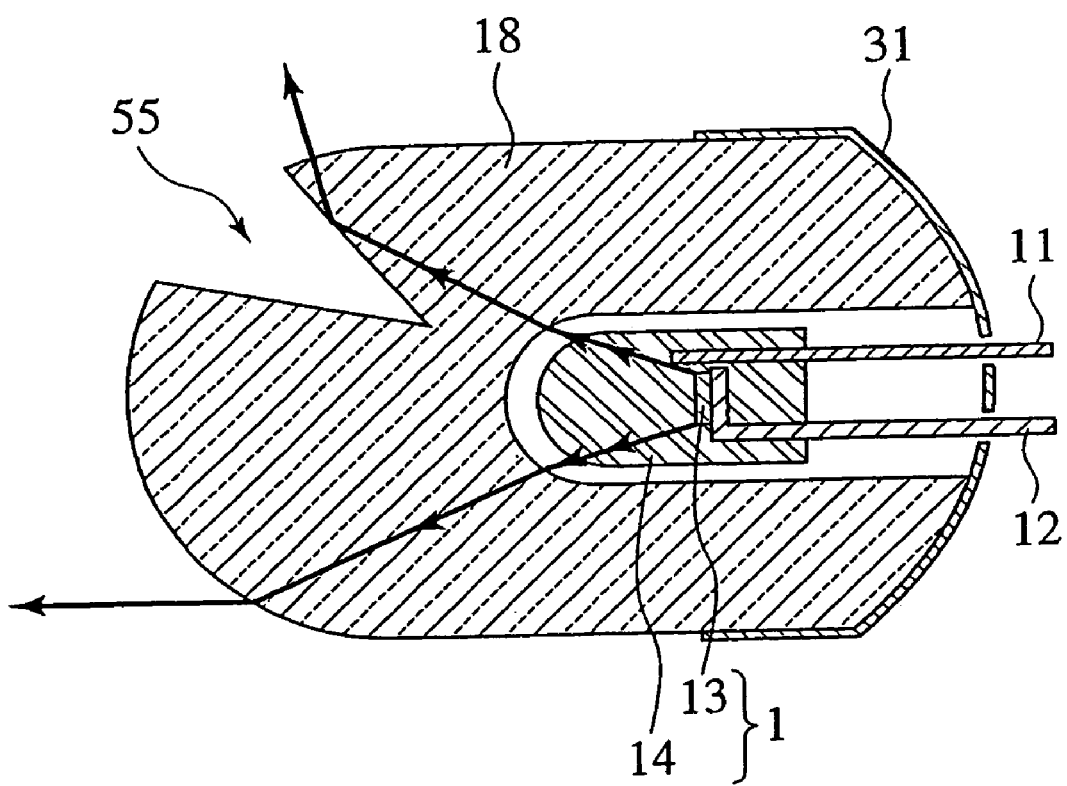
FIG. 33 shows a schematic cross-sectional view of a light-emitting unit to be used in the display unit shown in FIG. 32B.

FIG. 33 is cross-sectional view showing an example of the light-emitting unit, in which a groove is cut on a part of the top surface. That is to say, a light-emitting unit related to twelfth embodiment of the present invention embraces a bulk-shaped lens 18 having at least a top surface serving as a luminescence surface, a bottom surface facing to the top surface, a lens body connecting the bottom surface to the top surface, a concavity formed from a part of the bottom surface to the top surface direction in the inside of the lens body, a groove 55 cut at a part of the top surface to the concavity direction in the lens body, and a semiconductor light-emitting element 1 installed in the concavity. The shape of the groove 55 is not limited to the V-shape as shown in FIG. 33, but various cross-sectional shapes such as U-shape and W-shape can be employed, and the direction and location of the groove can be changed depending on the contents of information to be displayed. By cases, a large groove eliminating all of the front surface (the top surface) of the bulk-shaped lens 18 can be included here. Except that the groove 55 is cut at the top surface of the bulk-shaped lens 18, it is basically similar to the light-emitting unit of the first embodiment, and the overlapped description is omitted.

By cutting the groove 55 at the top surface of the bulk-shaped lens 18 as shown in FIG. 33, and arranging the bulk-shaped lenses in the two-dimensional array as shown in FIG. 32B, the modifications of the optical path and the optical intensity is controlled by the disposition and the geometry of the groove 55, and predetermined display pattern 1052 as shown in FIG. 32B can be easily displayed.

Thirteenth Embodiment

Figure 34A:
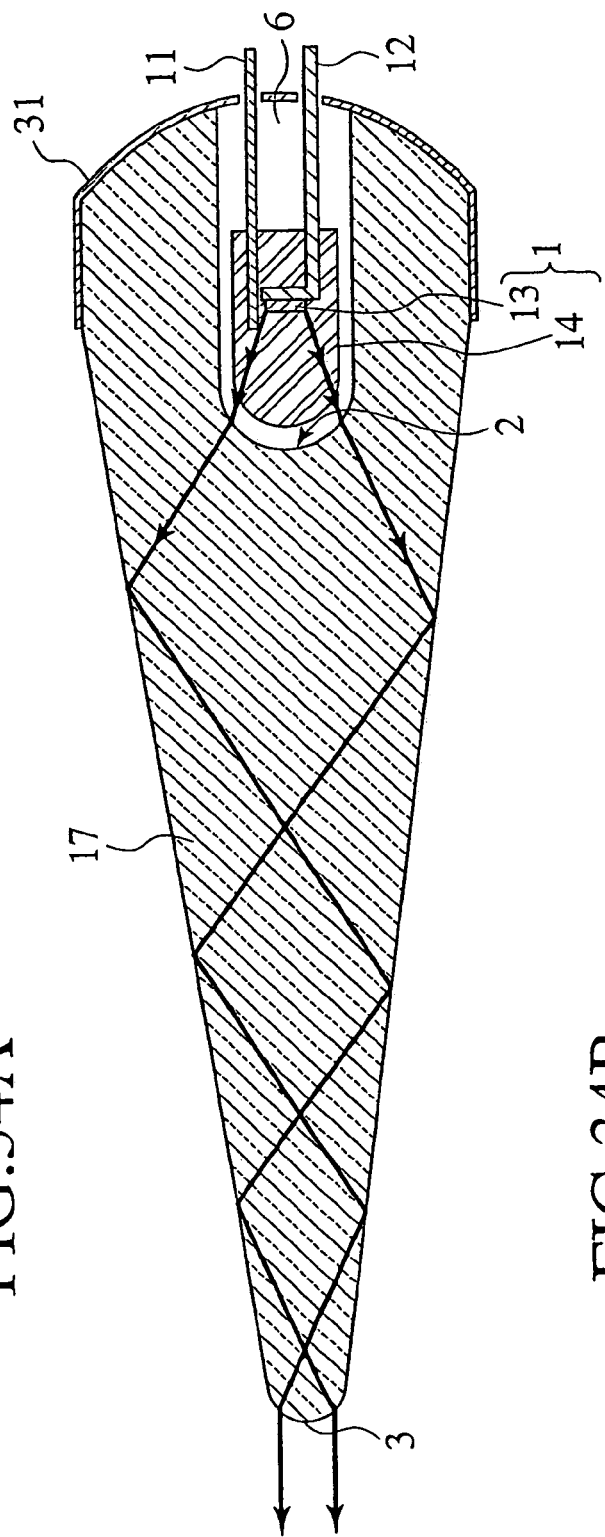
FIG. 34A shows a schematic cross-sectional view of a light-emitting unit according to a thirteenth embodiment of the present invention.

For example, the geometry of the bulk-shaped lens of the present invention is not limited to the geometry of the bullet-shape analogy shown in FIG. 1, or the egg-shape (cocoon-shape) analogy shown in FIG. 14B, and it is possible to employ a configuration as shown in FIG. 34A, in which the diameter gradually becomes smaller approaching toward the tip portion. By extending the bulk-shaped lens 17 into a long and thin topology as shown in FIG. 34A, the light flux is guided to the tip of the bulk-shaped lens 17, similar to the light propagation behavior observed in an optical fiber, and we can obtain a finely focused high intensity optical beam from the tip of the bulk-shaped lens 17.

Figure 34B:
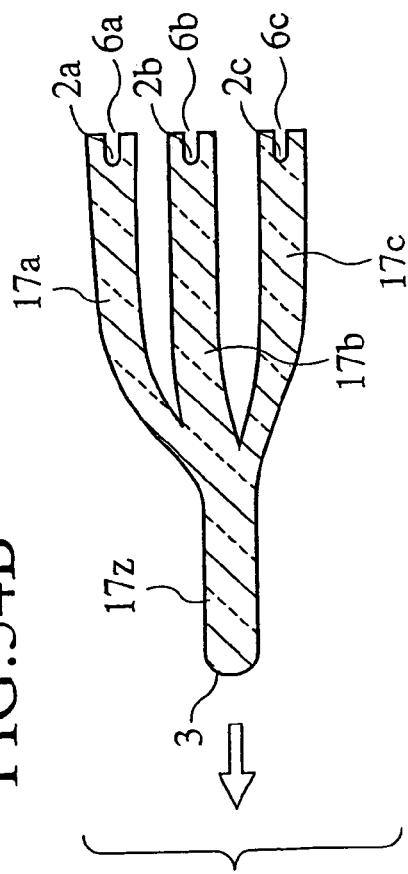
FIG. 34B shows a schematic cross-sectional view of an optical mixing device, in which the light-emitting units shown in the thirteenth embodiment of the present invention are merged.

Furthermore, as shown in FIG. 34B, we can merge the plural bulk-shaped lens 17a, 17b, 17c, . . . into a single bulk-shaped lens 17z so as to implement an optical mixer. That is to say, if the plural lights from plural light sources, each installed in each of storing cavities 6a, 6b, 6c, are incident to respective entrance surfaces 2a, 2b, 2c, strong synthesized light can be emitted from the exit surface 3 of the bulk-shaped lens 17z.

14th Embodiment

In addition, as shown in FIG. 35, the top surface serving as the luminescence surface may embrace a first curved surface 7071 and a second curved surface 7072. We can consider the configuration shown in FIG. 35 as if a part of the optical path modification portion 36 of FIG. 28 has been forced out from the top surface of the bulk-shaped lens 28 so as to implement a top surface concavity 7073. And as same as FIG. 28, because luminous flux density around the central portion of the luminescence surface increases, the lighting around the central portion of the optical axis is relatively bright is achieved.

15th Embodiment

Figure 36A:
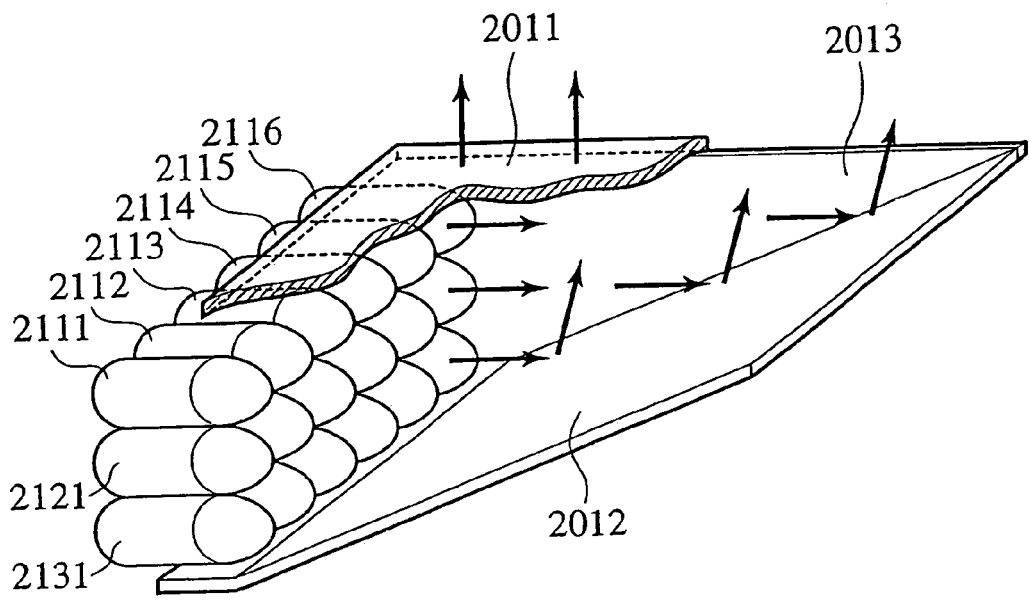
FIG. 36A shows a partially broken bird's-eye view of a two-dimensional light-emitting unit according to a 15th embodiment of the present invention.
Figure 36B:
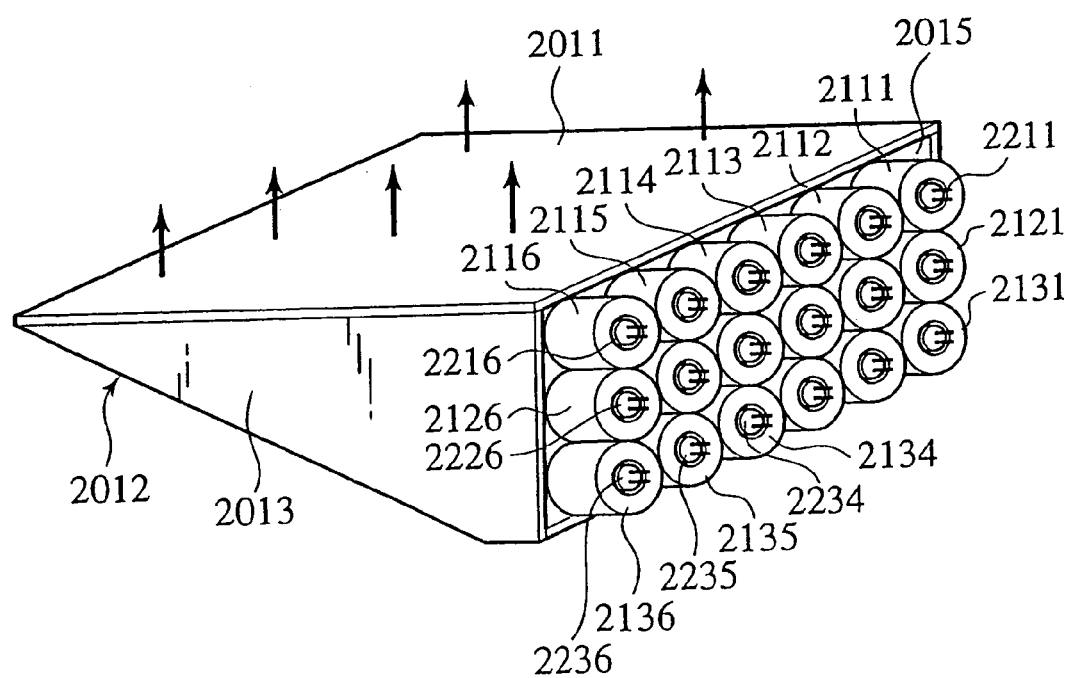
FIG. 36B shows a bird's-eye view of the two-dimensional light-emitting unit, shown from a different orientation from the FIG. 36A.

As shown in FIGS. 36A and 36B, a planar-light-emitting unit related to 15th embodiment of the present invention embraces at least a plurality of LEDs 2211,2212, 2213, . . . , 2216,2221, . . . ,2226,2231, . . . ,2236 each emits a predetermined wavelength light, a plurality of bulk-shaped lenses 2111,2112,2113, . . . ,2116, 2121, . . . ,2126, 2131, . . . ,2136, each installing a main luminescence portion of the respective LED and emitting light of the LED with a constant directivity, and a main reflector 2012 made of a plane mirror reflecting back the lights from the plural bulk-shaped lenses, a semitransparent plate 2011 transmitting the lights reflected back at the main reflector, the semitransparent plate is disposed in a configuration having a constant angle with the main reflector. And, the planar-light-emitting unit related to the 15th embodiment of the present invention encompasses further a side reflector (the first side reflector) 2013 between the main reflector 2012 and the semitransparent plate 2011. Although the illustration is omitted, another side reflector (the second side reflector) is facing to the side reflector 2013. Plural LEDs 2211,2212, 2213, . . . ,2216,2221, . . . ,2226, 2231, . . . ,2236 are fixed each other by backplate 2015. A triangular prismatic cavity is formed by the main reflector 2012, the semitransparent plate 2011, the side reflector (the first side reflector) 2013, another side reflector (the second side reflector) and backplate 2015. Although the illustration is omitted, the plural LEDs 2211,2212,2213, . . . ,2216,2221, . . . ,2226, 2231, . . . ,2236 are connected to LED socket, and predetermined voltages are applied to the LEDs. In FIGS. 36A and 36B, commercial 100V power can drive the LEDs, because these LEDs are arranged in 3*6=18, and if all of the LEDs are connected in series.

As already indicated in FIG. 1, the bulk-shaped lens 2116 for the planar-light-emitting unit related to the 15th embodiment of the present invention, is configured to nearly completely encapsulate the main luminescence portion of the LED. The concavity implemented in the bulk-shaped lens 2116 installing the main luminescence portion of LED 2216 has a ceiling surface identified as the first curved surface. Furthermore, the bulk-shaped lens 2116 embraces a top surface identified as the second curved surface emitting the light, facing the first curved surface.

The main reflector 2012, the first and second side reflectors are configured such that they have polished surfaces of metals such as aluminum (Al), brass, stainless, and etc., and furthermore, nickel (Ni) film and/or gold (Au) film may be plated on the surfaces of them. Or, the configuration in which a high reflectivity metallic thin film such as Al foil or the high reflectivity polyester white film was bonded to the surface of resin substrate can be employed. As the semitransparent plate 2011, an opalescent plate such as the resin plate in which white pulverized coal of high refractive index is dispersed in resin (to be concrete, such as the methacrylic resin opalescent plate is preferable). Or, the semitransparent plate 2011 may be made of a rough surfaced opalescent plate, a rough surfaced transparent plate, or a molded resin sheet in the configuration embracing a transparent molding material and other light scattering corpuscles are kneaded to the transparent molding material. Or, the semitransparent plate 2011 may be implemented by sticking a resin film on the surface, on a side or both sides of the resin film is delustered by a rough surface work. Furthermore, the semitransparent plate 2011 can accept colored or a transparent material depending on the luminous color of the LED.

As the bulk-shaped lens 2116 to be used in the planar-light-emitting unit related to the 15th embodiment of the present invention, various kinds of glass materials, transparent plastic materials, crystalline materials explained in the first embodiment can be employed, and even a colored resin and resin including luminescence material can be accepted. Among them, transparent plastic materials such as acryl resin are preferable for mass production of the bulk-shaped lens 2116. That is to say, die is made once, and if the bulk-shaped lenses 2116 are molded by this die, they may be easily mass-produced.

According to the planar-light-emitting unit related to the 15th embodiment of the present invention, without requiring large number LEDs, desired illumination intensity having uniformity over a large area is obtained. In addition to the feature of low power consumption, because it is the lighting without flickering, a slight change of fine gradation, such as the neutral tints, on the X-ray film can be easily observed. Or, worry of fatigue of eyes due to the flickering, or worry of the affect to human body from the fatigue of eyes can be eliminated. In addition, in FIGS. 36A and 36B, plural bulk-shaped lenses 2111,2112,2113, . . . ,2116, 2121, . . . , 2126,2131, . . . , 2136 are disposed in 3*6 matrix form, but, it is not necessary to limit to such matrix-form arrangement. For example, the position of the first level plural bulk-shaped lens 2131, . . . ,2136 can shift from the position of the second level plural bulk-shaped lens 2121, . . . 2126 by ½ pitch, and the position of the third level plural bulk-shaped lens 2111, . . . ,2116 can shift similarly from the second level plural bulk-shaped lens 2121, . . . ,2126 by ½ pitch so as to implement the close-packed arrangement.

16th Embodiment

Figure 37A:
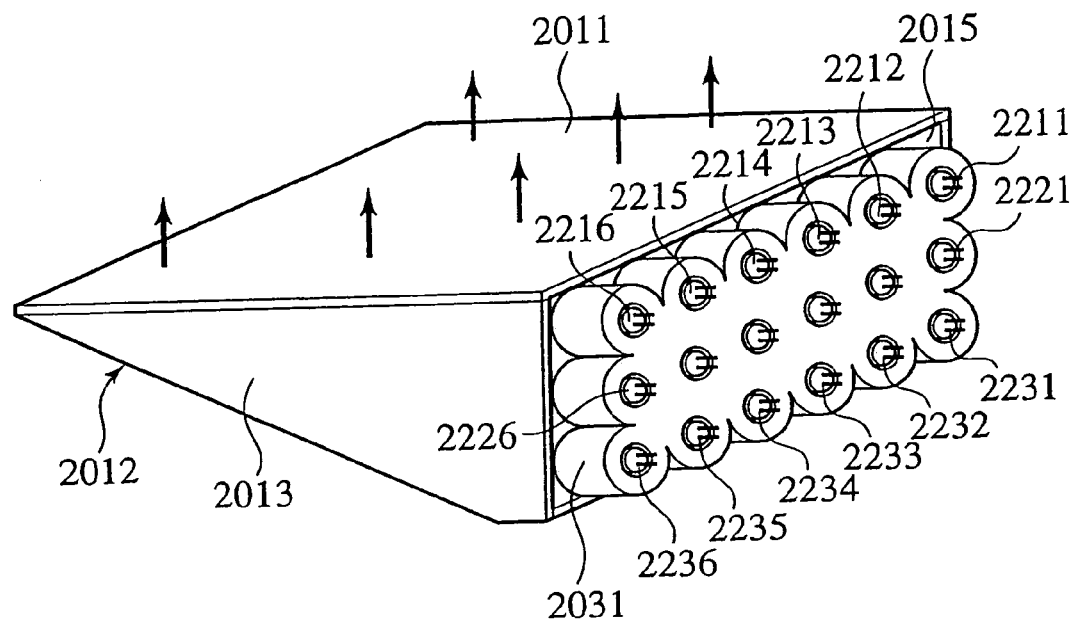
FIG. 37A shows a bird's-eye view of a two-dimensional light-emitting unit according to a 16th embodiment.

As shown in FIG. 37A, a planar-light-emitting unit related to the 16th embodiment of the present invention embraces at least an integrated lens 2031 having plural concavities and plural convex portions facing to the plural concavities, plural LEDs 2211,2212,2213, . . . ,2216,2221, . . . ,2226, 2231, . . . ,2236, installed in the plural concavities, each of LEDs emitting light of predetermined wavelength, a main reflector 2012 identified by a plane mirror reflecting back light from the plural convex portions (but the main reflector is not illustrated clearly, because it becoming the rear face side in bird's eye view of FIG. 37A.) and a semitransparent plate 2011 transmitting lights reflected back at the main reflector 2012, the semitransparent plate is disposed so as to define a constant angle with the main reflector 2012. And, the planar-light-emitting unit related to the 16th embodiment of the present invention, further embraces a side reflector (the first side reflector) 2013 arranged between the main reflector 2012 and the semitransparent plate 2011. Although the illustration is omitted, as it becomes the rear face side of the bird's eye view shown in FIG. 37A, there is another side reflector (the second side reflector) facing to the side reflector 2013. The integrated lens 2031 is fixed to the backplate 2015. By the main reflector 2012, the semitransparent plate 2011, the side reflector (the first side reflector) 2013, the another side reflector (the second side reflector) and backplate 2015, a triangular prismatic cavity is implemented similar to the configuration explained in the 15th embodiment. In addition, although the illustration is omitted, the plural LEDs 2211,2212,2213, . . . ,2216,2221, . . . ,2226, 2231, . . . ,2236 are connected to LED sockets, and supplied with predetermined voltage, respectively. The other configuration repeats the description in the 15th embodiment, and the overlapped description is omitted.

With above-mentioned integrated lens 2031, assembling process of the planar-light-emitting unit becomes easy. Therefore, according to the 15th embodiment, the productivity improves compared with a method by which a lot of bulk-shaped lenses are manufactured individually. And, if we install 3*6=18 pieces of LEDs in each of concavities in the integrated lens 2031, and these 18 pieces of LEDs are connected in series, the direct drive by the commercial 100V power becomes possible.

According to the planar-light-emitting unit related to the 16th embodiment of the present invention, the electric power is saved, and desired illumination intensity with uniformity over a large area can be easily got. In addition, because it is lighting without flickering, a slight change of fine gradation such as the neutral tints on the X-ray film can be easily observed. In addition, worry of fatigue of eyes is unnecessary, since there is no flickering.

Figure 37B:
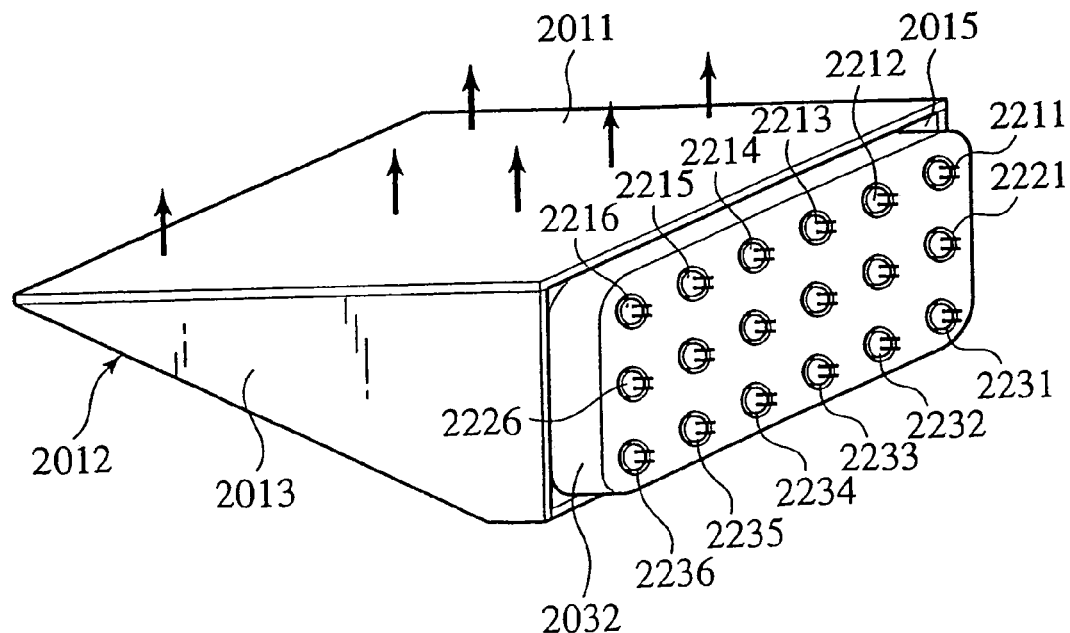
FIG. 37B shows a bird's-eye view of a two-dimensional light-emitting unit according to a modification of the 16th embodiment

FIG. 37B is schematic bird's eye view showing a planar-light-emitting unit related to a modification of the 16th embodiment of the present invention. Although the outer circumferential surface of integrated lens 2031 shown in FIG. 37A has a waveform geometry having plural cylindrical surfaces, the outer circumferential surface of the integrated lens 2032 shown in FIG. 37B is flat, different from the topology shown in FIG. 37A. Because other features are very similar to the planar-light-emitting unit related to the 16th embodiment of the present invention shown in FIG. 37A, the redundant description is omitted.

Figure 38:
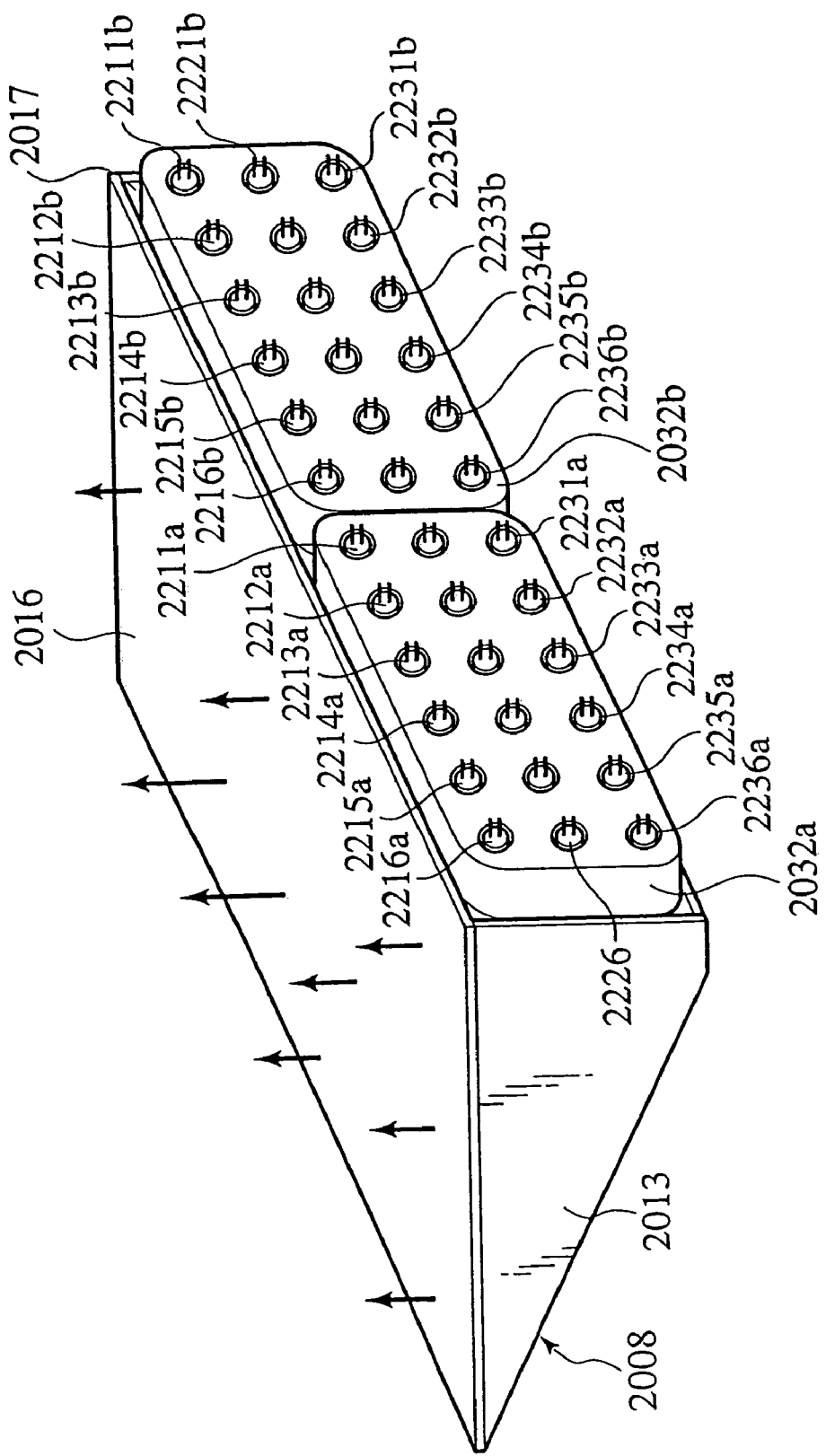
FIG. 38 shows a bird's-eye view of a two-dimensional light-emitting unit according to a modification other than the 16th embodiment

FIG. 38 is a schematic bird's-eye view showing a planar-light-emitting unit related to another modification of the 16th embodiment of the present invention, and it shows an example of a planar-light-emitting unit having a large surface area, in which two units are assembled, preparing the integrated lens 2032 shown in FIG. 37B as a unit. That is to say, in FIG. 38, the first integrated lens 2032a and the second integrated lens 2032b are disposed adjacently. And, in plural concavities of the first integrated lens 2032a, 18 pieces of LEDs 2211a, 2212a, 2213a, . . . ,2216a, 2221a, . . . , 2226a, 2231a, . . . ,2236a are installed, and in plural concavities of the second integrated lens 2032b, another 18 pieces of LEDs 2211b, 2212b, 2213b, . . . , 2216b, 2221b, . . . ,2226b, 2231b, . . . ,2236b are installed respectively. And, the planar-light-emitting unit related to another modification of the 16th embodiment of the present invention shown in FIG. 38, embraces at least a main reflector 2008 made of a plane mirror and a semitransparent plate 2016 transmitting the lights reflected back at main reflector 2008, between the main reflector 2008 and the semitransparent plate 2016 a constant angle is defined. The main reflector 2008 and semitransparent plate 2016 have areas two times larger than those of the main reflector 2012 and the semitransparent plate 2011 shown in FIG. 37B.

FIG. 39 is a schematic bird's-eye view showing a planar-light-emitting unit related to a still another modification of the 16th embodiment of the present invention. The planar-light-emitting unit assembles four units, the configuration of each units is same as the integrated lens 2032 in FIG. 37B, so as to implement further large surface area than the configuration shown in FIG. 38. That is to say, in FIG. 39, under a adjacency assembled structure of the first integrated lens 2032a and the second integrated lens 2032b, another adjacency structure of the third integrated lens 2032c and the fourth integrated lens 2032d are disposed so as to form a layered structure. And, the planar-light-emitting unit shown in FIG. 39 further embraces a main reflector 2009, identified by a plane mirror, and a semitransparent plate 2018 transmitting lights reflected back at the main reflector 2009, between the main reflector 2009 and the semitransparent plate 2018 a constant angle is defined. The area of the main reflector 2009 and the semitransparent plate 2018 can be designed to be four times lager than the main reflector 2012 and the semitransparent plate 2011 shown in FIG. 37B.

However, if an appropriate angle is chosen, the area of the main reflector 2009 and the semitransparent plate 2018 are not required to be made four 4 times larger.

17th Embodiment

As shown in FIG. 40, a planar-light-emitting unit related to 17th embodiment of the present invention, embraces at least plural LEDs 2211, . . . emitting light of predetermined wavelength, plural bulk-shaped lenses 2311, 2312, 2313, 2321, 2322, 2331, 2332, 2333, each of bulk-shaped lenses emitting light from corresponding LED with a constant directivity and main luminescence portion of the LED is installed in the bulk-shaped lens, a main reflector 2012 identified by a plane mirror reflecting back lights from the plural bulk-shaped lenses and a semitransparent plate 2011 transmitting lights reflected back at the main reflector, between the main reflector and the semitransparent plate a constant angle is defined. Each of the plural bulk-shaped lenses 2311, 2312, 2313, 2321, 2322, 2331, 2332, 2333, has a compressed geometry spreading to horizontal directions, which is different from the bulk-shaped lens of the planar-light-emitting unit related to the 15th embodiment of the present invention. Plural bulk-shaped lenses 2311, 2312, 2313 are stacked on the plural bulk-shaped lenses 2321, 2322 shifting off ½ pitch, and furthermore, the plural bulk-shaped lenses 2321, 2322 are stacked on the plural bulk-shaped lenses 2331, 2332, 2333 shifting off ½ pitch, similarly (but may be optionally arranged in 3*3 matrix-form same as the 15th embodiment of the present invention, of course). And the planar-light-emitting unit related to the 17th embodiment of the present invention embraces further a side reflector (a first side reflector) 2013 between the main reflector 2012 and the semitransparent plate 2011. Although the illustration is omitted, the planar-light-emitting unit embraces further another side reflector (a second side reflector) facing to the side reflector 2013. The plural LEDs 2211 . . . are fixed to the backplate 2015. A triangular prismatic cavity is implemented by the main reflector 2012, the semitransparent plate 2011, the side reflector (the second side reflector extends), the backplate 2015, and another side reflector (the first side reflector) 2013. Although the illustration is omitted, plural LEDs 2211, . . . are connected to LED sockets so that they can be supplied with predetermined voltage.

As shown in FIG. 40B, the compressed bulk-shaped lens 2311 related to the 17th embodiment of the present invention has major axis W and minor axis H. And, the compressed bulk-shaped lens 2311 encapsulates nearly completely the main luminescence portion of the LED 2211. The other plural compressed bulk-shaped lenses 2312, 2313, 2321, 2322, 2323, 2331, 2332, 2333 have similar geometries as shown in FIG. 40B. The compressed bulk-shaped lens 2311 encompasses a concavity installing a main luminescence portion of LED 2211, the concavity is aligned along the central axis of compressed bulk-shaped lens 2311, the concavity has a ceiling surface identified by a first curved surface, and the bulk-shaped lens is defined by a top surface identified by a second curved surface, emitting the light. The LED 2211 is a resin molded LED encompassing at least a first pin 11, a pedestal connected to the first pin 11, the pedestal merges with the first pin so as to form a single piece, a LED chip disposed on the pedestal, a resin mold encapsulating the LED chip, and a second pin 12 facing to the first pin 11. Because the resin molded LED 2211 is nearly completely confined in the concavity of the compressed bulk-shaped lens 2311, stray light components can contribute to lighting effectively.

That is to say, an inner wall portion of the concavity aside from the portion assigned as the entrance surface 2, identified by the first curved surface (the ceiling surface) can serve as the effective entrance surface of the light. Components of lights reflected back at each interfaces repeat multiple reflections in the concavity, between the LED 2211 and the concavity of the compressed bulk-shaped lens 2311, so as to generate stray light components. Because these stray light components beings confined in the inside of the concavity in the 17th embodiment of the present invention, the components can contribute to lighting finally. In this way, according to the compressed bulk-shaped lens 2311 related to the 17th embodiment of the present invention, desired light flux at the irradiation area serving as the light beam contributing to lighting can be achieved, without requiring large number of the resin molded LEDs 2211, and desired illumination intensity having uniformity over a large area can be easily achieved. Further, in addition to the feature of low power consumption, because it is lighting without flickering, a slight change of fine gradation, such as the neutral tints on the X-ray film can be easily observed. In addition, worry of fatigue of eyes is unnecessary, because the flickering is eliminated.

Other features overlap the description in the 15th embodiment, and these overlapped descriptions are omitted.

18th Embodiment

In the 15th to the 17th embodiments of the present invention, the planar-light-emitting units of a single directivity mode, in which light is emitted to one direction, are described. Simply, bonding two planar-light-emitting units of the single directivity mode back to back can assemble a planar-light-emitting unit of the double directivity mode, in which lights are emitted to two mutually opposing directions.

FIG. 41 is a diagram showing a planar-light-emitting unit of the 18th embodiment of the present invention, pertaining to other double directivity mode. In FIG. 41, the first integrated lens 2033a faces to the second integrated lens 2033b through a main reflector 2043 identified as a plane mirror. The main reflector 2043 is a double sided mirror, and is disposed between the first integrated lens 2033a and the second integrated lens 2033b diagonally. And, 18 pieces of concavities are cut in the first integrated lens 2033a so that 18 pieces of LEDs, the illustration of which is omitted, can be installed in the 18 pieces of concavities. Likewise, another 18 pieces of concavities are cut in the second integrated lens 2033b, so that another 18 pieces of LEDs 2211b, 2212b, 2213b, . . . ,2216b, 2221b, . . . ,2226b, 2231b, . . . ,2236b can be installed in the 18 pieces of concavities, respectively. Further, the planar-light-emitting unit of the double directivity mode related to the 18th embodiment of the present invention shown in FIG. 41 embraces at least a first semitransparent plate 2041 disposed so as to define a constant angle with the main reflector 2043, transmitting the light reflected at the main reflector 2043, a second semitransparent plate 2042 disposed along the direction parallel to the first semitransparent plate 2041, the second semitransparent plate 2042 is aligned to the opposite side with regard to the main reflector 2043. In FIG. 41, the light reflected at the front surface of the main reflector 2043 propagate upward, and the lights reflected at the rear face of the main reflector 2043 propagate downward. Other features are similar to the planar-light-emitting unit related to the 16th embodiment of the present invention, and therefore the redundant description is omitted.

According to the 18th embodiment of the present invention, without requiring large number of LEDs, the planar-light-emitting unit of the double directivity mode having desired illumination intensity with uniformity can be easily provided. In addition, the planar-light-emitting unit of the double directivity mode dissipates low power and achieves the double-sided lighting, without accompanied by flickering.

19th Embodiment

Figure 42:
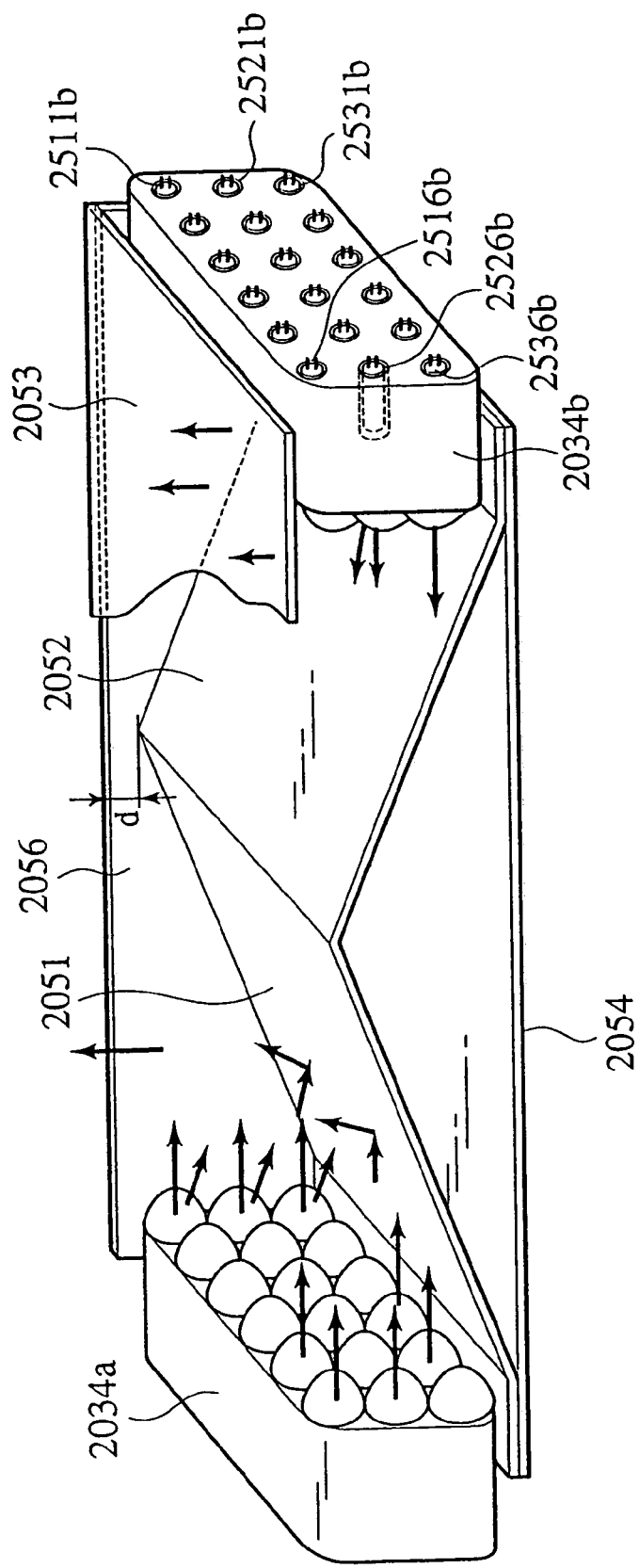
FIG. 42 shows a partially broken bird's-eye view of a two-dimensional light-emitting unit according to a 19th embodiment

FIG. 42 shows a planar-light-emitting unit of another single directivity mode according to 19th embodiment of the present invention. In FIG. 42, a first integrated lens 2034*a* faces to a second integrated lens 2034*b* through a Λ (lambda)-shaped main reflector. The lambda-shaped main reflector embraces a first reflector 2051 identified by a plane mirror and a second reflector 2052 identified by another plane mirror. The first main reflector 2051 is a plane mirror reflecting back the light from the first integrated lens 2034*a* mainly, and the second main reflector 2052 is another plane mirror reflecting back the light from the second integrated lens 2034*b* mainly. And 18 pieces of concavities are cut in the first integrated lens 2034*a*, the 18 pieces of LEDs, the illustration of which are omitted, are installed in the 18 pieces of concavities. Likewise, another 18 pieces of concavities are cut in the second integrated lens 2034*b*, and another 18 pieces of LEDs 2511*b*, . . . ,2516*b*, 2521*b*, . . . , 2526*b*, 2531*b*, . . . ,2536*b* are installed in the 18 pieces of concavities, respectively. And, as shown in FIG. 42, the planar-light-emitting unit related to the 19th embodiment of the present invention embraces further a semitransparent plate 2053 transmitting the lights reflected at the first main reflector 2051 and the second main reflector 2052, the semitransparent plate 2053 is configured to define constant angles with the first main reflector 2051 and the second main reflector 2052. In a direction parallel to the plane of the semitransparent plate 2053, a bottom plate 2054 is disposed in an opposite side with regard to the first main reflector 2051 and the second main reflector 20521. As shown in FIG. 42, a joint portion between the first main reflector 2051 and the second main reflector 2052, or a lambda-shaped top is separated from the semitransparent plate 2053 with distance d By providing the distance d between the lambda-shaped top and the semitransparent plate 2053, the shade of the lambda-shaped top cannot be observed from the front surface of the semitransparent plate 2053. Because other features are similar to the planar-light-emitting unit explained in the 16th embodiment of the present invention, the redundant description is omitted.

According to the planar-light-emitting unit related to the 19th embodiment of the present invention, a large area and longitudinally long size can be lighted up uniformly without requiring large number of LEDs. In addition, illumination intensity can be increased enough. And, the lighting of low power dissipation, which is not accompanied by flickering, is possible.

Figure 43:
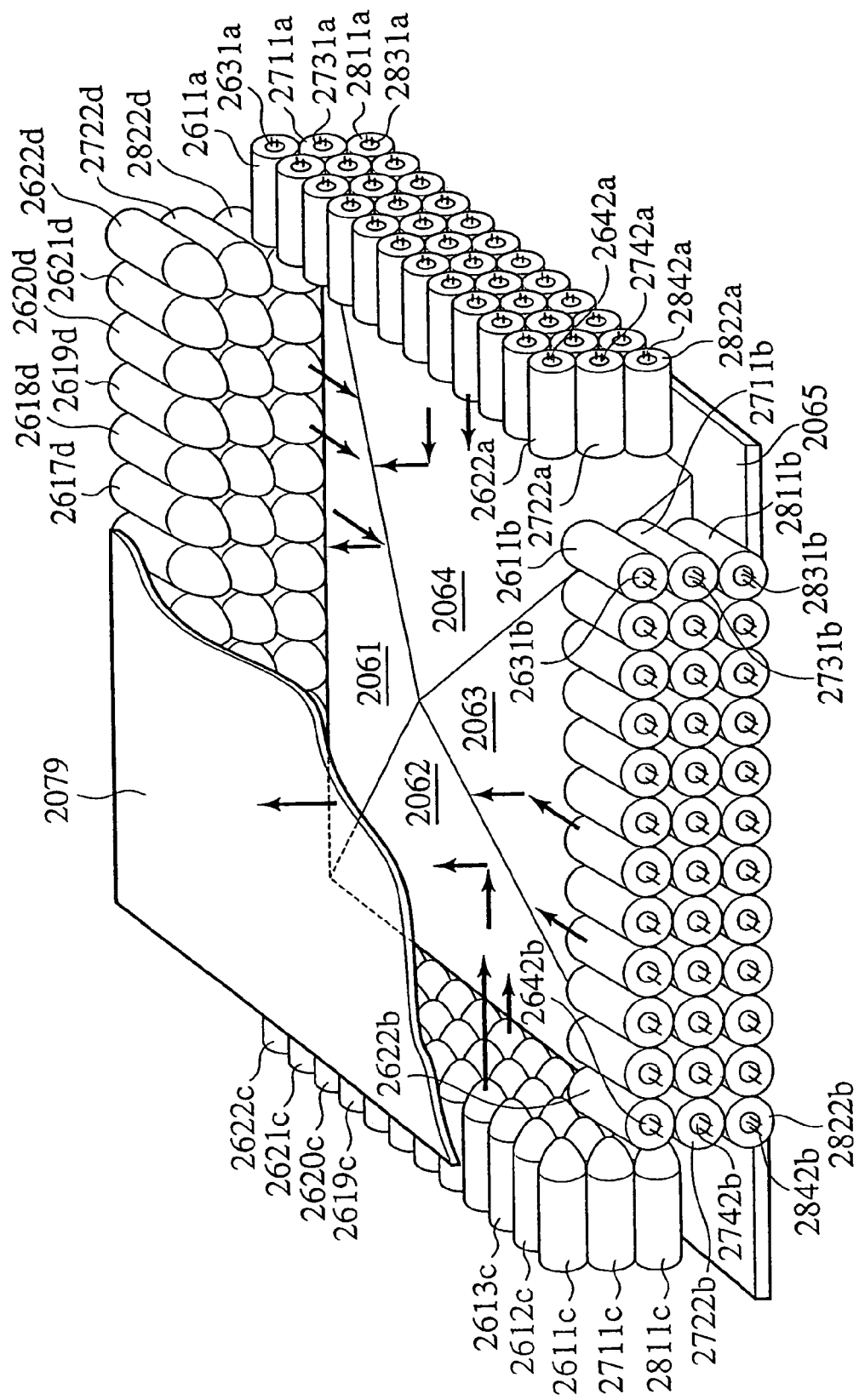
FIG. 43 shows a partially broken bird's-eye view of a two-dimensional light-emitting unit according to a modification of the 19th embodiment FIG. 44A are schematic cross-sectional views of a hand-held instrument (portable lighting equipment) according to a 20th embodiment of the present invention

FIG. 43 is schematic bird's eye view showing a planar-light-emitting unit related to a modification of the 19th embodiment of the present invention. As shown in FIG. 43, the planar-light-emitting unit related embraces a square pyramid (a quadrangular pyramid) defined by a first main reflector 2061, a second main reflector 2062, a third main reflector 2063 and fourth main reflector 2064, each reflectors is identified by a plane mirror, the square pyramid disposed in a central portion, and four walls disposed along four bases of the square pyramid, each of the four walls encompasses an assemblage identified by 3*12=36 pieces of bulk-shaped lenses, three levels of 12 pieces of bulk-shaped lenses are stacked in the assemblage. That is to say, along the base of the isosceles triangle serves as the first main reflector 2061, a plurality of bulk-shaped lenses 2622*d*, 2621*d*, 2620*d*, . . . , 2722*d*, . . . ,2822*d* are stacked, along the base of an isosceles triangle serving as the second main reflector 2062, a plurality of bulk-shaped lenses 2611*c*, 2612*c*, 613*c*, . . . ,2622*c*, 2711*c*, . . . ,2811*c* are stacked. Furthermore, along the base of an isosceles triangle serving as the third main reflector 2063, a plurality of bulk-shaped lenses 2611*b*, . . . ,2622*b*, 2711*b*, . . . ,2722*b*, 2811*b*, . . . ,2822*b* are stacked, and along the base of an isosceles triangle serving as the fourth main reflector 2064, a plurality of bulk-shaped lenses 2611*a*, . . . ,2622*a*, 2711*a*, . . . ,2722*a*, 2811*a*, . . . , 2822*a* are stacked. In the bulk-shaped lenses 2611*b*, . . . , 2622*b*, 2711*b*, . . . 2722*b*, 2811*b*, . . . ,2822*b* and bulk-shaped lenses 2611*a*, . . . ,2622*a*, 2711*a*, . . . ,2722*a*, 2811*a*, . . . ,2822*a*, LEDs 2631*b*, . . . ,2642*b*, 2731*b*, . . . ,2742*b*, 2831*b*, . . . , 2842*b* and LEDs 2631*a*, . . . ,2642*a*, 2731*a*, . . . ,2742*a*, 2831*a*, . . . ,2842*a* are installed respectively. Although the illustration is omitted, the bulk-shaped lenses 2622*d*, 2621*d*, 2620*d*, . . . ,2722*d*, . . . ,2822*d* and the bulk-shaped lenses 2611*c*, 2612*c*, 2613*c*, . . . ,2622*c*, 2711*c*, . . . , 2811*c*, install LEDs, respectively, of course. In this way, around the quadrangular pyramid, four walls identified by the assemblage of 3*12*4=144 pieces of the bulk-shaped lenses surrounds, and 3*12*4=144 pieces of LEDs are disposed, respectively. And, as shown in FIG. 43, the planar-light-emitting unit further embraces a semitransparent plate 2079 transmitting the lights reflected at the first main reflector 2061, the second main reflector 2062, the third main reflector 2063 and the fourth main reflector 2064 first main reflector 2061, the semitransparent plate 2079 is configured to define constant angles with the first main reflector 2061, the second main reflector 2062, the third main reflector 2063 and the fourth main reflector 2064. In direction parallel to the semitransparent plate 2079, and in the opposite side of the semitransparent plate 2079 with regard to the first main reflector 2061, the second main reflector 2062, the third main reflector 2063 and the fourth main reflector 2064, a bottom plate 2065 is disposed. Although the illustration is omitted, similar to the configuration shown in FIG. 42, a top of the quadrangular pyramid is separated from the semitransparent plate 2079 with a constant distance d. By separating the top of the quadrangular pyramid from the semitransparent plate 2079 with the constant distance d, the shade of the top of the quadrangular pyramid cannot be observed from the front surface of the semitransparent plate 2079. Other features are similar to the planar-light-emitting unit related to the 15th embodiment of the present invention, and the redundant description is omitted. In addition, the configuration in which four integrated lenses surround the circumference of the quadrangular pyramid, where the integrated lens is shown in FIG. 42, is possible.

According to the planar-light-emitting unit related to a modification of the 19th embodiment of the present invention as shown in FIG. 43, a comparatively thin planar-light-emitting unit having a large luminescence area can be provided. If the luminescence area of the planar-light-emitting unit becomes larger and larger, the effectiveness of reducing the number of LEDs becomes remarkable. That is to say, according to the planar-light-emitting unit related to the modification of the 19th embodiment of the present invention, comparing with earlier case in which the bulk-shaped lenses are not employed, number of LEDs employed become less than or equal to around ¼-¹⁄₁₀, and the reduction of number of LEDs by several hundred level is implemented, and therefore, unit price per area can be reduced.

20th Embodiment

For the resin molded LED 1 as shown in FIG. 1, if a battery case configured to apply predetermined voltage is prepared so as to install a battery (an AA size battery, for example), a slender flashlight of pen type (a portable lighting equipment) is implemented. And electrodes of LED 1 are connected to anode and cathode of the battery. As a result, with a simple configuration, the flashlight (the portable lighting equipment) can be provided with low manufacturing cost. The flashlights (the portable lighting equipment) are superior in stability and reliability for a long term. In particular, because the power dissipation is low, the performance that life time of the battery is long can be achieved, which is not expected by earlier technologies.

Figure 44A:
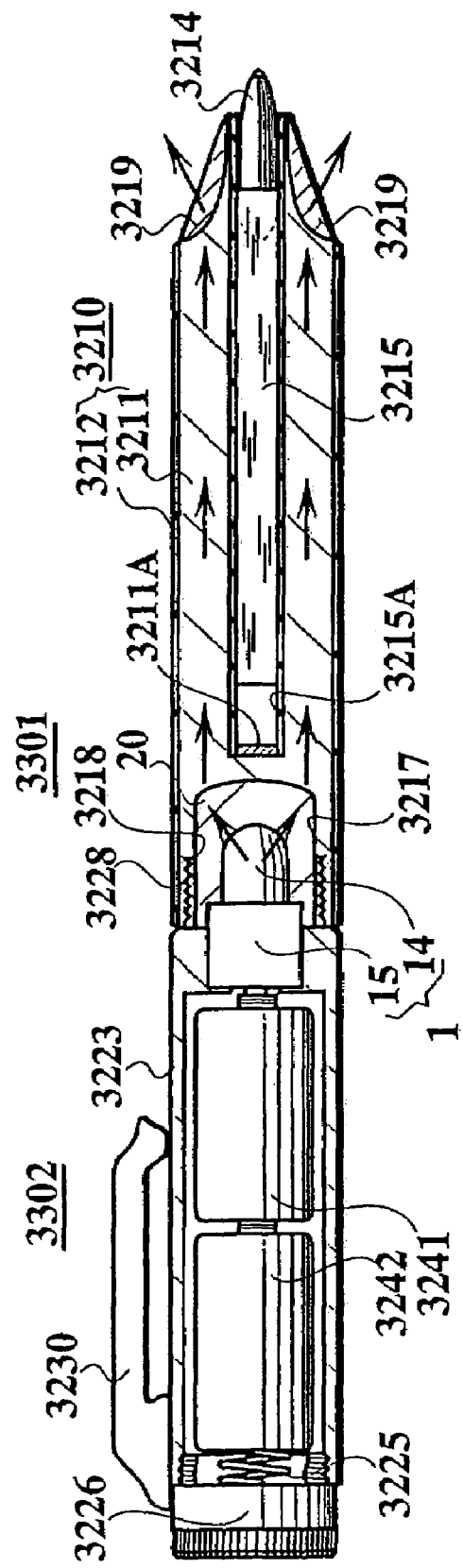
FIG. 44B is a partially broken bird's-eye view of the hand-held instrument shown in FIG. 44A, showing the disassembled state.
Figure 44B:
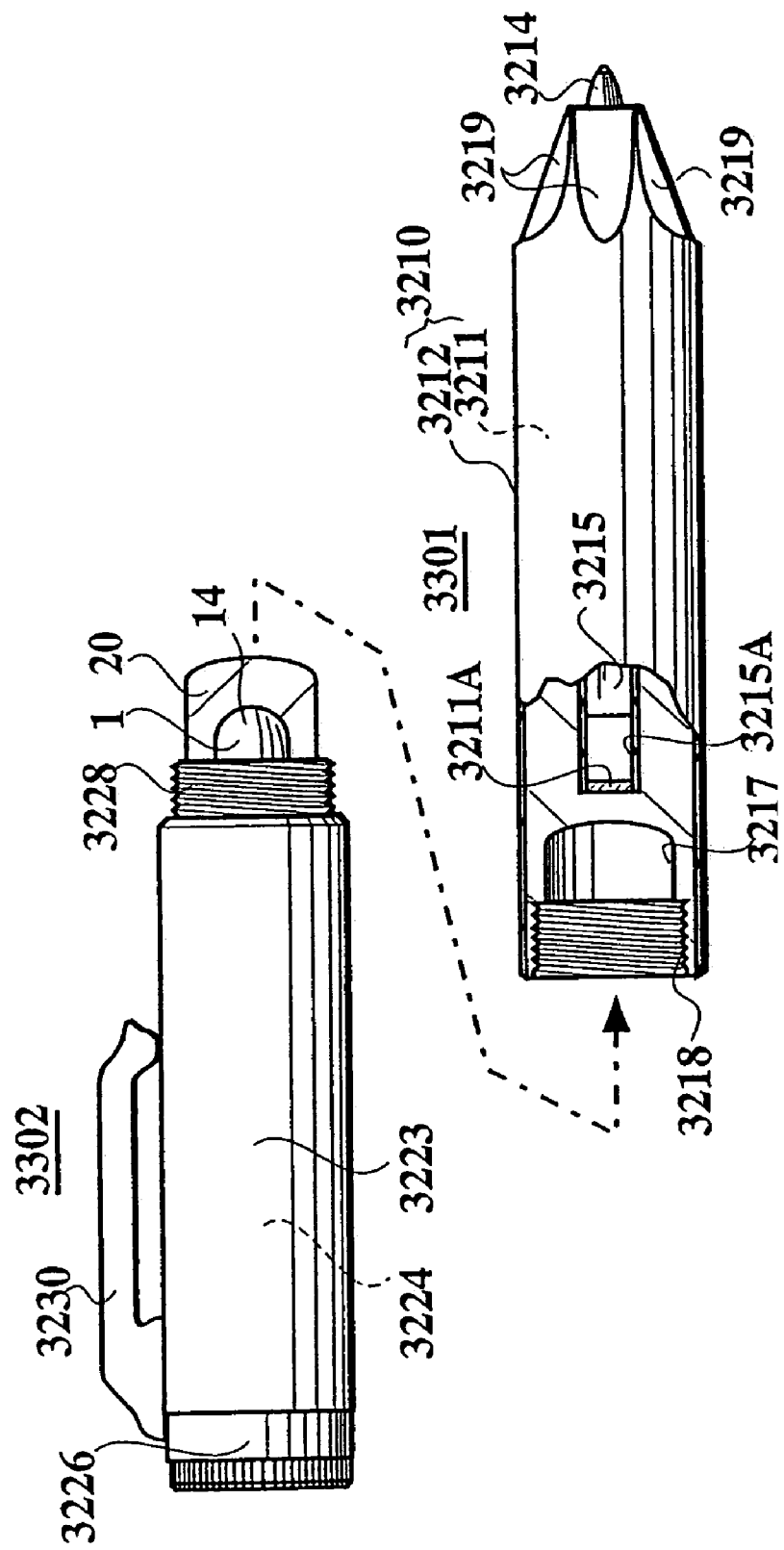

As shown in FIG. 44A and FIG. 44B, a hand-held instrument related to 20th embodiment of the present invention is a ballpoint pen, which embraces a visible light LED 1 serving as a semiconductor light-emitting element configured to output light of predetermined wavelength, the LED is mold by resin 14, and the light is emitted from the top surface of the resin 14, a power supply unit 3241,3242 configured to drive the semiconductor light-emitting element (visible light LED) 1, a bulk-shaped lens 20 having a top surface identified by a curved surface, configured to emit the light of semiconductor light-emitting element (visible light LED) 1, a concavity configured to install the resin 14, the concavity is implemented in the inside of the bulk-shaped lens, a holdings shank (a penholder) 3210 serving as a waveguide portion 3211 implementing a hollow space 3217 configured to install the bulk-shaped lens 20. And the waveguide portion 3211 has a cylindrical hollow space, and a central axis member (a ink cartridge) 3215 is installed in the hollow space. Furthermore, the hand-held instrument related to the 20th embodiment of the present invention embraces a power supply unit 3241,3242 driving the semiconductor light-emitting element (visible light LED) 1, and an electric switch portion 3226 controlling the power feeding from the power supply unit 3241,3242. At a tip portion of the pen point (operation-tip) 3214 of the ballpoint pen, a steel ball rotating freely, configured to supply appropriate ink to the surface of paper is arranged. As the steel ball, any commercially available dimensions such as diameter of 0.2 mm$^\Phi$-0.8 mm$^\Phi$ can be employed.

And, as shown in FIG. 44B, the hand-held instruments (the ballpoint pen) can be disassembled into a writing body 3301 and a lighting body 3302 so that the lighting body 3302 can be independently used. That is to say, the hand-held instruments (the ballpoint pen) is configured such that the lighting body 3302 can be freely attached/released to/from the writing body 3301.

In FIG. 44A and FIG. 44B, the ink cartridge 3215 can be installed from the pen point portion at the right side to toward the left side in the cartridge installation cavity 3215A, which is arranged in the central axis member of the penholder 3210. In addition, when the ink cartridge 3215 must be changed after the ink becomes empty, the ink cartridge 3215 can be detached from the left side to the right side, through the cartridge installation cavity 3215A.

For the waveguide portion 3211, a plastic material such as a comparatively lightweight transparent acryl resin, whose transmittance to the wavelength of the LED light is high, and by which the fabrication is easy, can be employed. In accordance with preference, when the feeling of weighty to the writing body 3301 and the easiness of writing are required, we can use transparent glass materials or transparent crystalline materials described in the first embodiment for the waveguide portion 3211. For example, the penholder 3210 can be formed such that it has diameter of 12 mm and overall length of about 150 mm.

Except the optical dispersion portion 3219, which will be described below, the coating layer 3212 is arranged mostly on the surface of the waveguide portion 3211, but the coating layer 3212 may be omitted by case. If we want to focus the light to the pen point portion, the coating layer 3212 should be used. Namely, in the case when the light from penholder 3210 is used as the spot lighting, the coating layer 3212 should be arranged. As the coating layer 3212 intended for the spot lighting, a high reflectivity metallic coating layer can be employed for protecting the surface of the waveguide portion 3211, and raising the transmission efficiency of the light in the waveguide portion 3211 at wavelength of the LED light. In addition, as the coating layer 3212, to improve the fashionable nature, or the decorative nature, a skeleton type (semitransparent) colored resin coating layer of moderate transparency or an opaque colored resin coating layer can be employed. In addition, for the coating layer 3212, rubber coating layer and painted coating layer can be employed, if the optical transmittance of certain level can be manifested. For example, by using transmitted light from the coating layer 3212 effectively, it can be used as a penlight such as a security hand-held instrument for night walk or an amusement hand-held instrument in a concert meeting place.

By processing the edge surface of the waveguide portion 3211, the optical dispersion portion 3219 can be implemented. For example, a methodology configured to cut plural concavities having V-shaped, U-shaped, or splay-shaped geometry on the end of waveguide portion 3211, a methodology forming fine irregularities on the end of waveguide portion 3211, or methodologies fogging up the end of waveguide portion 3211 to the state of high frosted glass of comparatively high transparency can be employed. Furthermore, fine grains of transparent materials such as glass can be coated or bonded to the end of the waveguide portion 3211. At all events, we can adopt optical designs such that the light being condensed and transmitted through the waveguide portion 3211 can be dispersed moderately by the optical dispersion portion 3219 so that we can locally light up brightly on the surface of paper to the extent necessary for the writing work in the dark.

As shown in FIG. 44A and FIG. 44B, at the leftmost edge of the writing body 3301, a bulk-shaped lens engager 3217, serving as the hollow space configured to install the bulk-shaped lens 20 of the present invention, is arranged. The bulk-shaped lens engager 3217 is, so to speak, a socket portion (female unit) configured to install the bulk-shaped lens 20. In other words, the bulk-shaped lens (plug portion: male unit) 20 of the lighting body 3302 is inserted in the bulk-shaped lens engager 3217 so as to be connected to the engager. A ceiling surface of the hollow space of the engager is identified by a concave surface having radius of curvature approximately same as the top surface of the bulk-shaped lens (plug portion: male unit) 20, and is configured such that the light from the bulk-shaped lens 20 is effectively guided to the waveguide portion 3211. In addition, inside diameter of the hollow space of the engager is set slightly lager than the outside diameter (a portion aside from the top surface) of the bulk-shaped lens (plug portion: male unit) 20, for example, around 0.05 mm-0.2 mm lager. And, at an edge of the bulk-shaped lens engager (the socket portion) 3217, a female screw as a writing-body-engager 3218 is implemented (See the light-hand side in FIG. 44B.). On the other hand, at one end of the lighting-body-housing 3223, a male screw serving as a lighting-body-engager 3228 configured to be coupled with the writing-body-engager 3218 of the writing body 3301. In addition, although the writing body 3301 and lighting body 3302 are attached and/or detached using the male and female screws as an example here, other methodologies such as fitting methodology or clamping methodology can be employed.

Furthermore, in the inside of the waveguide portion 3211, a reflecting mirror 3211A is mounted at the bottom plane of the cartridge installation cavity 3215A. The reflecting mirror 3211A is configured to increase the lighting efficiency of the light emitted from the visible light LED 1.

Furthermore, although the illustration is omitted, the reflecting mirror can be disposed at the inner wall of the hollow space of the waveguide portion 3211 serving as the portion for installing the ink cartridge 3215, or at the external wall of the cartridge. In addition, if minute irregularities serving as the irregular reflection plane are implemented at the inner wall of the hollow space, the interposed portion of the ink cartridge 3215 can be observed darkness, and we can expect the effectiveness such that the circumference of the writing body 3301 becomes slightly bright by the light from the irregular reflection planes. For using as a previously described penlight, it is effective to make an irregular reflection plane at the inner wall of the hollow space.

On the other hand, the lighting body 3302 embraces a lighting-body-housing 3223, a semiconductor light-emitting element (visible light LED) 1 attached at the right side of the lighting-body-housing 3223 as shown in FIG. 44A and FIG. 44B, a power supply unit 3241,3242 installed at the central portion of the lighting-body-housing 3223, and an electric switch portion 3226 arranged at the leftmost edge of the lighting-body-housing 3223. A top surface of resin 14 is identified by the geometry of the top surface of commercial resin molded LED 1, and it is implemented by a concave geometry having predetermined radius of curvature. Apart from the top surface of the concave geometry, the resin molded LED 1 is identified by a cylinder configuration having, for example, diameter (outside diameter) of 2-3 mm$^\phi$. In addition, the bulk-shaped lens 20 has concavity configured to install the resin 14. A side wall portion of the concavity is implemented by a cylindrical geometry having diameter (inside diameter) of 2.5-4 mm$^\phi$ so as to install the resin molded LED 1. Although the illustration is omitted, in order to fix the LED 1 and the bulk-shaped lens 20, a spacer or an adhesive having thickness of around 0.25-0.5 mm is interposed between the LED 1 and the storing cavity 6 of the bulk-shaped lens 20. The spacer or the adhesive should be disposed at a location aside from the main luminescence portion of the LED 1. The bulk-shaped lens 20 has almost cylinder geometry same as the LED 1, apart from the top surface neighborhood serving as the convex-shaped exit surface 3. The diameter (outside diameter) of the cylinder geometry portion of the bulk-shaped lens 20 can be selected to a predetermined value smaller than the outside diameter of the lighting-body-housing 3223. For example, it may be chosen as 6-11 mm$^\phi$ level. A top surface of the bulk-shaped lens 20 is identified by a concave geometry having predetermined radius of curvature, and the bulk-shaped lens 20 is configured to condense efficiently the light emitted from the visible light LED 1 and to emit the light outside.

In the general visible light LED (resin molded LED), the lights emitted from a place aside from the convex-shaped curved surface serving as the top surface of the resin 14 become so-called stray light component, and do not contributed to the lighting. However, in the 20th embodiment of the present invention, since the visible light LED 1 is nearly completely confined in the concavity of the bulk-shaped lens 20, these stray light components can effectively contribute to the lighting. That is to say, the inner wall aside from the portion of the entrance surface (the ceiling surface) 2 of the concavity can serve as the effective entrance surface of the light. In addition, components of the light, reflected back at each interfaces, repeating the multiple reflections between the visible light LED 1 and the concavity, become the stray light components. By the optical system of the earlier known optical lenses, these stray light components cannot be extracted so as to contribute to the lighting. However, because these stray light components, in the 20th embodiment of the present invention, are confined in the inside of the concavity, they can finally become the components contributing to the lighting. As the result, not depending on the light extracting efficiency ascribable to the geometry of the resin 14, nor the return components between optical systems, the inherent light energy of the LED chip can be extracted effectively, with approximately same efficiency as the internal quantum efficiency. In this way, according to the configuration of optics related to the 20th embodiment of the present invention, without requiring large number of the resin molded LEDs 1, desired light flux at irradiation area, serving as the light beam contributing to the local lighting, and desired illumination intensity can be easily obtained. The illumination intensity is not achieved by the optical system of the earlier known optical lenses. In other words, illumination intensity of the same level as the commercially available flashlight with slender body, using halogen lamp, can be realized only by a single LED. In this way, according to the configuration of optics related to the 20th embodiment of the present invention, the illumination intensity which cannot be predicted by the earlier technical common sense can be achieved by the simple configuration as shown in FIG. 44A and FIG. 44B.

The lighting-body-housing 3223 can be implemented by a pipe-shaped hollow cylinder body or other similar geometries, in which the power supply unit 3241,3242 can be installed. The lighting-body-housing 3223 can be made of materials such as stainless steel, aluminum alloy, or acryl resin or plastic materials. Similar to the penholder 3210, the lighting-body-housing 3223 can be made of, for example, transparent acryl resin or transparent plastic material, or it may be made of semitransparent/opaque acryl resin and semitransparent/opaque plastic material, which are colored moderately. The lighting-body-housing 3223 is implemented by the size which, for example, is equal to the outside diameter of the penholder 3210 of the writing body 3301.

Figure 45:
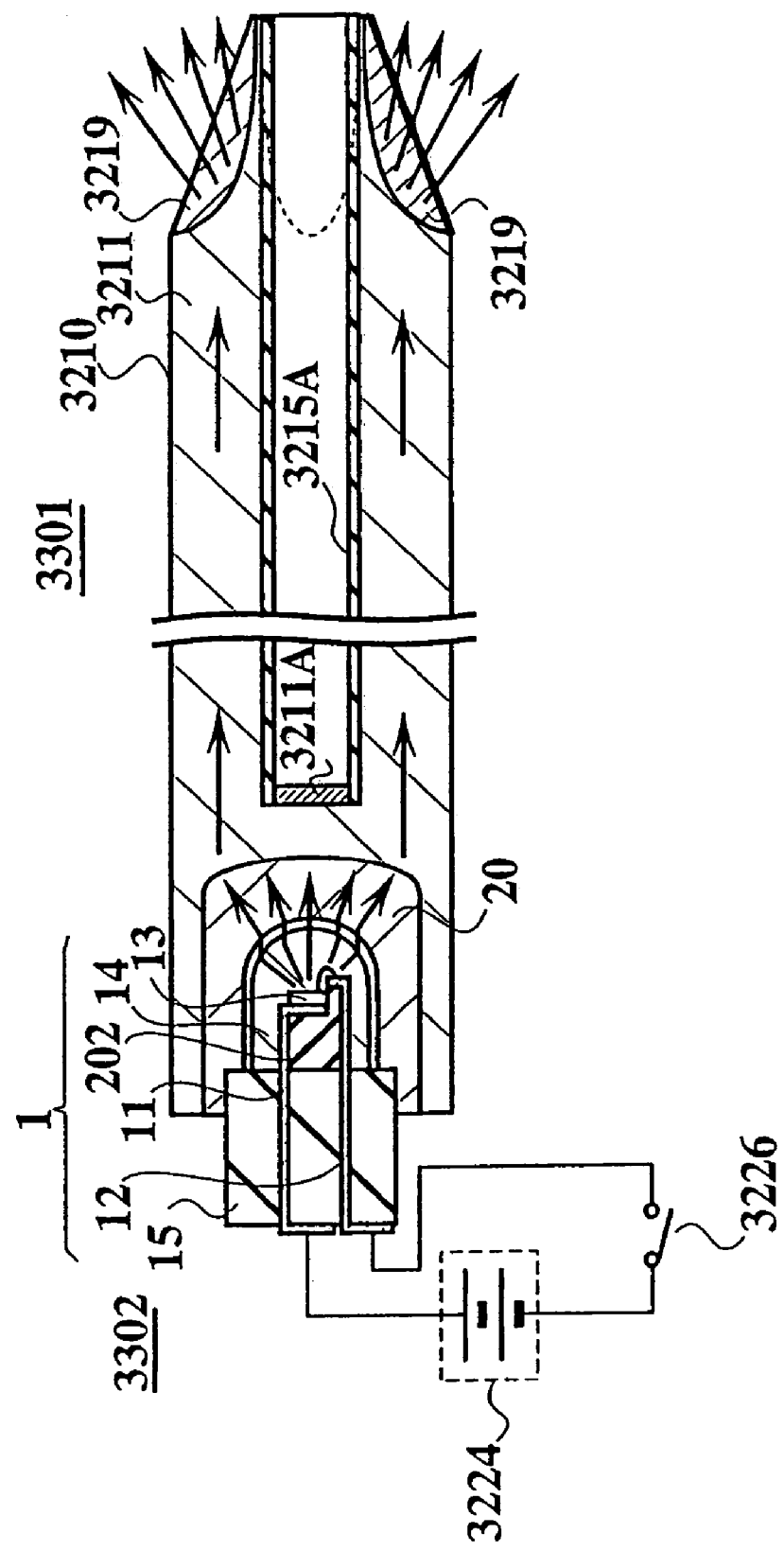
FIG. 45 shows a magnified schematic cross-sectional view, showing the vicinity of LED chip in the hand-held instrument shown in FIG. 44A.

As shown in FIG. 45, the LED chip 13 is mounted on a susceptor (a die pad) 202 arranged on a base pedestal (a stem) 15. And, the LED chip 13 is resin molded by the resin 14. The one end of the first lead interconnection 11 is connected to one electrode of the LED chip 13 (bottom electrode), through the susceptor 202, and another end is derived to the rear surface penetrating through the base pedestal 15. Likewise, the one end of the second lead interconnection 12 is connected to the other electrode of the LED chip 13 (top electrode), and another end is derived to the rear surface penetrating through the base pedestal 15. Although the reference numeral is not labeled, between other electrode (the top electrode) of the LED chip 13 and the second lead interconnection 12 is electrically connected by a bonding wire. In this way, the visible light LED 1 embraces the base pedestal 15, the susceptor 202, the LED chip 13, the first lead interconnection 11, the second lead interconnection 12, the resin 14 and etc. The base pedestal 15 may be made of insulating materials such as ceramics, encapsulated by metals such as stainless, brass or copper at the contour surface, or it may be made of same material as resin 14, merging to the resin 14, In addition, although a configuration in which a step is implemented between resin 14 and base pedestal 15 is shown in FIG. 45, the step may be eliminated by the configuration in which the resin 14 and base pedestal 15 are implemented by the same outside diameter.

In addition, as the visible light LED 1 to be use in the hand-held instrument related to the 20th embodiment of the present invention, LEDs of various colors (wavelengths) can be employed. In the case of local lighting used for the writing work in the dark, the white LED explained in the first embodiment is preferred; because the light from the white LED is natural to eyes of human.

The resin 14 is implemented by a molded body, which provide the optical lens action and has the function to protect the LED chip 13 simultaneously. For example, transparent thermosetting epoxy resin and transparent acryl resin can be used for the resin 14. Since the right side portion of resin 14 in FIG. 45 is identified by a concave geometry having predetermined radius of curvature, the resin 14 condense efficiently the light (white light) emitted from the LED chip 13 so as to shine the bulk-shaped lens 20.

As shown in FIG. 44A and FIG. 45, the power supply unit 3241,3242 can be implemented by two pieces of serially-connected batteries 3241 and 3242 such as AA size to AAAA size batteries so as to improve the portability of a hand-held instrument, while obtaining a moderate illumination intensity as well. Or, disk type batteries such as a lithium ion battery or a manganese dioxide lithium battery can be employed, too. In addition, the power supply unit 3241,3242 is not limited to above-mentioned batteries, and can be implemented by other batteries such as small size rechargeable battery.

Although the detailed description of the configuration of the electric switch portion 3226 is omitted, it is basically implemented by a simple configuration such as a rotary or a push type switch (when a security feature, which will be explained in the 22nd embodiment, is required, a logic circuit, a pulse generator, a voltage regulator may be installed in the electric switches portion.). In addition, when function configured to enjoy changes of tone of color is required, a voltage regulator which can independently control the drive the voltages of three pieces of LED chips of red (R), green (G) and blue (B) colors may be installed in the electric switch portion. One terminal of the electric switch portion 3226 is connected to the second lead interconnection 12 of the visible light LED 1 through the interconnection, which is not illustrated because it is arranged inward of the lighting-body-housing 3302. As shown in FIG. 44A, the other terminal of the electric switch portion 3226 is connected to the first lead interconnection 11 of the visible light LED 1 through an electrically conductive elastic member 3225, which holds the batteries 241 and 242 and also serves as the interconnection.

Although the configuration is not shown, the electric switch portion 3226 can be attached/detached freely to/from another end of the lighting-body-housing 3302 by a screw, and it is configured such that the replacement of the batteries 241 and 242 can be executed in the state in which the electric switches portion 3226 is detached from the lighting-body-housing 3302. In the 20th embodiment, an electrically conductive elastic member 3225 is made of metallic coil spring such as, for example, iron and copper. In addition, an electrically conductive elastic member 3225 may be implemented by a flat spring in which a metal plate is folded.

Furthermore, at the contour of another end of the lighting-body-housing 3223, a clip 3230 configured to carry the hand-held instrument storing in a pocket of a suit, for example, is attached.

The hand-held instrument fitted with lighting portion can be stored in a pencil case, or in a pocket of a suit using the clip 3230 so as to carry. And, for example, in the case when we want to take notes under the slide screening in research meeting or lecture, or in the case when we want to take note on a notebook in night darkness, if we operate the electric switch portion 3226 of the hand-held instrument so that direct current is passed to the LED chip 13, identified by the visible light LED 1, from the power supply unit 3241,3242, visible light such as white light is emitted from the LED chip 13 as shown in FIG. 45. As shown by arrows in FIG. 45, the visible light emitted from LED chip 13 is, at first, efficiently condensed by the resin 14, and is successively efficiently condensed by the bulk-shaped lens 20 and the waveguide portion 3211, respectively, and propagates to the direction of the pen point 3214, through the penholder 3210 via the waveguide portion 3211. Among visible lights emitted from the LED chip 13, visible light propagates to pen point 3214 along the shaft center of the writing body 3301 is reflected back at the reflecting mirror 3211A disposed at the bottom face of the cartridge installation cavity 3215A, and the visible light reflected back is reflected back again at the surface of bulk-shaped lens 20 and at the surface of resin 14, so that all of the visible lights can propagate toward the pen point 3214.

The optical dispersion portion 3219 disperses the visible light transmitted through the waveguide portion 3211 finally, and necessary illumination intensity at the surface of paper, which is appropriate for the writing work in the dark, can be obtained. In this state, by turning the steel ball of the pen point 3214 to the surface of paper, appropriate ink can be supplied to the surface of paper from ink cartridge 3215 depending on the rotation of the balls.

According to configuration of the hand-held instrument fitted with lighting portion related to the 20th embodiment of the present invention, since it encompasses the resin 14 efficiently condensing the light from the LED chip 13, the bulk-shaped lens 20 and the waveguide portion 3211 so as to improve the lighting efficiency, enough illumination intensity can be obtained, which is same level as obtained by incandescent lamp, in the practical use sense. Furthermore, the hand-held instruments manifests the low power consumption feature ascribable to the employment of the visible light LED 1, the lighting duration can be lengthened. For example, by comparing with the case when incandescent lamp is employed, the lighting duration longer than dozens of times to several hundred times can be achieved. Furthermore, the hand-held instrument is implemented by the simple configuration such that it encompasses only the resin 14, the bulk-shaped lens 20 and the waveguide portion 3211 each configured to condense the light from the visible light LED 1. In addition, because the hand-held instrument is implemented by such simple configuration, fabrication is easy, and the fabrication cost can be reduced, too.

Furthermore, because the waveguide portion 3211 implements the penholder 3210, parts count employed in the writing body 3301 can be reduced. By the reduction of parts count, the hand-held instrument of further simpler configuration can be realized. As a result, furthermore, the hand-held instrument fitted with lighting portion having advantages such that fabrication is easy, and that the fabrication cost is low can be implemented as well.

In addition, in the hand-held instrument related to the 20th embodiment of the present invention, coloring is made on, at least either one of, the resin 14, the bulk-shaped lens 20, the waveguide portion 3211, the optical dispersion portion 3219, so as to emit light tinged with colors such as red, yellow, or purple rather than white light, so that notes can be taken in research meeting or lecture, in the illumination level that a person of periphery is not troubled, and further improving the decorative nature.

Although the basic configuration of a hand-held instrument (writing implement) shown in FIG. 46A (writing implements) is same as the configuration of the hand-held instruments shown in FIG. 44A to FIG. 45, it further embraces a outer cap 3231 configured to protect the pen point 3214 of the writing body 3301, which can be attached/detached to/from the penholder 3210 freely. And a clip 3232 is fitted on the outer cap 3231. In addition, by implementing at least a part of the outer cap 3231 in the vicinity of the pen point 3214 with a transparent material, and by choosing the geometry of the part of the vicinity of the pen point 3214 to a predetermined shape, it can serve as the flashlight, even in the state that the outer cap 3231 is attached.

Although the basic configuration of the hand-held instrument shown in FIG. 46B is same as the Writing implement (the hand-held instrument) shown in FIG. 46A, the writing body 3301 is identified as a fountain pen. The writing body 3301 embraces a pen point 3140 of the fountain pen, and an ink cartridge 3150 configured to supply ink to the pen point 3140. Although in the writing implement (the hand-held instrument) shown in FIG. 46B, the writing body 3301 is identified as the fountain pen, the similar effectiveness achieved by the writing implements shown in FIG. 46A can be obtained.

21st Embodiment

In 21st embodiment of the present invention, a locking/unlocking system, configured such that an optical signal is transmitted from the hand-held instruments so that a locking object, such as an entrance, a gate, a door of each chambers, a door of a car, a drawer of a desk, a drawer or a door of a furniture, a lid of a seal box or an accessory box, is locked or unlocked is explained, employing the basic configuration of the hand-held instrument fitted with lighting portion related to the 20th embodiment of the present invention.

As shown in FIG. 47, the locking/unlocking system related to an embodiment of the 21st of the present invention embraces a signal-transmitting unit 3304 implemented by the hand-held instrument and a locking object having a signal-receiving unit 3305 configured to receive an optical signal from the signal-transmitting unit (the hand-held instrument) 3304. That is to say, the hand-held instrument implementing the locking/unlocking system related to the 21st embodiment of the present invention encompasses a visible light LED 3340, molded by resin 14, the LED serving as a semiconductor light-emitting element outputting the optical signal from a top surface of the resin 14, a bulk-shaped lens 20 implementing a concavity configured to install the visible light LED 3340 in the inside and a waveguide portion 3211, serving as a penholder, having a hollow space configured to attach, install and detach the bulk-shaped lens. On the other hand, locking object encompasses the signal-receiving unit 3305 configured to receives the optical signal transmitted by the signal-transmitting unit (the hand-held instrument) 3304 and a locking mechanism 3306 configured to unlock in the case when it is determined that the received optical signal is identified as the predetermined signal. Furthermore, the locking object includes a drive power supply 3307 configured to supply power source to the signal-receiving unit 3305.

Detailed descriptions of the writing body 3301 implemented by the waveguide portion 3211 is omitted, since it is same as the writing body 3301 explained in the hand-held instrument related to the 20th embodiment of the present invention.

Although the signal-transmitting unit 3304 has the same basic configuration as the lighting body 3302 explained in the hand-held instrument related to the 20th embodiment of the present invention, and it can be employed as the lighting equipment, it is configured to transmit the optical signal to the signal-receiving unit 3305 in the 21st embodiment. That is to say, the signal-transmitting unit 3304 transmits the optical signal to the signal-receiving unit 3305 so as to control the locking mechanism 3306, thereby implementing a transmitter configured to provide "an electronic key" for locking or unlocking of drawers of desks, etc.

That is to say, the signal-transmitting unit 3304 embraces a semiconductor light-emitting element (LED chip) 3410, a resin configured to condense the light (the optical signal) emitted from the LED chip 3410, a bulk-shaped lens 20, a power supply unit 3344 configured to supply voltages for driving the LED chip 3410, and an electric switch portion 3346 configured to control the power feeding from the power supply unit 3344. A semiconductor light-emitting element (LED) 3340 encompasses a LED chip 3410 and a resin configured to mold the LED chip. In addition, as the LED 3340 to be employed in the locking/unlocking system related to the 21st embodiment of the present invention, LEDs of various colors (wavelengths) can be accepted, similar to the 20th embodiment of the present invention. But, in view of applications such as the local lighting for writing work in the dark, and execution of the encoding using the ratio of emission intensities of respective colors, which will be described below (cf. the 22nd embodiment), the white LED described in the first embodiment is preferable. In view of the necessity to independently execute parallel operations of three pieces of LED chips of RGB, it is desirable that power supply circuits for respective colors are prepared in parallel, and independent control circuits are connected to the respective power supply circuits. In addition, generally the operating voltages of the green (G) and blue (B)-colored LEDs are higher than the red (R)-colored LED, is high. Hence, the balance of three colors of RGB may be adjusted by providing internal resistances. When the encoding by colors is not intended, simultaneous parallel operations of three pieces of LED chips of RGB can be achieved by a common power supply unit 3344 and a common electric switch portion 3346 controlling the power feedings from the common power supply unit 3344, by adjusting the voltage with the respective internal resistances.

But, in the daytime, with the LED (white LED) outputting the white light, when a locking object is irradiated with a beam, because the irradiation point is hard to observe, either one light of three colors of RGB may be irradiated selectively. At all events, it is preferable to configure such that operation modes of the LEDs can be changed using an electric switch or a logic circuit as follows: when it is employed as a hand-held instrument, a mode in which the white light is emitted is selected; and when the predetermined data processing is required so as to implement the security function, another mode in which the emission intensities, the pulse durations or the sequential order of the lights of respective LEDs of specific colors are independently controlled is selected. In this case, the electric switch portion 3226 shown in FIG. 44A may encompass predetermined electronic circuits to implement the modulator (cf. the 22nd embodiment) such as a semiconductor memory of random access memory (RAM), a logic circuit, a pulse generator, a voltage regulator, instead of the simple configuration such as shown in the 20th embodiment.

By similar configuration (cf FIG. 44B) to the 20th embodiment of the present invention, one end (top surface) of the signal-transmitting unit 3304 has a plug geometry so that it can be inserted in a socket shape portion implemented by the end of the writing body 3301, and so that it can attached/detached freely. A male screw may be implemented at a part of the plug geometry, and a female may be implemented at a part of the socket geometry. The waveguide portion 3211 implementing the penholder 3210 of the writing body 3301 has optical geometry such that it can efficiently condense the optical signal propagated through the bulk-shaped lens 20 having the plug geometry, and transmit to the tip direction, after condensing, the propagated optical signals are output through optical dispersion portion 3219 to outside finally.

On the other hand, the locking mechanism 3306, implementing the locking object, judges the level of output current of the photodetector 3350, or judges the level of output voltage through a resistor, and judges whether predetermined input light is fed, using a comparator etc. When it is judged that predetermined input light is fed, locking mechanism 3306 conducts the unlocking actuating by predetermined drive mechanism. And, the locking mechanism 3306 maintains the locking state (the lockup condition) if the photodetector 3350 does not detect predetermined input light. In addition, using a predetermined timer it may be automatically locked after the unlocking actuation, or it may be configured such that the locking mechanism 3306 locks when the photodetector 3350 detected the predetermined input light again.

As the signal-receiving unit 3305, various kinds of photodetector 3350 can be adopted, but a semiconductor photodetector such as the photo diode is suitable for compactification, and it has a high sensitivity. As the photo diode 3350, a diode made of semiconductor material having a completely same specific optical energy (energy gap) as the semiconductor light-emitting element (LED) 3340 can be used. That is to say, the photodetection with highest sensitivity having wavelength-selectivity is achieved by making the specific optical energy of the light-emitting element equal to the specific optical energy of the photodetector. In the photodetector (the photo diode) 3350, current flows when light having equal or larger energy than the specific optical energy of the photodetector is irradiated. In particular, extremely high sensitivity detection is achieved when light having exactly same energy as the specific optical energy of the photodetector is impinged, due to the wavelength resonance effect. In this case, as the photo diode 3350, a reverse biased LED, having completely same configuration as the LED employed in the signal-transmitting unit, can be employed. In addition, as the photodetector 3350, an avalanche photo diode (APD) made of semiconductor material having completely same specific optical energy as the LED may be used. Furthermore, as the photodetector 3350, a phototransistor made of semiconductor material having completely same specific optical energy as the LED may be used.

For example, when white light having wavelength spectrum completely same as the registered wavelength spectrum in the locking mechanism 3306 is impinged on the photodetector, the locking mechanism 3306 actuates unlocking operation. When the white light is adopted in the locking/unlocking system related to the 21st embodiment of the present invention, the transmission and reception of the signal will employ three colors of light, since it is known that white light is implemented by mixing of three colors of RGB lights. That is to say, since the white light can implement the signal transmission system of three channels, whish is strong against fluctuation and noise, photodetection by the signal-receiving unit 3305 can be done with extremely high sensitivity so as to actuate the locking/unlocking operations.

Generally, there is enough space when the signal-receiving unit 3305 is installed in the entrance, the gate, and the door of each chamber. Therefore, in view of the spatial margin of the signal-receiving unit 3305, in order to condense the light from the LED 3340 from the signal-transmitting unit 3304, well known various optical systems such as earlier lenses can be adopted. In addition, if optical path reversibility is considered, the same optical system as the bulk-shaped lens employed in the writing implements 1, can condense the optical signal to the photodetector 3350.

In addition, if there is a spatial margin, photodetectors other than the semiconductor photodetector, such as photomultiplier tube, can be employed. In this case it is preferable to add color filters corresponding to each of colors. In the case of the semiconductor photodetector, by using semiconductor material having the specific optical energy completely same as the LED 3340 as previously described, the equivalent effectiveness as the configuration in which optical filters are built-in. However, it is preferable to employ respective color filters, because the influence of shorter wavelength lights on the detecting elements of longer wavelengths can be avoided.

In this way, the locking/unlocking system having superior stability of locking or unlocking actuation can be implemented.

Figure 48A:
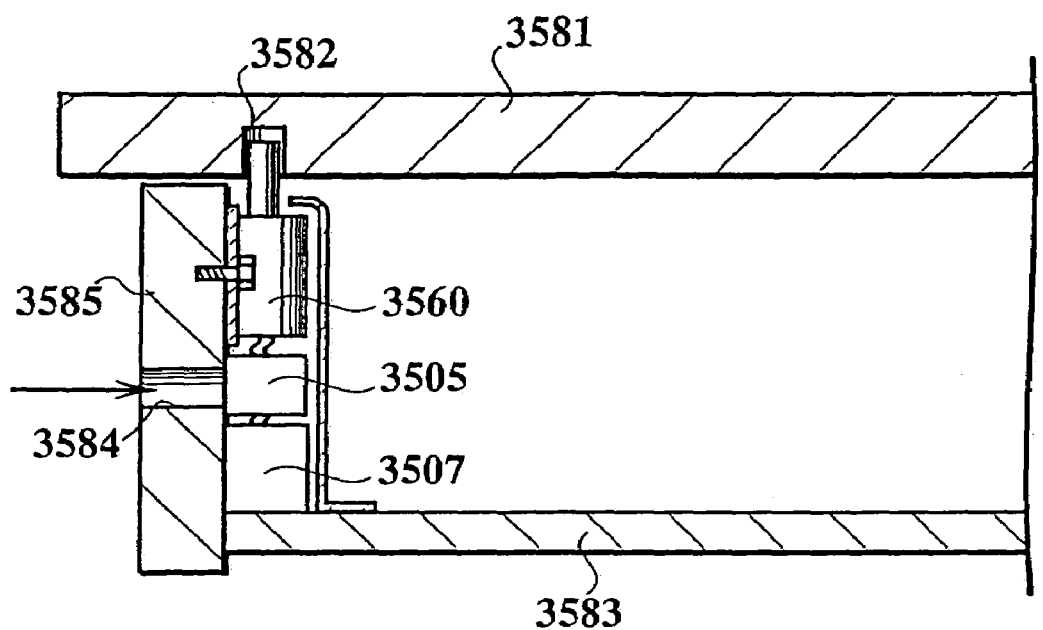
FIG. 48A is a sectional view of the locking/release system, showing a configuration in which a signal reception unit and a lock mechanism are merged in a desk, which serves as the locking object, the locking/release system is remote controlled by a parallel beam.
Figure 48B:
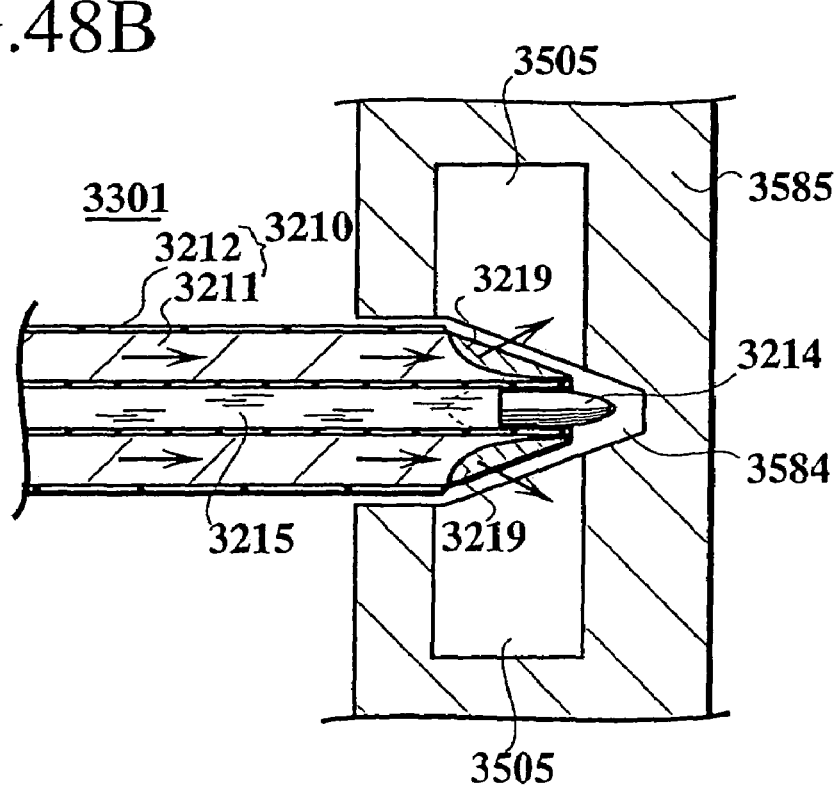
FIG. 48B is a sectional view showing a configuration of a near-field operation, in which the signal reception unit and the lock mechanism are mutually approached.

FIG. 48A shows a remote control system using a collimated beam, and FIG. 48B shows an operative example of a near field operation corresponding to FIG. 47. A locking/unlocking system shown in FIG. 48A is implemented by a desk 3581 serving as the locking object, and embraces a signal-receiving unit 3305 disposed at neighborhood of the front plate 3585 of the drawer 3583, an electromagnetic solenoid 3560 serving as the locking mechanism 3306, a drive power supply 3307 configured to supply the driving current to the electromagnetic solenoid 3560. Locking hole 3582 configured to insert a shaft of the electromagnetic solenoid 3560 in the locked state is implemented in desk 3581. In addition, an optical-signal-receiving-hole (an optical key hole) 3584 penetrating to outward is arranged in the front plate 3585 of the drawer 3583. In order to prevent a malfunction by stray light such as the sunlight, aside from the light from the LED 3340 in the signal-transmitting unit 3304, the optical-signal-receiving-hole 3584 may be implemented by a through-hole having a relatively small diameter compared with the thickness of front plate 3585. That is to say, it may be configured such that only a collimated beam is effectively arrive to the signal-receiving unit 3305 through the optical-signal-receiving-hole 3584.

In the locking/unlocking system shown in the FIG. 48A, the optical signal emitted from the LED 3340 in the signal-transmitting unit 3304 is received by the signal-receiving unit 3305 through the optical-signal-receiving-hole 3584, and the driving current is supplied to the electromagnetic solenoid 3560 based on the optical signal received by the signal-receiving unit 3305 from the drive-power supply 3307. When the shaft of the electromagnetic solenoid 3560 is descend by the driving current, the coupling between the locking hole 3582 and the shaft is broken so as to enable the unlocking actuating. On the contrary, when the driving current raises the shaft of the electromagnetic solenoid 3560, it makes locking actuation by coupling the locking hole 3582 with the shaft.

On the other hand, the configuration of the optical-signal-receiving-hole 3584 is different for the near field operation. As shown in FIG. 48B, optical keyhole 3584 has a geometry of similar figure with the optical dispersion portion 3219 and is implemented by inside diameter slightly larger, for example, 0.1-0.3 mm, than the corresponding outside diameter of the optical dispersion portion 3219 so that it can install the optical dispersion portion 3219 of the tip of the writing body 3301. And the light (dispersion light) just arrives to the photodetector of signal-receiving unit 3305 in the state, which the optical dispersion portion 3219 is installed in the inside of the optical keyhole 3584. Even if the dispersion light is employed, by arranging the photodetector to the nearest-neighbor place of the optical dispersion portion, the effective optical intensity can be implemented.

Furthermore, although the illustration is omitted, a push button may be implemented at a part of the inside diameter portion of the optical keyhole 3584. And, if it is configured such that when the tip of the writing body 3301 is interposed in the inside of the optical key hole 3584, the push button is pushed so that the power of the signal-receiving unit side become the ON-state, energy can be saved. In addition, protection of malfunctions due to the direct sunlight irradiation on the desk is possible.

Furthermore, by using one-dimensional or two-dimensional image sensor as the photodetector of the signal-receiving unit 3305 shown in FIG. 48B, and if predetermined spatial pattern with encryption (coding) is formed on the surface of the optical dispersion portion 3219, it can be configured such that only when predetermined pattern of the specific hand-held instrument, corresponding to the specific person, is identified, the unlocking actuation is enabled. Furthermore, hologram color filter will be established at a part of waveguide portion 3211 or at a part of optical dispersion portion 3219, so that the signal-receiving unit 3305 can recognize the hologram pattern.

In addition, the locking/unlocking system embracing the signal-receiving unit 3305, the locking mechanism 3306 and the drive-power supply 3307 is not limited to the example, in which it is implemented by the front plate 3585 of the drawer 3583 of the desk 3581, serving as the locking object, as shown in FIGS. 48A and 48B, miscellaneous locking objects such as a drawer and a door of furniture, a lid of seal box or and accessory box, a door and a cover of a safe, can be adopted. Furthermore, a wall, a gate, a door of the entrance, a door of each chambers, a door of car, etc. can be employed as the locking object.

22nd Embodiment

As understood by the example shown in FIG. 48B, which was related to the methodology recognizing the spatial pattern, by using a predetermined personal identification information as an optical signal, the hand-held instrument fitted with lighting portion of the present invention can apply to the locking/unlocking system, improving a security feature.

Figure 49:
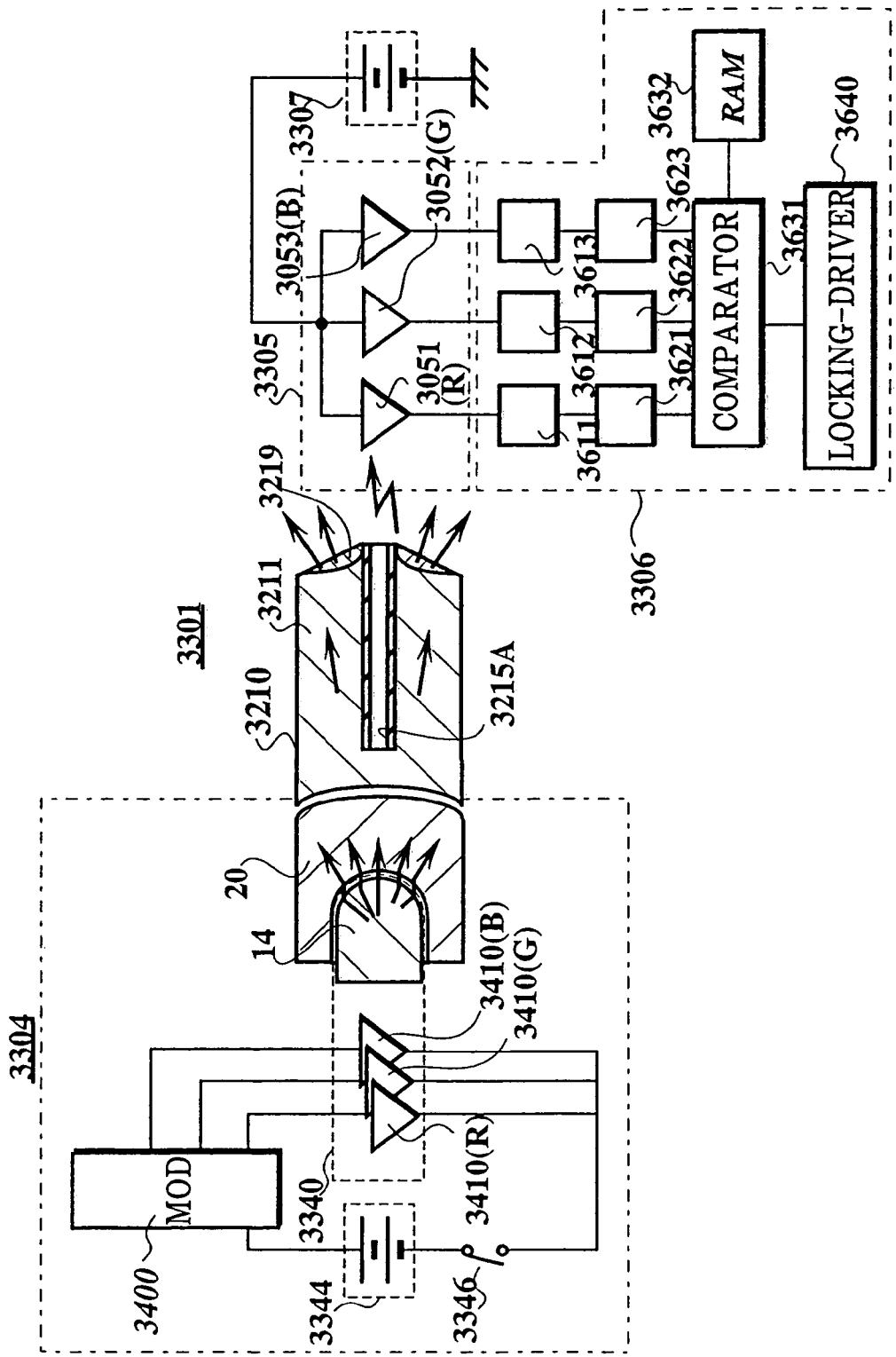
FIG. 49 is a schematic view showing a locking/release system having a security feature according to a 22nd embodiment of the present invention.

As shown in FIG. 49, a security locking/unlocking system related to an embodiment of the 22nd of the present invention embraces a hand-held instrument serving as a signal-transmitting unit 3304 configured to transmit an optical signal and a locking object implementing a signal-receiving unit 3305 configured to receive the optical signal from the hand-held instrument (a signal-transmitting unit) 3304. That is to say, the hand-held instrument related to the 22nd embodiment of the present invention encompasses, an LED 3340 molded by resin 14, serving as a semiconductor light-emitting element configured to output the optical signal from a top surface of the resin 14, modulator 3400 configured to generate an optical signal by modulating the light so as to include a predetermined personal identification information, a bulk-shaped lens 20 implementing a concavity configured to install the LED 3340 in the inside, and a waveguide portion 3211 serving as a penholder, implementing a hollow space configured to install the bulk-shaped lens 20, in such a way that the bulk-shaped lens is attached to or detached from the hollow space. On the other hand, the locking object related to the 22nd embodiment of the present invention encompasses a signal-receiving unit 3305 configured to receive the optical signal emitted from the hand-held instrument (signal-transmitting unit) 3304 and a locking mechanism 3306 configured to actuate unlocking, when the coincidence is confirmed after comparing the personal identification information contained in the received optical signal with the individual identification information registered in the locking object. Furthermore, the locking object encompasses a drive-power supply 3307 configured to supply the signal-receiving unit 3305 with a power source.

Here, the LED 3340 serving as the semiconductor light-emitting element embraces a first semiconductor light-emitting chip (LED chip) 3410 (R) configured to emit light of a first wavelength $\lambda_1$ (red), a second semiconductor light-emitting chip (LED chip) 3410 (G) configured to emit light of a second wavelength $\lambda_2$ (green) different from the first wavelength $\lambda_1$, a third semiconductor light-emitting chip (LED chip) 3410(B) configured to emit light of a third wavelength $\lambda_3$ (blue) different from the first and second wavelengths $\lambda_1$, $\lambda_2$. And the modulator 3400 set a ratio of the light intensity $I_1$ of the first wavelength to the light intensity $I_2$ of the second wavelength ($=I_1/I_2$), a ratio of the light intensity $I_2$ of the second wavelength to the light intensity $I_3$ of the third wavelength ($=I_2/I_3$), or a ratio of the light intensity $I_3$ of the third wavelength to the light intensity $I_1$ of the first wavelength ($=I_3/I_1$) to predetermined values, respectively so as to generate an optical signal containing personal identification information. In addition, the signal-receiving unit encompasses first, second and third photodetector 3051 (R), 3052 (G), 3053 (B) made of semiconductor materials having the same specific optical energies as the first, second and third semiconductor light-emitting chip 3410 (R), 3410 (G), 3410 (B), respectively. Furthermore, the locking mechanism 3306 encompasses a comparator 3631 to examine coincidence between the signal, generated from outputs of the first, second and third photodetector 3051 (R), 3052 (G), 3053 (B), and the registered personal identification information and a locking-driver 3640 configured to actuate unlocking, when coincidence between the signal and the registered personal identification information is confirmed. Furthermore, locking mechanism 3306 encompasses random access memory (RAM) 3632 configured to store the personal identification information.

As already described in the 20th embodiment, the white LED encompassed three vertically stacked pieces of LED chips of red LED chip 3410 (R), green LED chip 3410 (G) and blue LED chip 3410 (B). In FIG. 49, modulator 3400 controls these three pieces of LED chips of red LED chip 3410 (R), green LED chip 3410 (G) and blue LED chip 3410 (B), independency. Using the power supply unit 3344, the modulator 3400 controls independently voltages of three pieces of LED chips of red LED chip 3410 (R), green LED chip 3410 (G) and a blue LED chip 3410 (B) respectively, so that relative intensities of respective colors are controlled, thereby desired color can be obtained by the mixing ratio. For example, by D-A converting the 8 bit multiple-valued gradation data into analog data, the modulator 3400 controls each of three pieces of LED chips. Therefore the modulator 3400 encompasses a digital-to-analog converter configured to control independently three circuits, using voltage from the power supply unit 3344 with signal of each 8 bit and a voltage regulator. In addition, the modulator 3400, not only controls the feeding of voltage from the power supply unit 3344, but also adjusts the pulse duration and repetition frequency, associated with source voltages applied to three pieces of LED chips of the red LED chip 3410 (R), green LED chip 3410 (G) and blue LED chip 3410 (B). Further, the modulator 3400 can execute predetermined encoding of the source voltages with the binary coded signals. In this case, electronic circuits such as a logic circuit or a pulse generator are merged in the modulator 3400. In addition, the modulator 3400 encompasses further a semiconductor memory such as RAM configured to store the 8 bit multiple-valued gradation data of respective colors or the binary coded signal. The electronic circuits including the semiconductor memory such as RAM, the logic circuit, the pulse generator and the voltage regulator, which are necessary for the modulator 3400 are monolithically integrated on a single chip as a semiconductor integrated circuit, and the semiconductor integrated circuit is installed in the electric switch portion 3226, as shown in FIG. 44A. A microprocessor may be merged in the semiconductor integrated circuits. The semiconductor integrated circuit controls independently the intensity of specific color, the pulse duration, the sequential order of the pulses, which are necessary for adding the security features, and further can store these information.

Furthermore, by implementing a ten-key pad and other keyboards such as character-input-keyboards at somewhere of the configuration of the lighting body 3302 shown in FIG. 44A, more complicated code signal and cryptogram can be input by the ten-key pad or the keyboard. In the case, the writing body 3301 is detached from the lighting body 3302, and by means of the pen point of writing body 3301, the keyboard can be operated. For example, the keyboard may be implemented in the clip 3230 shown in FIG. 44A.

On the other hand, the signal-receiving unit 3305 of the locking/unlocking system related to the 22nd embodiment of the present invention encompasses a semiconductor photodetector 3051(R) of red band, a semiconductor photodetector 3052 (G) of green band, and a semiconductor photodetector 3053 (B) of blue band, which are connected in parallel. As these semiconductor photodetectors 3051 (R), 3052 (G), 3053 (B), we can use photo diodes 3051 (R), 3052 (G), 3053 (B), which are made of semiconductor materials having completely same specific optical energy as the red LED chip 3410 (R), green LED chip 3410 (G) and a blue LED chip 3410 (B). That is to say, by making the specific optical energy of the light-emitting element and the specific optical energy of the photodetector equal, the photodetection of highest sensitivity with wavelength-selectivity is achieved. Because, in photodetectors (photo diodes) 3051 (R), 3052 (G), 3053 (B), current does not flow unless the light having energy equal to or more than energy gap is input, and when the light having energy same as the energy gap is input, by the wavelength resonance effect, extremely high sensitivity detection can be achieved. In this case, as photo diodes 3051 (R), 3052 (G), 3053 (B), reverse biased LEDs having configuration exactly same as the red LED chip 3410 (R), green LED chip 3410 (G) and blue LED chip 3410 (B) can be employed. In addition, as photodetectors 3051 (R), 3052 (G), 3053 (B), avalanche photo diodes made of semiconductor materials each having energy gap exactly same as the red, green, and blue LEDs can be employed. Furthermore, as photodetectors 3051 (R), 3052 (G), 3053 (B), phototransistors made of semiconductor materials each having energy gap exactly same as the red LED chip 3410 (R), green LED chip 3410 (G) and blue LED chip 3410 (B) can be employed. Furthermore, by implementing the Darlington connection of the phototransistors, further high sensitivity detection can be achieved.

And, furthermore, locking mechanism 3306 has level judgment circuits 3611,3612,3613, waveform shaping circuits (or, analog-to-digital converters) 3621,3622,3623. That is to say, at output sides of photodetectors 3051(R), 3052(G), 3053(B) of respective colors, level judgment circuits 3611, 3612,3613 are connected respectively, and at the output sides of the level judgment circuits 3611,3612,3613, waveform shaping circuits (or, analog-to-digital converters) 3621, 3622,3623 are connected. And, only when outputs of respective photodetectors 3051(R), 3052(G), 3053(B) reached predetermined level, the waveform shapers 3621,3622,3623 feed binary or multiple valued outputs. For example, from the waveform shapers 3621,3622,3623, the 8 bit multiple-valued gradation signals are fed, respectively. The comparator 3631 compares the 8 bit multiple-valued gradation data of respective colors stored in the RAM 3632 with outputs from the waveform shapers, and only when the coincidence is confirmed, the comparator 3631 drives the locking-driver 3640 so as to actuate unlocking. Or, when the comparator 3631 does not confirm the coincidence, the locking-driver 3640 maintains the locking state (lockup condition). In addition, after the unlocking actuation, it may be locked automatically after a constant time by using a predetermined timer. Or, the locking-driver 3640 can actuate locking when the comparator 3631 identified the coincidence between the 8 bit multiple-valued gradation data stored in the RAM 3632 and outputs of the photodetectors 3051 (R), 3052 (G), 3053 (B), after the photodetectors 3051 (R), 3052 (G), 3053 (B) detect predetermined input light again.

In the above, it was explained that the photodetection of highest sensitivity with wavelength-selectivity was possible, when photo diodes 3051 (R), 3052 (G), 3053 (B) made of semiconductor materials having energy gaps completely same as the red LED chip 3410 (R), green LED chip 3410 (G) and a blue LED chip 3410 (B), respectively. However, a careful consideration is needed as to the timing of luminescence of red LED chip 3410 (R), green LED chip 3410 (G) and blue LED chip 3410 (B). That is to say, by red (R)-colored light, photocurrent does not flow in the green semiconductor photodetector 3052 (G) and the blue semiconductor photodetector 3053 (B). However, since the energy of the green (G)-colored light is higher than the red (R)-colored light, by the irradiation of the green (G)-colored light, photocurrent flows in the red semiconductor photodetector 3051 (R). In addition, by blue (B)-colored light, which has highest energy, photocurrents flow in the red semiconductor photodetector 3051 (R) and the green semiconductor photodetector 3052 (G), and the signal processing becomes complicated. To prevent this problem, one technique using red (R)-colored, and green (G)-colored bandpass filters may be proposed, but configuration of the equipment becomes complicated. The most simplest and effective technique is to move the timing of luminescence each other so as not overlap each other, by choosing the timing and the pulse duration of driving pulse of the LED such that the red LED chip 3410 (R), the green LED chip 3410 (G) and the blue LED chip 3410 (B) luminescence independently. In this way, by selection of the timing of luminescence, high sensitivity detection, using the wavelength resonance effect is enabled.

Or, a methodology finding the differentiation change of the outputs of photodetectors 3051 (R), 3052 (G), 3053 (B), while the timing is moved so as to overlap in order of red (R) color, green (G) color and blue (B) color, can be employed. On the contrary, another methodology finding the differentiation change of the outputs of photodetectors 3051 (R), 3052 (G), 3053 (B), while the timing is moved so as to overlap in order of blue (B) color, green (G) color, red (R) color, can be employed.

In this way, if specified individuals choose freely the intensities of RGB, respectively, and when the intensity ratios are adopted as the required information (personal identification information) of the locking/unlocking system, the security system that someone else cannot unlock absolutely can be implemented. Because the combination of intensities of RGB may be possible to regard as almost infinite, if bit number of the multiple-valued gradation is chosen, extremely large number of people can employ the security system to a lot of equipments. Required information (personal identification information) of the locking/unlocking systems can be stored in the RAM installed in the electric switch portion 3226, as shown in FIG. 44A, or it may be input using the ten-key pad, each time. Or, by providing a reset circuit so that the unlocking information can be changed at any time, only the latest code signal can be memorized.

By the way, the selection of the timing of luminescence can be provided in many ways. What is the simplest is to choose so that R, G, B luminescence independently in this sequence so that they don't overlap, respectively. In this case, they may be made to emit light sequentially according to the clock frequency, if a common clock frequency is selected between the signal-transmitting unit 3304 and the locking mechanism 3306. If the synchronous detection, opening the gates of photodetection by the clock frequency, the noise components and the influence of stray light can be eliminated in the locking mechanism 3306 side. And it is preferable, defining "one cycle" by the sequence of R, G, B luminescences, to repeat the sequences of R, G, B luminescences with predetermined cycle number, so as to obtain integral value by an accumulator. In this way, after repeating simple sequence of R, G, B; R, G, B; . . . with predetermined cycle number, if we integrate the detected signal so that the integral value of the repetition can be employed in the confirmation of coincidence of the personal identification information (required information of the locking/unlocking system), high precise, and high reliable photodetection is achieved, even in the environment such that stray light components by sun light is large. Here, the 8 bit multiple-valued gradation data stored in the RAM 3632 is compared with the integral value after the repetition of the predetermined cycle number in comparator 3631 so that the coincidence is confirmed. The "predetermined cycle number" may include even one cycle. The cycle number can be determined depending on the operating environment such that whether the direct sunlight is irradiated or not, or in view of the output power of the LED, the sensitivity of the semiconductor photodetector.

On the other hand, by the way of selecting the timing of driving pulse of the LED, the individual identification information (required information of the locking/unlocking system) can be generated. For example, if we choose timings freely such that for person A, a sequence of RRBGBR, RRBGBR, RRBGBR, for person B, a sequence of BRBRGG, BRBRGG, BRBRGG, and for person C, a sequence of GGGGBR, GGGGBR, GGGGBR, . . . so that the respective orders of the luminescence can be identified as the specific individual identification informations (required informations of the locking/unlocking system).

In this case, except for the specific locking object, codes of other plural personal identification informations can be aligned sequentially so as to emit light sequentially. For example, it may be necessary for a same person to open keys of doors of the plural entrances, keys of doors of plural chambers, keys of doors of plural cars, keys of drawers of plural desks, keys of drawers or doors of plural furnitures, keys of lids of seal box and accessory box, keys of container such as door or cover of the safe. In this case, the semiconductor memory such as RAM installed in the hand-held instrument can store all of the codes required for unlocking the keys of doors of these plural entrances, or the keys of doors of plural chambers. And, if we configure such that the sequence of luminescences of respective colors encoding plural personal identification information was detected by photodetectors, so that the locking mechanism 3306 can compare with the registered personal identification informations stored in the ROM installed in the locking mechanism 3306, and if coincidence is confirmed for one of the sequential luminescences, the specific locking object is unlocked, the trouble of looking for a specific key among a lot of keys becomes needless. In addition, it is not necessary to carry a lot of keys with.

Furthermore, the pulse duration of the respective colors can be chosen so that it generates the personal identification information. When pulse duration is chosen, it may be determined based upon the clock frequency as a reference, if a common clock frequency for the signal-transmitting unit 3304 and locking mechanism 3306 is selected. That is to say, if the synchronous detection, opening the gate of photodetection triggered by the clock frequency, the noise component and the influence of stray light can be eliminated. However, the pulse duration may be chosen independently from the clock frequency under operating environment in which noise component and influence of stray light is low, of course. Furthermore, the various kinds of coding techniques used by normal information systems can be applied to respective colors (each channel), respectively, and further, they can be combined in all the colors.

In addition, the locking/unlocking system related to the 22nd embodiment of the present invention shown in FIG. 49 shows example when it makes signal-transmitting unit 3304 corresponding to FIG. 48B and signal-receiving unit 3305 are mutually approached, but the locking/unlocking system is not limited to the example. For example, the locking/unlocking system can be applied to a methodology irradiating the light to the signal-receiving unit 3305 located in a distant place by the condensed light with predetermined focal distance or by the collimated light, as shown in FIG. 48A, of course. In this case the writing body 3301 is detached from the lighting body 3302 so as to expose the bulk-shaped lens 20 of the lighting body 3302, and the output light from the surface of the bulk-shaped lens 20 can be used, When a distant place is irradiated by the collimated light or the condensed light with predetermined focal distance, the optical intensity impinging the semiconductor photodetectors 3051 (R), 3052 (G), 3053 (B) may depend upon distance. However, in the locking/unlocking system related to the 22nd embodiment of the present invention, since the magnitude of optical intensity impinging the semiconductor photodetectors 3051 (R), 3052 (G), 3053 (B) is not detected as necessary information, but the relative intensity ratio of respective colors is detected, the reliability of necessary information will not be lost, even if the distance varies.

23rd Embodiment

Furthermore, the writing implements explained in the 20th embodiment is only a part of examples of the hand-held instruments of the present invention, and the 20th embodiment does not limit the present invention. In the configuration shown in FIG. 44A, at the location of the ink cartridge 3215, if a solid material (lipstick) actuating push-out motion or torsional motion is disposed, a cosmetic instrument (stick lipstick) can be implemented. According to the present invention, by the configuration having the optical dispersion portion at the end point of the waveguide portion similar to the structure shown in FIG. 44A, not only the mouth, but also wide area of whole face can be lighted up, and it is very convenient. Furthermore, a cosmetic brush can be implemented. The cosmetic instrument fitted with lighting portion of the present invention is convenient for adjusting makeup in darkness, in specific situation such as the case for cabin crew of aircraft. In particular, the cosmetic instrument fitted with lighting portion of the present invention can employ the white light, makeup of unaffected feeling just same as daytime can be achieved in darkness.

Figure 50:
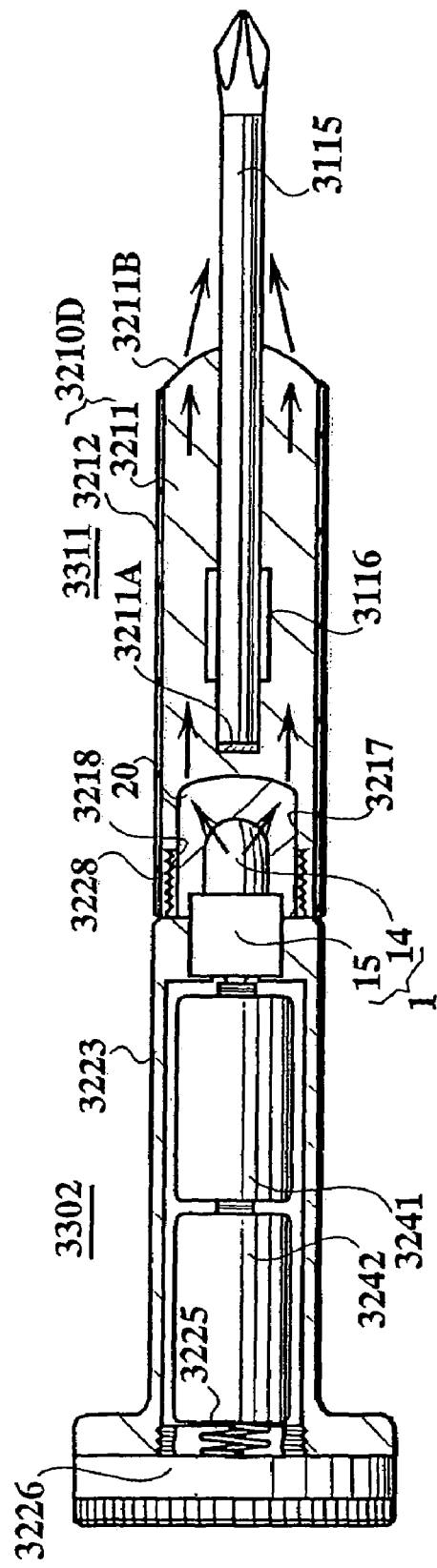
FIG. 50 is a schematic cross-sectional view of a hand-held instrument (a hand tool having a lighting unit) according to a 23rd embodiment of the present invention.

Furthermore, the hand-held instrument of the present invention can be applied to miscellaneous hand tools such as the driver shown in FIG. 50 and a spanner or a wrench, which are omitted in the illustration. Driver shown in FIG. 50 can be attached/detached freely between the tool body 3311 and the lighting body 3302. A holdings shank (shank) 3210D serving as a waveguide portion 3211 implements a cylindrical hollow space configured to install a driver shaft (a central axis member) 3115 made of metal rod. The waveguide portion 3211 and the driver shaft 3115 are fixed rigidly each other by a shaft stopper 3116. In addition, tip of waveguide portion 3211 is identified by a convex shape so as to implement a light-condensing portion 3211B, and configured such that the tip (head) of the driver shaft 3115 can receive an efficient local lighting in a working state. For example, the tool body 3311 is detached from lighting body 3302 so that the tool body 3311 can be installed in the toolbox, while the lighting body 3302 is carried in a breast pocket, separately. Then, the locking/unlocking of the tool box can be established by the output light from the surface of the bulk-shaped lens of the lighting body 3302, carried separately. The head of the lighting body 3302 is made large so that we can add force easily in FIG. 50. However, similar to FIG. 44A, with a configuration such that a clip is fitted to the contour of another end side of the lighting-body-housing 3223, the lighting body 3302 can always be carried conveniently with a pocket of working clothes, for example.

24th Embodiment

In FIG. 1, the bulk-shaped lens 20 implemented the storing cavity 6 identified by the concave-shaped first curved surface and embraced the exit surface 3 identified by the convex-shaped second curved surface. However, FIG. 1 is an example, and the first curved surface and the second curved surface can adopt miscellaneous topologies depending on purposes.

Figure 51:
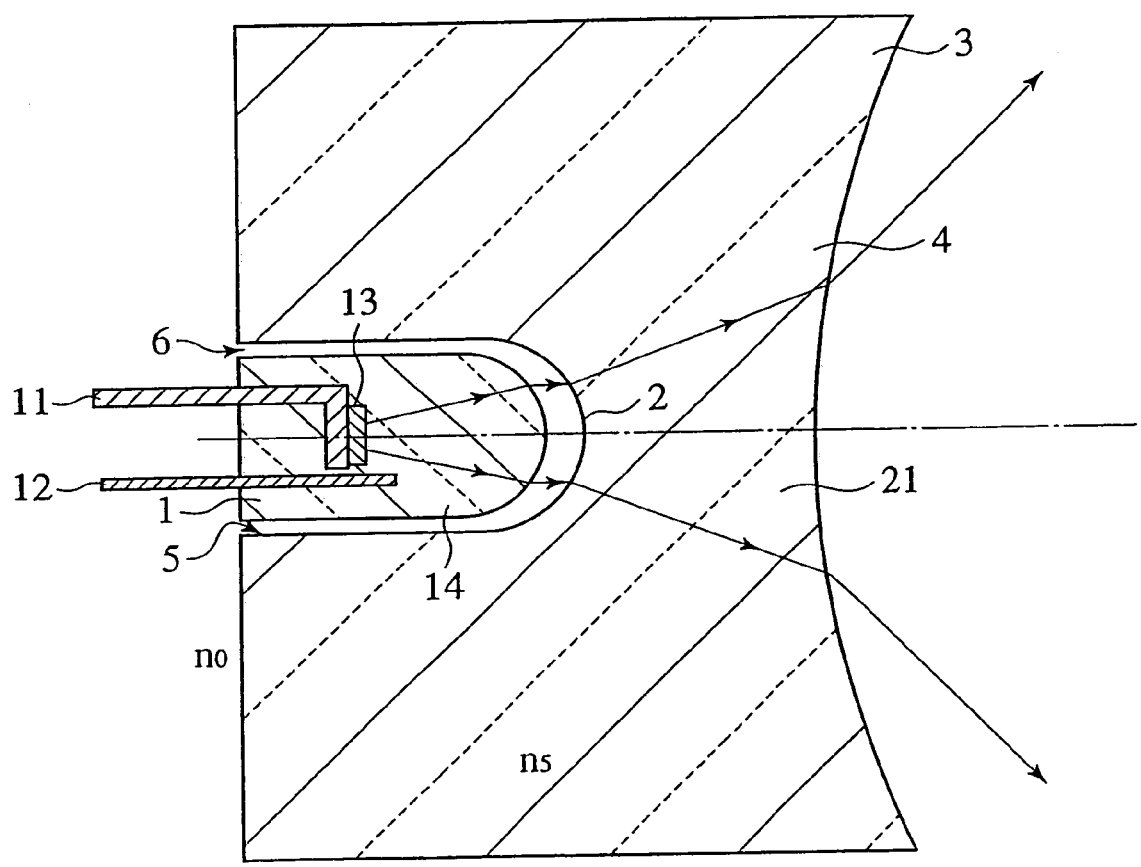
FIG. 51 is a schematic cross-sectional view showing a light-emitting unit according to a 24th embodiment of the present invention.

FIG. 51 shows a bulk-shaped lens 21 defined by an exit surface 3, identified by a concave-shaped second curved surface, according to the 24th embodiment of the present invention. With the concave-shaped second curved surface as shown in FIG. 51, because the light has tendency to disperse, homogeneity appropriate for backlight illumination (indirect lighting system) can be obtained. In the configuration having the back mirror 31 as shown in FIGS. 14A and 14B, explained in the fourth embodiment, or in the configuration having the back mirror 31 as shown in FIG. 20, explained in the fifth embodiment, the curved surface can take miscellaneous topologies depending on purposes, and they may be modified into a bulk-shaped lens having the luminescence surface identified by the concave-shaped second curved surface. Applying the concave-shaped curved surface to the top surface (the luminescence surface), because the light has tendency to disperse, the homogeneity appropriate for the backlight illumination (indirect lighting system) can be obtained.

But, when the second curved surface has the convex-shape, in order to get homogeneity of the illumination intensity profile, the protruding height $\Delta$ of the first curved surface defined in Eqs. (5) and (6) must be considered.

25th Embodiment

The number of traffic accidents in Japan has tendency to increase year by year. Among them, the accident number related to bicycle holds about 3%. Particularly, the accident by "non-lighting running" in the night stands out in the bicycle accidents. Regardless of the fact that the mounting rate of bicycle lamps is nearly equal to 100%, the lighting rate is very low with 20%. Because the most of lamps loaded on bicycles are generator-type (DC dynamo type), there are many people running without lighting by following reasons: (a) when the lamp is turned on, pedals become heavy, and legs bear burden; (b) when wheel comes in contact with the generator, unpleasant tone is generated; (c) when there are puddles and mud on road, generator scatters water and mud so that clothes are polluted; (d) by the generator, when speed of bicycle falls, the light becomes dark. For the cases of accidents of the non-lighting bicycle to car (or, bicycle to walker) at night, there are many cases that the bicycle side is responsible, and liability of bicycle operator is demanded. From these situations, a battery-operated bright lighting equipment with small and lightweight is waited eagerly. It may be found that battery type is desirable than the DC dynamo type for the bicycle lamp. What are required for the bicycle lamp are the enough brightness and the long lifetime of battery. Light source with low power dissipation is preferable in order to lengthen the lifetime of battery. In view of this aspect, the LED is preferable. However, generally, the illumination intensity from the LED is insufficient. In the 25th embodiment of the present invention, a light-emitting unit using the LED having enough brightness is explained.

Figure 52:
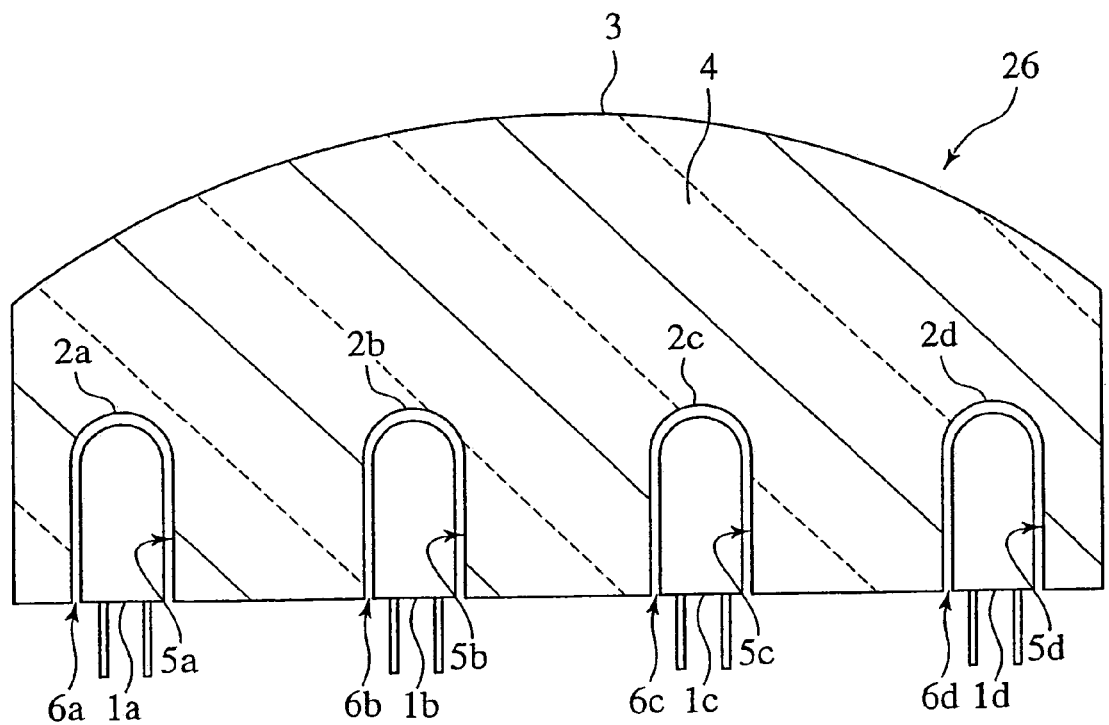
FIG. 52 is a schematic cross-sectional view showing a light-emitting unit according to a 25th embodiment of the present invention.

FIG. 52 is a schematic cross-sectional view showing the light-emitting unit according to the 25th embodiment of the present invention. As shown in FIG. 52, the light-emitting unit related to the 25th embodiment of the present invention embraces at least a plurality of light sources (first to fourth light sources) 1a-1d configured to emits lights of predetermined wavelength, and a bulk-shaped lens 26 configured to encapsulate nearly completely respective main luminescence portions of the first to fourth light sources 1a-1d, installing independently and respectively. In order to install independently the first to fourth light sources 1a-1d respectively, the bulk-shaped lens 26 implements a plurality of well-shaped concavities (the first to fourth concavities) 6a-6d, separated each other and arranged in parallel.

The respective well-shaped first to fourth concavities 6a-6d are defined by separate first to fourth entrance surfaces 2a-2d, and separate first to fourth concavity-sidewalls 5a-5d, formed successively to ceiling surfaces, the respective ceiling surfaces are identified by the first to fourth entrance surfaces 2a-2d. The exit surface 3 configured to emit plural lights incident from plural entrance surfaces 2a-2d is identified by a single curved surface. The lens body 4 connects between the first to fourth entrance surfaces 2a-2d and the single exit surface 3. The lens body 4 is made of a transparent material to wavelength of lights emitted from the light sources.

For example, each of the first to fourth light sources 1a-1d is a bullet-shaped LED having diameter (outside diameter) of 2-3 mm$^\Phi$ at a maximum portion. The cross section of the bulk-shaped lens 26 has a geometry resembling a slice of kamaboko (boiled fish paste having a barrel vault geometry) having a constant thickness as shown in FIG. 52. In view of Eq. (1), the thickness between opposing two flat surface of the kamaboko should be more than three times of the outside diameter of respective first to fourth light sources 1a-1d. Each the first to fourth concavity-sidewalls 5a-5d of the first to fourth concavities 6a-6d implemented in the bulk-shaped lens 26, is identified by a cylindrical geometry (well shape geometry) of diameter (inside diameter) of 2.5-4 mm$^\Phi$ so as to install each of the main luminescence portions of the first to fourth light sources (bullet-shaped LED) 1a-1d. Spacers of thickness around 0.2-0.5 mm are interposed between the first to fourth light sources 1a-1d and the first to fourth concavities 6a-6d, respectively, although the illustration is omitted, in order to fix the first to fourth light sources 1a-1d to the bulk-shaped lens 26. Width of the kamaboko-like bulk-shaped lens 26 can be chosen depending on purposes of the light-emitting unit related to the 25th embodiment of the present invention. Therefore, it can be less than 30 mm, and even more than 100 mm. In addition, in FIG. 52, although four light sources 1a-1d are shown, they may be equal to or more then five, further they may be equal to or less than three. However, for bicycle lamp, the numbers around three to five are enough. FIG. 52 shows a configuration in which four light sources 1a-1d are arranged along one-dimensional direction, on a same plane level. Even two-dimensional configurations with two levels, such that in the upper layer, the first and second light sources 1a, 1b are arranged, and in the lower layer, the third and fourth light sources 1c, 1d are arranged can be accepted. Furthermore, same as the second embodiment, the first to fourth back mirrors may be implemented to the first to fourth light sources 1a-1d, respectively. In order to obtain bright lighting, with smaller number of light sources 1a, 1b, 1c, . . . , the pitch of disposition of the light sources 1a, 1b, 1c, . . . should be chosen around three times of the outside diameter of light sources 1a, 1b, 1c, . . . . In addition, outside thicknesses of the lens body 4 located at both ends of light sources are preferable to have a certain thickness of the level more than outside diameter of the light source. This condition almost satisfies Eq. (1).

Because, for lighting purpose such as a bicycle lamp and a flashlight, the white LED is preferred, because it is natural to human eyes as described in the first embodiment. As explained in the seventh embodiment, the white LED may have configurations such that three pieces of LED chips of RGB are stacked vertically, or closely spaced each other in one package. That is to say, the first to fourth white LEDs having configurations such that three pieces of LED chips of RGB are encapsulated in the inside of the bullet-shaped resin seal, respectively, can be employed. The bicycle lamp may embrace a battery case and a battery (an AA size battery, for example) configured such that predetermined voltage can be supplied to the first to fourth white LEDs, respectively. The bicycle lamps embraces further an attachment configured such that the lamp body can be mounted on a bicycle handle. Between the anode and cathode of the battery, electrodes of the first to fourth white LEDs, serving as the first to fourth light sources 1a-1d, are connected, respectively. As a result, in a simple configuration, a bicycle lamp or the flashlight can be manufactured at low cost. The bicycle lamp or the flashlight has high stability and reliability for a long term, and in particular, the power dissipation is low, and the lifetime of battery is extremely long.

Between the first to fourth light sources 1a-1d and the first to fourth concavities 6a-6d of bulk-shaped lens 26, components of the lights reflected back at each interfaces, repeating the multiple reflections so as to become the stray light components. By an optical system of the earlier known optical lenses, these stray light components cannot be extracted so as to contribute to the lighting. However, these stray light components become the components, which can contribute to lighting, finally, in the 25th embodiment of the present invention, because these stray light components are confined in the insides of the first to fourth concavities 6a-6d.

In this way, in the 25th embodiment of the present invention, because the first to fourth light sources 1a-1d are nearly completely confined in the first to fourth concavities 6a-6d of the bulk-shaped lens 26, including the stray light components, all output lights emitted from the first to fourth light sources 1a-1d, can contribute to lighting effectively. In this way, according to the light-emitting unit related to the 25th embodiment of the present invention, desired illumination intensity can be easily obtained, by establishing light flux having desired parallelism, which is enough for the bicycle lamp. The illumination intensities cannot be achieved by the optical system of the earlier known optical lenses. In this way, according to a light-emitting unit related to the 25th embodiment of the present invention, the illumination intensity that cannot be predicted at all by the earlier technical common sense can be realized in the simple configuration, as shown in a FIG. 52.

As the materials for the bulk-shaped lens 26 to be use in the light-emitting unit related to the 25th embodiment of the present invention, transparent plastic materials, glass materials, crystalline materials, described in the first embodiment, can be employed. Further, colored resin or resin including luminescence material can be employed. Among them, thermoplastics such as acryl resin or polyvinyl chloride resin are materials preferable to mass production of bulk-shaped lens 26. As the first to fourth light sources 1a-1d, other light sources such as incandescent lamps including halogen lamp, small discharge tubes, and electrodeless discharge lamps can be employed instead of LEDs.

In view of the generation of heat from the halogen lamp, for the case of light source accompanying the generation of heat, heat-resisting optical materials are preferable for the bulk-shaped lens 26. As the heat-resisting optical materials, heat-resisting glasses such as quartz glass, sapphire glass are preferable. Or heat-resisting optical materials such as the heat-resisting resin of polycarbonate resin can be employed. Even crystalline materials such as ZnO, ZnS, SiC can be employed.

In order to prevent the traffic accident by the non-lighting running, it is preferable to implement a lightness sensor to the bicycle lamp so that the bicycle lamp can automatically turn on, when it became dark. The LED may illuminate in the unmanned condition, because it dissipates low power. However, in order to lengthen lifetime of battery more, it can be so configured that bicycle lamp turns on only in driving, by providing a weighting sensor to a saddle strap and/or pedals. By implementing a logical product (AND) circuitry configured to input the signal from the lightness sensor and the signal from the weighting sensor, it can be configured such that it turns on automatically only both condition of driving and dark are satisfied, and it turns off the light automatically when the signal from the weighting sensor disappeared.

26th Embodiment

Figure 53:
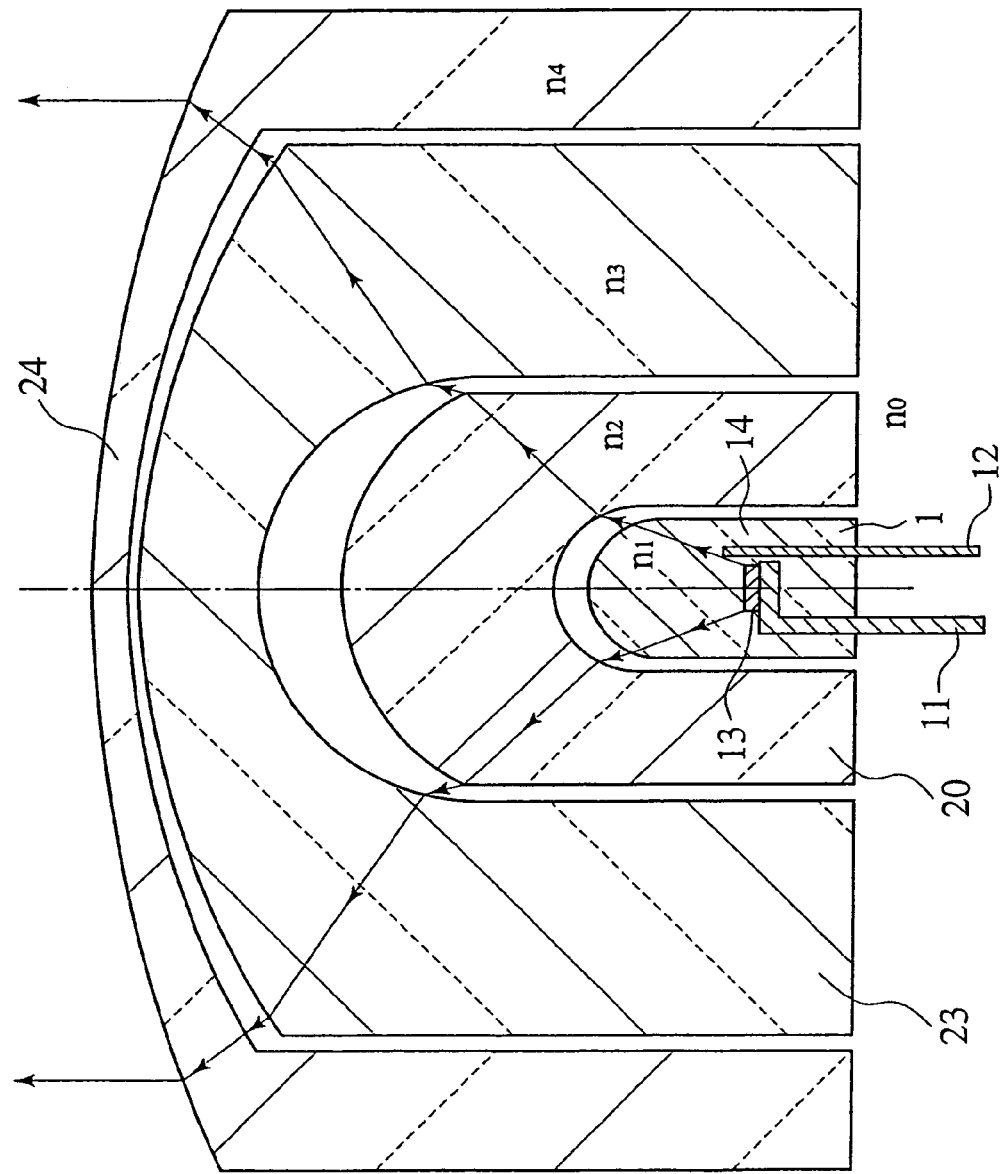
FIG. 53 is a schematic cross-sectional view showing a light-emitting unit according to a 26th embodiment of the present invention.

As already explained, in the light-emitting unit of the first embodiment of the present invention, the technical advantages in which the modification of optical path such as divergence and convergence of lights, and the modification of focal point are possible and easy are shown, without modifying the configuration of light source (LED) itself, by using the bulk-shaped lens 20. Furthermore, for the purpose of obtaining a larger irradiation area, the light beam diameter from the resin molded LED 1 can be spread by the configuration as shown in FIG. 53, in which a second bulk-shaped lens 23 is arranged outside of a first bulk-shaped lens 20, and a third bulk-shaped lens 24 is arranged outside of the second bulk-shaped lens 23. The second bulk-shaped lens 23 has a second storing cavity configured to install the first bulk-shaped lens 20, and made of transparent material to wavelength of light, similar to the first bulk-shaped lens 20. A ceiling surface of the second storing cavity serves as an entrance surface (a third curved surface), a fourth curved surface facing to the third curved surface serves as an exit surface. In addition, the third bulk-shaped lens 24 implements a third storing cavity configured to install the second bulk-shaped lens 23. A ceiling surface of the third storing cavity serves as an entrance surface (a fifth curved surface), a sixth curved surface facing to the fifth curved surface serves as an exit surface.

As shown in FIG. 53, the LED 1 is molded by transparent material 14 such as epoxy resin having first refractive index $n_1$ in the 26th embodiment of the present invention. And the first bulk-shaped lens 20 having third refractive index $n_2$ installs the LED 1 through air having the second refractive index $n_0$. Furthermore, the second bulk-shaped lens 23 having fourth refractive index $n_3$ installs the first bulk-shaped lens 20 through air having the second refractive index $n_0$. And the third bulk-shaped lens 24 having the refractive index $n_4$ installs the second bulk-shaped lens 23 through air. The LED 1, the first bulk-shaped lens 20 and the second bulk-shaped lens 23 may be installed in respective storing cavities through a fluid or liquid material aside from air. The optical path may be designed such that the refractive indexes increase from the third refractive index $n_2$, through the fourth refractive index $n_3$ to the fifth refractive index $n_4$, or it may decrease gradually from the third to fifth refractive index.

When the beam diameter is widened too much, like the 26th embodiment of present invention, illumination intensity decreases. Therefore, it becomes improper for the purpose such as a flashlight. However, it becomes suitable for the backlight illumination (indirect lighting system), in which uniform lighting is required. That is to say, luminescence point of the LEDs shine like spots when a plurality of normal bare LEDs are employed in the backlight illumination (the indirect lighting system), and variations of brightness becomes significant. But, if the beam diameter is magnified to 50-100 mm$^\Phi$ level as shown in FIG. 53, the uniform backlight illumination is achieved.

In addition, a second bulk-shaped lens can be disposed outside of the bulk-shaped lens (the first bulk-shaped lens) 25 that having the back mirror 31 explained in the fourth embodiment, and furthermore, a third bulk-shaped lens may be arrange outside of the second bulk-shaped lens. With this configuration, a light beam diameter of molded LED 1 can be magnified for a purpose of obtaining a further larger irradiation area. Similar to the first bulk-shaped lens 25, the second bulk-shaped lens is made of transparent material to wavelength of light, and implements a concavity configured to install the first bulk-shaped lens 25 and a luminescence surface identified by a curved surface. In addition, the third bulk-shaped lens will implement a concavity configured to install the second bulk-shaped lens.

27th Embodiment

Figure 54:
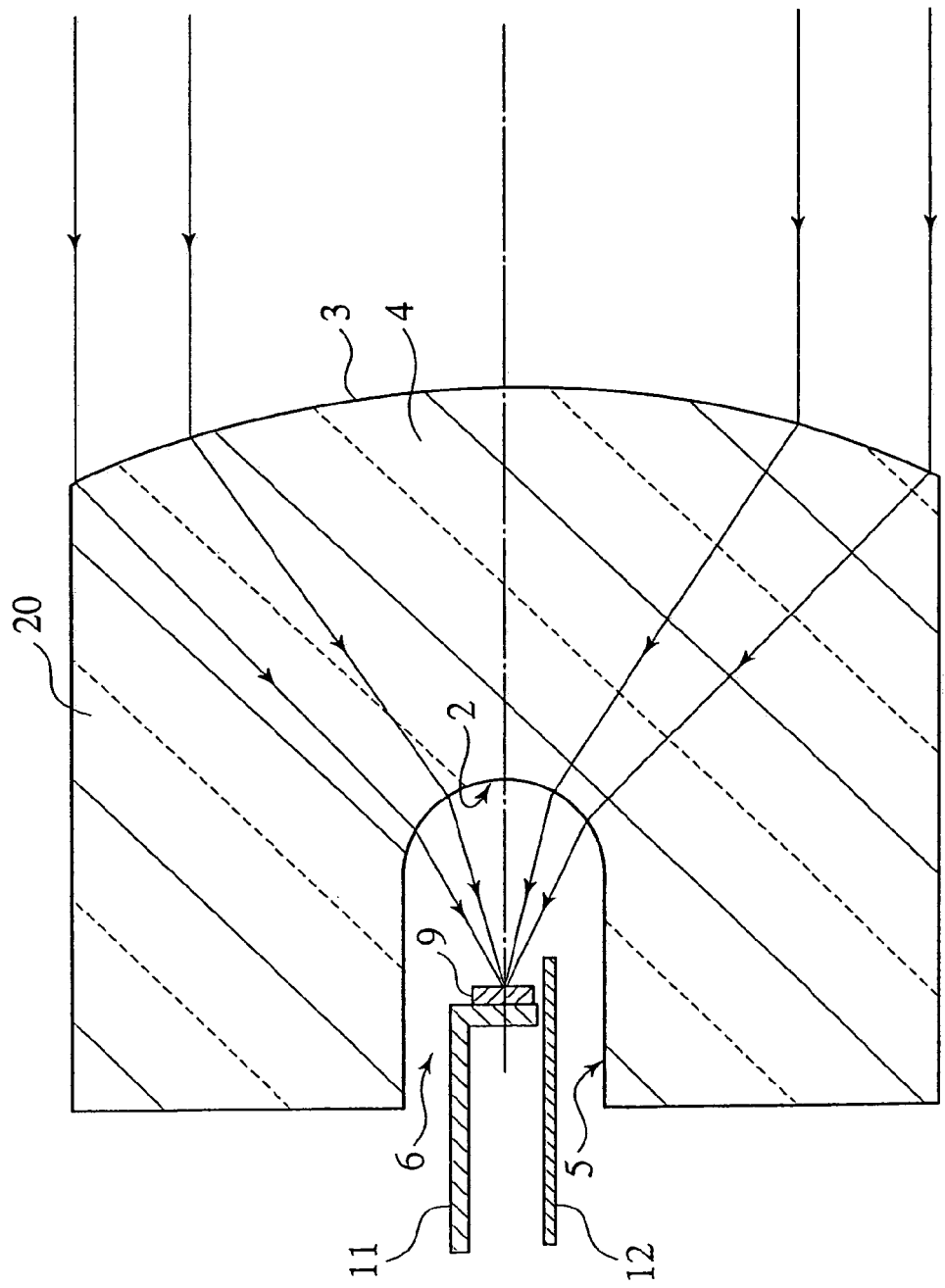
FIG. 54 is a schematic cross-sectional view showing a photodetector according to a 27th embodiment of the present invention.

FIG. 54 is a schematic cross-sectional view showing a light-receiving unit related to the 27th embodiment of the present invention. As shown in FIG. 54, the light-receiving unit related to the 27th embodiment of the present invention embraces a photodiode (a photodetector) such as a pin photodiode or an avalanche photodiode configured to detect light of predetermined wavelength and a bulk-shaped lens 20 configured to encapsulate nearly completely the photodiode. And the bulk-shaped lens 20 has an entrance surface (the second lens surface) 3 identified by a second curved surface. From a bottom surface to a top surface of lens body 4 a concavity 6 configured to install the receiving portion of the photodetector (a photodiode) is implemented. A ceiling surface of the concavity is identified by a first curved surface. The light incident from the entrance surface (the second lens surface) 3 emits from the ceiling surface of the concavity serving as the exit surface (the first lens surface) 2. And light from the exit surface (the first lens surface) 2 is condensed to the receiving portion of the photodetector so as to incident on the photodetector.

The photodetector shown in FIG. 54 encompasses at least a first pin 11, a pedestal connected to the first pin 11 so as to merge into single piece, a photodiode chip 9 disposed on the pedestal, and second twin pin 12 facing to the first pin 11.

The side wall portion of the storing cavity 6 of the bulk-shaped lens 20 is identified by a cylindrical geometry having diameter (inside diameter) 2.5-4 mm$^\Phi$ so that it can install the photodetector. Although the illustration is omitted, a spacer of thickness around 0.25-0.5 mm is interposed between the photodetector and the storing cavity 6 of the bulk-shaped lens 20, in order to fix the photodetector to the bulk-shaped lens 20. The spacer is disposed at place aside from the main receiving portion of the photodetector, or the left side than the bottom face of photodiode chip 9, in FIG.

54. The bulk-shaped lens 20 is implemented by cylinder geometry apart from a top surface serving as the entrance surface (the second lens surface) 3 identified by the convex-shaped second curved surface. The diameter (outside diameter) of the cylinder geometry portion of the bulk-shaped lens 20 is 10-30 mm$^\Phi$. The diameter (outside diameter) of the bulk-shaped lens 20 can be chosen depending on purposes of the light-receiving unit related to the 27th embodiment of the present invention. Therefore, it can be less than 10 mm$^\Phi$, and even more than 30 mm$^\Phi$.

Furthermore, the light-emitting unit shown in FIG. 1 and the light-receiving unit related to the 27th embodiment of the present invention can be combined to implement an optical information system. The light-emitting unit embraces, as described in the first embodiment, a first bulk-shaped lens body 4 identified by a first top surface 3, a first bottom surface and a first contour surface, a well-shaped first concavity 6 implemented in the inside of the first lens body 4, aligned toward the first top surface from the first bottom surface, and a light source 1 configured to emit light of predetermined wavelength, the light source is installed in the first concavity 6 (cf. FIG. 1). On the other hand, a light-receiving unit embraces, as shown in FIG. 54, a bulk-shaped lens implemented by a second bulk-shaped lens body 4 identified by a second top surface 3, a second bottom surface and a second contour surface, and a well-shaped second concavity 6 arranged in the inside of the second lens body 4 aligned toward the second top surface 3 from the second bottom surface, and a photodetector 9 configured to detect light of predetermined wavelength, the photodetector is installed in the second concavity 6 of the bulk-shaped lenses. The ceiling surface of the first concavity 6 serves as the first entrance surface 2, the first top surface 3 serves as the first exit surface, the second top surface 3 serves as the second entrance surface and the ceiling surface of second concavity 6 serves as the second exit surface 2.

In the optical information system related to the 27th embodiment of the present invention, semiconductor light-emitting element such as an LED is preferable. By using the semiconductor light-emitting element, which is not accompanied by large heat generation at the luminescence action, since any thermal effect is not given to the bulk-shaped lens by the heat generation action, even if the light source is installed in the inside of concavity (storing cavity) of the bulk-shaped lens, the high reliability and stability for long term operation is maintained. In addition, the optical signal can be transmitted with high conversion efficiency as explained in the first embodiment of the present invention. On the other hand, since the optical signal propagates through the light-receiving unit to arrive the photodetector in the reversal process of the light-emitting unit, the photodetection with extremely high sensitivity is also achieved. Similar to FIG. 49, predetermined analog or digital signal can be transmitted, by modulating the operation of the light source 1, installed in the inside of the first lens body 4, by means of the modulator.

An optical information system related to the 27th embodiment of the present invention can be applied to the security system, which described in the 22nd embodiment, in addition to optical communication.

OTHER EMBODIMENTS

As explained above, the present invention is described by means of the first to 27th embodiments; the statement of disclosure or the drawings should not be understood to limit the invention. The alternate embodiments will become clear to a person skilled in the art from the disclosure.

Figure 55:
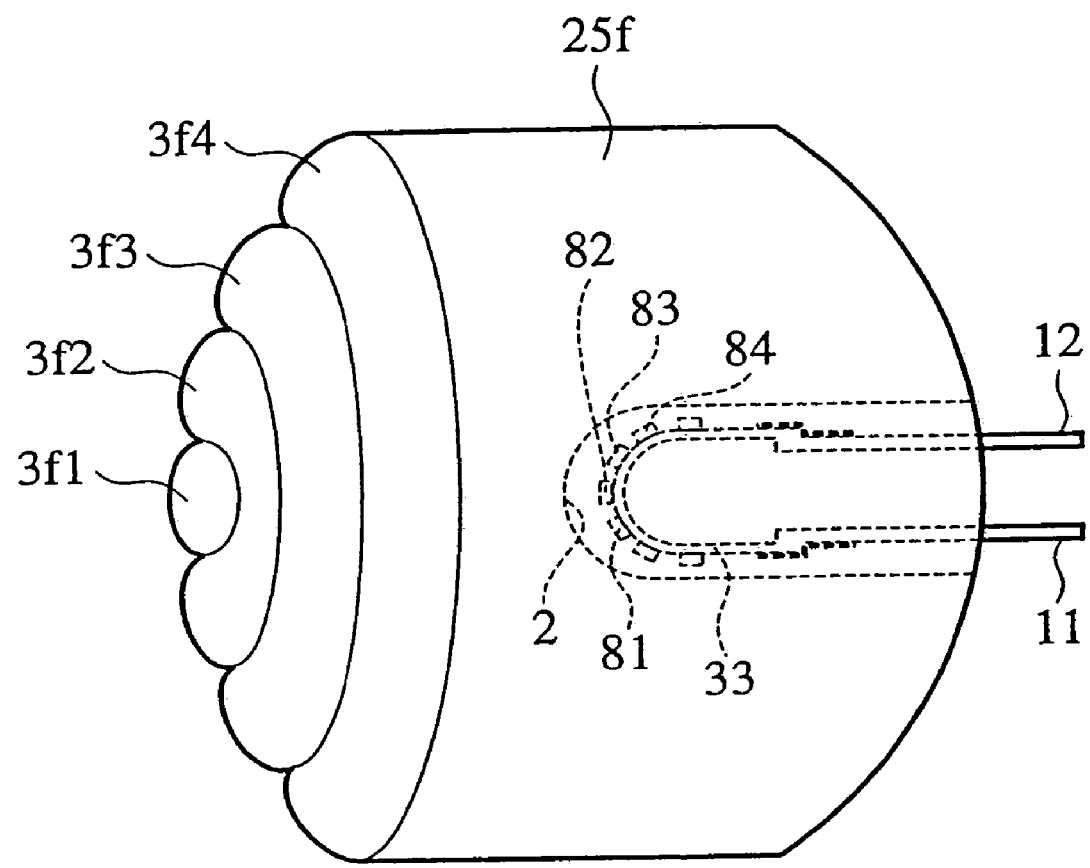
FIG. 55 is a bird's-eye view showing a light-emitting unit of another embodiment of the present invention.

For example, the exit surface 3 of the bulk-shaped lens of the present invention can be implemented by Fresnel lens, which is identified by concentric circular curved surfaces 3/1, 3/2.3/3, 3/4, . . . as shown in FIG. 55. Or even the configurations identified by plural radiuses of curvatures, or kinds of lenses such as the fisheye lens can be employed. The respective optical lenses implementing the fisheye lens, may be configured such that they corresponds to spatial position of the respective plural disc-shaped LEDs installed in the inside of the concavity one-to-one. A plurality of high refractive index waveguide regions spatially corresponding to the respective disc-shaped LEDs may be implemented in the lens body so that the light emitted from respective LEDs are guided to the corresponding exit surfaces 3. Such configuration may be manufactured by melting a bundle of plastic optical fibers.

In addition, in the description of the first to fourth embodiments, although the case when the LED is fixed to the bulk-shaped lens through the spacer, interposed between the LED and the storing cavity 6, the LED can be fixed to the bulk-shaped lens by means of another methods such as adhesives, screw or clamping mechanism, of course. Furthermore, the outside diameter $2r_{LED}$ of LED 1 and the inside diameter 2r of the storing cavity 6 are made approximately same, so that the LED can be tightly fitted in the storing cavity.

Furthermore, outside geometry of bulk-shaped lens 20-29 are not always required to be optically flat, but also small irregularity can be implemented on the surface like a crystal glass. With small irregularity on the surface, the output lights emit in all directions and it becomes convenient for the backlight illumination or the indirect lighting.

In this way the present invention includes the various embodiments, which are not described here, of course.

INDUSTRIAL APPLICABILITY

The bulk-shaped lens and the lighting equipment of the present invention can be applied to flashlights and lighting equipment (backlight illumination) suitable for the liquid crystal display of portable personal computer, portable word processor, portable small television or vehicle mounted television. In addition, the bulk-shaped lens, the light-emitting unit and the lighting equipment of the present invention can be applied to miscellaneous electronic product including the indirect lighting. In addition, because the local lighting equipment can be easily implemented by assembling a plurality of light-emitting units, it can be applied to the fields of lighting equipments. In particular, the semiconductor light-emitting element can be used in the fields of lighting equipments, where the semiconductor light-emitting element is not employed until now. In addition, the optical information system embracing the light-emitting unit and the light-receiving unit, both employing the bulk-shaped lens of the present invention, can be applied to the fields of optical communication and security system.

The invention claimed is:

1. A bulk-shaped lens comprising:
    a bulk-shaped lens body identified by a top surface, a bottom surface and a contour surface; and
    a well-shaped concavity implemented in the inside of the lens body, aligned to the top surface from the bottom surface along an optical axis of the lens body,
    wherein a ceiling surface of the concavity serves as first lens surface, the top surface of the lens body serves as a second lens surface, and inside of the concavity serves as a storing cavity of light source or photodetector, and a distance between the first and second lens surfaces along the optical axis is larger than a radius of curvature of the second lens surface.

2. The bulk-shaped lens of claim 1, wherein outside diameter of the contour surface of the lens body is larger than 3 times and smaller than 10 times of inside diameter of the concavity.

3. The bulk-shaped lens of claim 1, wherein, with the radius R of curvature of the second lens surface, overall length L measured along optical axis direction of the bulk-shaped lens, refractive index n of the bulk-shaped lens, following relationships are satisfied:

$0.93 < k(R/L) < 1.06$ $k = 1/(0.35 \cdot n - 0.168)$.

4. The bulk-shaped lens of claim 1, wherein, with protruding height Δ of the first lens surface established at the ceiling surface of the concavity, outside diameter 2 Ro of the contour surface of the lens body, following relationship is satisfied:

$0.25 < \Delta/Ro < 0.075$.

5. The bulk-shaped lens of claim 1, further comprising a back mirror disposed at the bottom surface of the lens body.

6. The bulk-shaped lens of claim 1, further implementing another well-shaped concavity in the inside of the lens body, in parallel with said well-shaped concavity stated in claim 1.

7. The bulk-shaped lens of claim 1, wherein said lens body has a pliability or flexibility.

8. A light-emitting unit comprising:
a light source configured to emit light of predetermined wavelength;
a bulk-shaped lens body identified by a top surface, a bottom surface and a contour surface; and
a well-shaped concavity implemented in the inside of the lens body, aligned to the top surface from the bottom surface along an optical axis of the lens body,
wherein a ceiling surface of the concavity serves as an entrance surface, the top surface of the lens body serves as an exit surface, and the light source is installed in the concavity, and a distance between the entrance and exit surfaces along the optical axis is larger than a radius of curvature of the exit surface.

9. The light-emitting unit of claim 8, wherein outside diameter of the contour surface of the lens body is larger than 3 times and smaller than 10 times of inside diameter of the concavity.

10. The light-emitting unit of claim 8, wherein, with the radius R of curvature of the exit surface, overall length L measured along optical axis direction of the bulk-shaped lens, refractive index n of the bulk-shaped lens, following relationships are satisfied:

$0.93 < k(R/L) < 1.06$ $k = 1/(0.35 \cdot n - 0.168)$.

11. The light-emitting unit of claim 8, wherein, with protruding height Δ of the first lens surface established at the ceiling surface of the concavity, outside diameter 2Ro of the contour surface of the lens body, following relationship is satisfied:

$0.25 < \Delta/Ro < 0.075$.

12. The light-emitting unit of claim 8, further comprising a back mirror disposed at the bottom surface of the lens body.

13. The light-emmiting unit of claim 8, further implementing another well-shaped concavity in the inside of the lens body, in parallel with said well-shaped concavity stated in claim 1, and further comprising another light source installed in the another well-shaped concavity.

14. The light-emitting unit of claim 8, wherein said light source is a resin molded LED.

15. The light-emitting unit of claim 8, wherein said light source comprising a plurality of LED chips.

16. The light-emitting unit of claim 8, wherein said lens body has a pliability or flexibility.

17. A lighting equipment comprising:
a power supply unit;
a light source connected to the power supply unit;
a bulk-shaped lens body identified by a top surface, a bottom surface and a contour surface; and
a well-shaped concavity implemented in the inside of the lens body, aligned to the top surface from the bottom surface along an optical axis of the lens body,
wherein a ceiling surface of the concavity serves as an entrance surface, the top surface of the lens body serves as an exit surface, and the light source is installed in the concavity, and a distance between the entrance and exit surfaces along the optical axis is larger than a radius of curvature of the exit surface.

18. The lighting equipment of claim 17, further comprising a back mirror disposed at the bottom surface of the lens body.

19. The lighting equipment of claim 17, further implementing another well-shaped concavity in the inside of the lens body, in parallel with said well-shaped concavity stated in claim 1, and further comprising another light source installed in the another well-shaped concavity.

20. The lighting equipment of claim 17, wherein said light source is a resin molded LED.

21. The lighting equipment of claim 17, wherein said light source comprising a plurality of LED chips.

22. The lighting equipment of claim 17, further implementing another well-shaped concavity in the inside of the lens body, in parallel with said well-shaped concavity stated in claim 1, and further comprising another light source installed in the another well-shaped concavity.

23. The lighting equipment of claim 17, wherein said lens body has a pliability or flexibility.

24. The bulk-shaped lens of claim 1, wherein a groove is cut on a part of the top surface of the lens body.

25. The light-emitting unit of claim 8, wherein a groove is cut on a part of the top surface of the lens body.

26. A bulk-shaped lens comprising:
a bulk-shaped lens body identified by a top surface, a bottom surface and a contour surface; and
a well-shaped concavity having a cylindrical sidewall and a downwardly convex ceiling surface, implemented in the inside of the lens body being aligned to the top surface from the bottom surface along an optical axis of the lens body,
wherein the ceiling surface of the concavity serves as first lens surface, the top surface of the lens body serves as a second lens surface, and inside of the concavity serves as a storing cavity of light source or photodetector.

* * * * *